United States Patent
Sexton et al.

(10) Patent No.: US 8,787,186 B2
(45) Date of Patent: Jul. 22, 2014

(54) MOBILITY IN A DISTRIBUTED ANTENNA SYSTEM

(75) Inventors: Thomas Aloysuis Sexton, Ft. Worth, TX (US); Charles Arthur Cliff, Richardson, TX (US); Mark Pecen, Waterloo (CA); Paul James Lusina, Vancouver (CA)

(73) Assignee: BlackBerry Limited, Waterloo, Ontario (CA)

( * ) Notice: Subject to any disclaimer, the term of this patent is extended or adjusted under 35 U.S.C. 154(b) by 428 days.

(21) Appl. No.: 13/161,706

(22) Filed: Jun. 16, 2011

(65) Prior Publication Data
US 2012/0002564 A1     Jan. 5, 2012

Related U.S. Application Data

(63) Continuation of application No. 12/635,526, filed on Dec. 10, 2009.

(60) Provisional application No. 61/363,453, filed on Jul. 12, 2010, provisional application No. 61/439,064, filed on Feb. 3, 2011, provisional application No. 61/121,992, filed on Dec. 12, 2008.

(51) Int. Cl.
*H04L 12/28* (2006.01)
*H04W 4/00* (2009.01)

(52) U.S. Cl.
USPC .......................... 370/252; 370/329

(58) Field of Classification Search
CPC .................. H04W 16/64; H04W 64/006
USPC ................................ 370/310–350
See application file for complete search history.

(56) References Cited

U.S. PATENT DOCUMENTS

| 7,940,864 B2 * | 5/2011 | Merched et al. ............... 375/316 |
| 8,379,485 B2 | 2/2013 | Cevher |
| 8,532,214 B2 * | 9/2013 | Cheng ............................ 375/267 |
| 2002/0037060 A1 | 3/2002 | Kishi |
| 2004/0017225 A1 | 1/2004 | Draxelmayr |
| 2004/0245175 A1 | 12/2004 | Godec et al. |
| 2005/0153712 A1 | 7/2005 | Osaka et al. |
| 2007/0014272 A1 * | 1/2007 | Palanki et al. ................. 370/344 |
| 2007/0036179 A1 * | 2/2007 | Palanki et al. ................. 370/491 |
| 2007/0066259 A1 | 3/2007 | Ryan et al. |
| 2007/0153689 A1 | 7/2007 | Strub et al. |

(Continued)

FOREIGN PATENT DOCUMENTS

| JP | 2002076975 A | 3/2002 |
| KR | 10-2002/0014706 A | 2/2002 |

(Continued)

OTHER PUBLICATIONS

International Search Report for PCT Application No. PCT/US2009/067754, mailed Jul. 26, 2010.

(Continued)

*Primary Examiner* — Warner Wong
(74) *Attorney, Agent, or Firm* — Cantor Colburn LLP

(57) ABSTRACT

A device, method or system implements operations to receive compressed samples of wireless transmissions from a plurality of user equipment (UEs) traveling through different communication regions in a wireless network, and detect information in the wireless transmissions of the UEs based on the compressed samples.

28 Claims, 50 Drawing Sheets

(56) References Cited

U.S. PATENT DOCUMENTS

| | | | |
|---|---|---|---|
| 2007/0249388 | A1 | 10/2007 | Sorrells et al. |
| 2008/0129560 | A1 | 6/2008 | Baraniuk et al. |
| 2008/0270055 | A1 | 10/2008 | Rozell et al. |
| 2009/0075674 | A1 | 3/2009 | Qahwash |
| 2009/0161635 | A1 | 6/2009 | Kanterakis et al. |
| 2009/0213922 | A1 | 8/2009 | Dent et al. |
| 2009/0222226 | A1 | 9/2009 | Baraniuk et al. |
| 2010/0082302 | A1 | 4/2010 | Garudadri et al. |
| 2010/0182950 | A1 | 7/2010 | Sexton et al. |
| 2010/0197254 | A1* | 8/2010 | Yu et al. ............. 455/179.1 |
| 2010/0265799 | A1* | 10/2010 | Cevher et al. ............ 367/121 |
| 2010/0271930 | A1* | 10/2010 | Tong et al. ............... 370/208 |
| 2010/0302086 | A1* | 12/2010 | Dudgeon et al. .......... 341/155 |
| 2010/0306627 | A1* | 12/2010 | Sakai et al. ............... 714/781 |
| 2011/0028160 | A1 | 2/2011 | Roeding et al. |
| 2011/0064154 | A1* | 3/2011 | Mudulodu et al. ........ 375/260 |
| 2011/0064302 | A1* | 3/2011 | Ma et al. .................. 382/159 |
| 2012/0170499 | A1 | 7/2012 | Narasimhan |
| 2012/0307939 | A1* | 12/2012 | Kalyani et al. ............ 375/316 |

FOREIGN PATENT DOCUMENTS

| | | |
|---|---|---|
| WO | 2007/050680 A2 | 5/2007 |
| WO | 2009059279 A1 | 5/2009 |
| WO | 2009/130199 A1 | 10/2009 |
| WO | 2010/068922 A2 | 6/2010 |
| WO | 2010121050 A2 | 10/2010 |

OTHER PUBLICATIONS

Extended European Search Report for EP Patent Application No. 09178976.8, Jan. 25, 2011.

European Patent Office, European Partial Search Report issued on Sep. 6, 2010 in European Application No. EP09178976.8.

Zhiz Tian et al., "Performance Evaluation of Distributed Compressed Wideband Sensing for Cognitive Radio Networks" Information Fusion, 2008 11th International Conference on, IEEE, Piscataway, NJ, Jun. 30, 2008, pp. 1-8.

Griffin et al., "Compressed Sensing of Audio Signals Using Multiple Sensors" Proceedings 16th European Signal Processing Conference (Eusipco 2008), Aug. 25-29, 2008, Lausanne, Switzerland, Aug. 27 2008.

Jose J. Paredes, et al., "Ultra-Wideband Compressed Sensing: Channel Estimation" IEEE Journal of Selected Topics in Signal Processing, IEEE vol. 1, No. 3, Oct. 1, 2007, pp. 383-395.

Wei Wang et al., "Distributed Sparse Random Projections for Refinable Approximation" Information Processing in Sensor Networks, 2007. IPSN 2007, 6th International Symposium on IEEE, Apr. 1, 2007, pp. 331-339.

International Search Report mailed Oct. 21, 2011 in PCT/US2011/043344, 3pp.

D. Tse and P. Viswanath, "7.1 Multiplexing Capability of Deterministic MIMO Channels", Fundamentals of Wireless Communication, Cambridge University Press, 2005, p. 293.

Waheed Bajwa et al.; "Compressive Wireless Sensing;" 5th International Conference on IPSN, 2008; pp. 134-142.

E.J. Candes et al; "Decoding by Linear Programming," IEEE Trans. on Info. Theory, vol. 51, No. 12, Dec. 2005; 22 pages.

E.J. Candes et al; "An Introduction to Compressive Sampling," IEEE Signal Processing Mag., Mar. 2008; pp. 21-30.

C. A. Devries et al.; Subsampling Architecture for Low Power Receivers, IEEE Trans. on Circuits and Systems, vol. 55, No. 4, Apr. 2008; pp. 304-308.

ETSI EN 300 490 V 6.3.1, Digital Cellular Telecommunications System (Phase 2+) Mobile Radio Interface Layer 3 Specification (GSM 04.08 Version 6.3.1 Release 1997), Aug. 1, 1999; pp. 1 & 37-88.

ETS 300 939, Digital Cellular Telecommunications System (Phase 2+) Mobile Radio Interface Singalling Layer 3; General Aspects (GSM 04.07 Version 5.3.0 Jan. 1998), 2nd Edition; pp. 1-106.

ETSI EN 300 490 V7.3.0 (Dec. 1999), Digital Cellular Telecommunications System (Phase 2+) Mobile Radio Interface Layer 3 Specification (GSM 04.08 Version 7.3.0 Release 1998), Dec. 1999; pp. 1-651.

J. Laska et al.; "Random Sampling for Analog-to-Information Conversion of Wideband Signals;" 2006 IEEE Dallas/CAS Workshop on Design, Applications, Integration and Software, Oct. 1, 2006; pp. 119-122.

R. Parry; "The Road to 3G;" Submitted to IEEE Potentials, Apr. 2002; 11 pages.

S. Pfetsch et al.; On the Feasiblility of Hardware Implementation of Sub-Nyquist Random-Sampling Based Analog-To-Information Conversion, IEEE International Symposium on Circuits and Systems, May 18, 2008; pp. 1480-1483.

Y. L. Polo; Compressive Wideband Spectrum Sensing for Cognitive Radio Applications, Thesis; Nov. 28, 2008; pp. 1-82.

Extened Search Report for EP Application No. 11178539.0, mailed Oct. 27, 2011; 8 pages.

Extened Search Report for EP Application No. 11178540.8, mailed Oct. 28, 2011; 6 pages.

Extened Search Report for EP Application No. 11178541.6, mailed Oct. 26, 2011; 8 pages.

International Preliminary Report on Patentablility; International Application No. PCT/US2009/067754; International Filing Date: Dec. 11, 2009; Date of mailing: Jun. 23, 2011; 8 pages.

International Preliminary Report on Patentablility; International Application No. PCT/US2010/031270; International Filing Date: Apr. 15, 2010; Date of mailing: Oct. 18, 2011; 6 pages.

International Search Report; International Application No. PCT/US2010/031270; International Filing Date: Apr. 15, 2010; Date of mailing: Mar. 9, 2011; 2 pages.

International Written Opinion; International Application No. PCT/US2010/031270; International Filing Date: Apr. 15, 2010; Date of mailing: Mar. 9, 2011; 6 pages.

International Preliminary Report and Patentability; International Application No. PCT/US2010/043747; International Filing Date: Jul. 29, 2010; Date of mailing: Feb. 9, 2012; 10 pages.

International Search Report and Written Opinion; International Application No. PCT/US2010/043747; International Filing Date: Jul. 29, 2010; Date of mailing: Apr. 11, 2011; 14 pages.

International Search Report and Written Opinion; International Application No. PCT/US2011/045854; International Filing Date: Jul. 29, 2011; Date of mailing: Nov. 4, 2011; 15 pages.

U.S. Office Action for U.S. Appl. No. 12/846,441, filed Jul. 29, 2010; Action Mailed Aug. 15, 2012; 33 pages.

Wikipedia; UM Interface, retrieved from the Internet Dec. 6, 2008; from http://en.wikipedia.org/w/inde.php?title=UM_interface &oldid=25630658, [retrieved Oct. 17, 2011].

Canadian Office Action mailed Sep. 12, 2013 for application CA2746661, 3 pages.

Chen, Scott Shaobing, et al.; "Atomic Decomposition by Basis Pursuit" SIAM J. Sci. Comput.; vol. 20, No. 1; p. 33-61; 1998.

Chinese Office Action mailed Jun. 28, 2013 for application CN20098056657.4, 6 pages.

Coldrey (Tapio), Mikael, et al.; "Training-Based MIMO Systems—Part I: Performance Comparison"; IEEE Transactions on Signal Processing; vol. 55, No. 11; p. 5464-5476; Nov. 2007.

Donoho, David, L.; "Stable Recovery of Sparse Overcomplete Representations in the Presence of Noise"; IEEE Transactions on Information Theory; vol. 52, No. 1; p. 6-18; Jan. 2006.

Fletcher, A.K., et al.; "A Sparsity Detection Framework for On-Off Random Access Channels"; ISIT 2009; IEEE; p. 169-173; Jun. 28-Jul. 3, 2009.

Gallager, Robert, G.; "Information Theory and Reliable Communication;" John Wiley &Sons, Inc.; 1968; pp. 1-588.

Hochwald, Bertrand, M.; "Achieving Near-Capacity on a Multiple-Antenna Channel"; IEEE Transactions on Communications; vol. 51, No. 3; p. 389-399; Mar. 2003.

Jantii, Riku, et al.; "Downlink Resource Management in the Frequency Domain for Multicell OFCDM Wireless Networks"; IEEE Transactions on Vehicular Technology; vol. 57, No. 5; p. 3241-3246; Sep. 2008.

(56) References Cited

OTHER PUBLICATIONS

Kirolos, Sami, et al.; "Analog-to-Information Conversion via Random Demodulation"; IEEE; p. 1-4; 2006.

Kschischang, Frank, R.; Codes Defined on Graphs; IEEE Communications Magazine; p. 118-125; Aug. 2003.

Medard, Muriel; "The Effect upon Channel Capacity in Wireles Communications of Perfect and Imperfect Knowledge of the Channel"; IEEE Transactions on Information Theory; vol. 46, No. 3; p. 933-946; May 2000.

Nazer, Bobak, et al.; "Compute-and-Forward: A Novel Strategy for Cooperative Networks"; IEEE; p. 69-73; 2008.

Romero-Jerez, Juan M.; "Receive Antenna Array Strategies in Fading and Interference: An Outage Probability Comparison"; IEEE Transactions on Wireless Communications; vol. 7, No. 3; p. 920-932; Mar. 2008.

Sampei, Seiichi, et al.; "System Design Issues and Performance Evaluations for Adaptive Modulation in New Wireless Access Systems"; Proceedings of the IEEE; vol. 95, No. 12; p. 2456-2471; Dec. 2007.

Serrador, Antonio, et al.; "Impact of MIMO Systems on CRRM in Heterogeneous Networks"; WCNC; p. 2864-2868; 2008.

Sethuraman, B. A., et al.; "Full-Diversity, High-Rate Space-Time Block Codes from Division Algebras"; IEEE Transactions on Information Theory; vol. 49, No. 10; p. 2596-2616; Oct. 2003.

Sexton, Thomas, A.; "Remote Sampler—Central Brain Architecture"; IEEE; p. 601-604; 2010.

Taubock, Georg, et al.; "A Compressed Sensing Technique for OFDM Channel Estimation in Mobile Environments: Exploiting Channel Sparsity for Reducing Pilots"; ICASSP; p. 2885-2888; 2008.

Emre Teletar; "Capacity of Multi-Antenna Gaussian Channels"; retrieved on Mar. 5, 2013 from http://mars.bell-labs.com/papers/proof; p. 1-28; Oct. 1995.

Wang, I-Hsiang, et al.; "Gaussian Interference Channels with Multiple Receive Antennas: Capacity and Generalized Degrees of Freedom"; Forty-Sixth Annual Allerton Conference; p. 715-722; Sep. 23-26, 2008.

Winters, Jack, H.; "Smart Antennal Techniques and Their Application to Wireless Ad Hoc Networks"; IEEE Wireless Communications; p. 77-83; Aug. 2006.

Zheng, Lizhong, et al.; "Communication on the Grassman Manifold: A Geometric Approach to the Noncoherent Multiple-Antenna Channel"; IEEE Transactions on Information Theory; vol. 48, No. 2; p. 359-383; Feb. 2002.

Thomas M. Cover and Joy A. Thomas, "Elements of Information Theory", John Wiley & Sons Inc., 2006, pp. 1-425.

Claude Oestges and Bruno Clerckx, "MIMO Wireless Communications—From Real-World Propagation to Space—Time Code Design", Academic Press—Elsevier Ltd., 2007, pp. 1-448.

Japanese Office Action (with translation) for application 2011-540940, mailed Aug. 28, 2013, 8 pages.

European Office Action for application 11178539.0, mailed Oct. 11, 2013, 7 pages.

European Office Action for publication 11178540.8, mailed Oct. 11, 2013, 6 pages.

European Office Action for application 11178541.6, mailed Oct. 15, 2013, 5 pages.

Final Office Action for U.S. Appl. No. 12/760,892, mailed Dec. 30, 2013, 15 pages.

Japanese patent application JP 2001524790 (A), filed Dec. 14, 2001, 1 page, abstract only.

Candes, Emmanuel, J. et al., "Robust Uncertainty Principles Exact Signal Reconstruction From Highly Incomplete Frequency Information", IEEE Transactions on Information Theory, vol. 52, No. 2, Feb. 2006, pp. 489-509.

Candes, Emmanuel, J. et al., "Stable Signal Recovery from Incomplete and Incaccurate Measurements", Communications on Pure and Applied Mathmematics, 2006, vol. LIX, pp. 1207-1223.

Soldani, David and Dixit, Sudhit, "Wireless Relays for Broadband Access", Radio Communications Series, IEEE Communications Magazine, 2008, pp. 58-66.

\* cited by examiner

Detector Methods:

L1 (simplex)

L2 (MMSE, ZF, ML if known channel)

$$y = \Phi(\alpha\Psi x + n)$$

$$= \Phi\Psi x + v$$

$$\tilde{x} = \arg\min_{x \in R^N} \|x\|_{L_1} \text{ subject to } y = \Phi\Psi x$$

Or, x may be estimated with a linear detector $x = (Y'F'FY)^{-1}Y'F'y$

Or, x may be detected using maximum likelihood

MOBILITY IN A DISTRIBUTED ANTENNA SYSTEM

RELATED CASE

This application claims priority under 35 U.S.C. §119(e) to U.S. Provisional Patent Application Ser. No. 61/363,453, filed on Jul. 12, 2010 entitled REMOTE SAMPLER MOVING MOBILE and to U.S. Provisional Patent Application Ser. No. 61/439,064, filed on Feb. 3, 2011, entitled PILOT ALLOCATION FOR HIGH SPEED MOBILES IN A DISTRIBUTED ANTENNA SYSTEM", and also claims priority under 35 U.S.C. §120 to U.S. patent application Ser. No. 12/635,526 filed Dec. 10, 2009, entitled SENSOR-BASED WIRELESS COMMUNICATION SYSTEMS USING COMPRESSIVE SAMPLING, which claims priority under 35 U.S.C. §119(e) to U.S. Provisional Application No. U.S. 61/121,992 filed Dec. 12, 2008, entitled LOW POWER ARCHITECTURE AND REMOTE SAMPLER INVENTIONS, the aforementioned applications incorporated by reference in their entirety.

FIELD

This disclosure generally relates to wireless communication systems and more particularly to methods, devices and systems for managing communications of moving mobile devices in a wireless communication system.

BACKGROUND

In some existing wireless communications systems, mobile stations monitor downlink channels and when a Routing Area (GSM terminology, spec 45.008) is crossed, the network loses track of the UE (user equipment) until the UE makes a RACH (Random Access Channel) transmission and identifies itself through a handshaking sequence. Accordingly, crossing boundary areas may result in abrupt transition such as a hard handoff event in CDMA or repeating a RACH sequence in GSM.

BRIEF DESCRIPTION OF THE DRAWINGS

The description of the various exemplary embodiments, is explained in conjunction with the appended drawings, in which:

FIG. 4B illustrates exemplary detector problem statements in accordance with an embodiment.

DETAILED DESCRIPTION

Figure 1A:
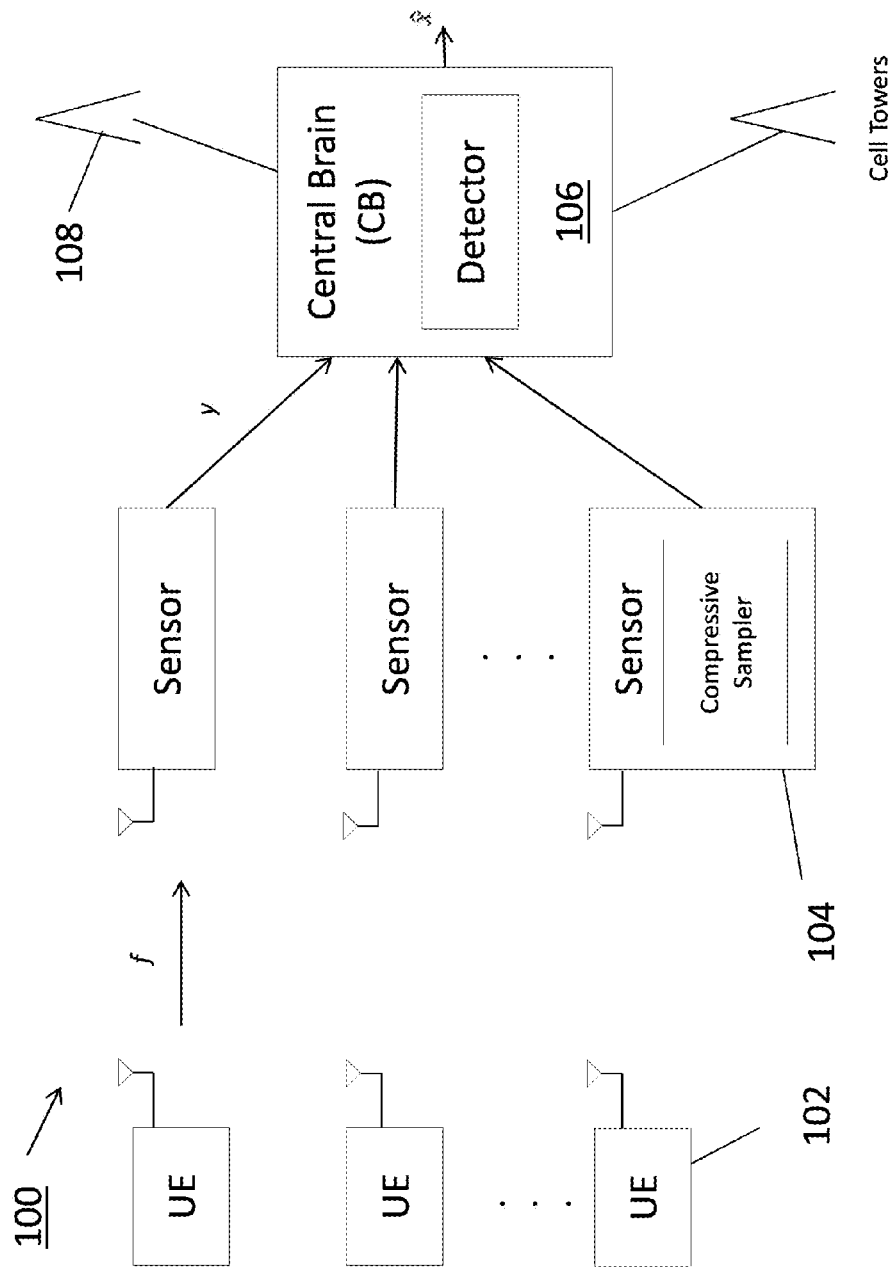
FIG. 1A illustrates an exemplary network environment in accordance with an embodiment.

It should be understood at the outset that although illustrative implementations of one or more embodiments of the present disclosure are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Various techniques described herein can be used for various sensor-based wireless communication systems. The various aspects described herein are presented as methods, devices and systems that can include a number of components, elements, members, modules, nodes, peripherals, or the like. Further, these methods, devices and systems can include or not include additional components, elements, members, modules, nodes, peripherals, or the like. In addition, various aspects described herein can be implemented in hardware, firmware, software or any combination thereof. It is important to note that the terms "network" and "system" can be used interchangeably. Relational terms described herein such as "above" and "below", "left" and "right", "first" and "second", and the like may be used solely to distinguish one entity or action from another entity or action without necessarily requiring or implying any actual such relationship or order between such entities or actions. The term "or" is intended to mean an inclusive "or" rather than an exclusive "or". Further, the terms "a" and "an" are intended to mean one or more unless specified otherwise or clear from the context to be directed to a singular form.

A wireless communication system may be comprised of a plurality of user equipment (UE) and an infrastructure. The infrastructure includes the part of the wireless communication system that is not user equipment, such as sensors, base stations, a core network, a downlink transmitter, other elements and combination of elements. The core network can have access to other networks. The core network, also referred to as a Central Brain (CB) or remote central processor, may include a high-powered infrastructure component, which can perform computationally intensive functions at a high rate with acceptable financial cost. The core network may include infrastructure elements, which can communicate with base stations so that, for instance, physical layer functions may also be performed by the core network. The base station may communicate control information to a downlink transmitter to overcome, for instance, communication impairments associated with channel fading. Channel fading includes how a radio frequency ("RF") signal can be bounced off many reflectors and the properties of the resulting sum of reflections. The core network and the base station may, for instance, be the same infrastructure element, share a portion of the same infrastructure element or be different infrastructure elements.

A sensor may be referred to as a remote sampler, remote conversion device, remote sensor or other similar terms. A sensor may include, for instance, an antenna, a receiving element, a sampler, a controller, a memory and a transmitter. A sensor may be interfaced to, for instance, a base station. Further, sensors may be deployed in a wireless communication system that includes a core network, which may have access to another network.

User equipment ("UE") used in a wireless communication system may be referred to as a mobile station ("MS"), a mobile device, a terminal, a cellular phone, a cellular handset, a personal digital assistant ("PDA"), a smartphone, a handheld computer, a desktop computer, a laptop computer, a tablet computer, a netbook, a printer, a set-top box, a television, a wireless appliance, or some other equivalent terminology. A UE may contain an RF transmitter, RF receiver or both coupled to an antenna(s) to communicate with a base station or other devices able to receive wireless transmissions. Further, a UE may be fixed or mobile and may have the ability to move through a wireless communication system. Further, uplink communication refers to communication, for example, from a UE to a network node, such as a remote sampler. Downlink communication refers to communication from a network node, such as, for example, a base station, downlink transmitter, etc. or a combination thereof, to a UE.

In accordance with the various exemplary embodiments, there is provided a method, computer program, device and system for facilitating communications of multiple user equipment (UE) traveling through or across different communications zones. As will be explained in more detail below, in one exemplary embodiment, a compressive sampling approach is provided to sense and detect wireless transmissions from multiple UEs in one or more communication regions. For example, wireless transmissions from multiple UEs are sensed and compressively sampled. The compressed samples are evaluated at a central processing facility, e.g., a Central Brain (CB). The CB then detects information or data contained in these wireless transmissions from multiple UEs from the compressed samples, and may use a method which solves signal transmissions for multiple UEs together. The detection may involve formulation of a soft estimate of the data or information ($\tilde{x}$), and then determining an associated hard estimate of the data or information ($\hat{x}$) accordingly. The detection may also involve in part a linear program which solves a L1 minimization problem or solving a L2 minimization problem, and employs various methodologies as described herein to detect information or data transmitted from one or more or all UEs based on compressed signal samples. In this embodiment, the network side would know what communication parameter(s) is used by the traveling UEs in the different regions by having knowledge of a presence of the UEs at any given point in time and tracking or controlling an assignment of these parameter(s) as the UEs travel through different regions at any given point in time. Accordingly, communication parameters may be re-used in different communication regions, e.g., two or more communication regions may use have the same communication parameter (e.g., pilot, sparse waveforms, matrices, etc.) or set of communication parameters available for use by UEs traveling therethrough.

Further, in accordance with another embodiment in a communication system using compressive sampling, there is provided an approach to reduce a workload and time, and thus, free up resources when a traveling UE transitions from one communication region to another communication regions. For example, a UE traveling into a new communication region recognizes its entry into the new region, and selects a new communication parameter(s) for use in conducting communications in the new region based on predefined rules. These predefined rules may take the form of an assignment schedule that defines which communication parameter from set of communication parameters is to be used by a UE in a particular communication region based on various factors, including a system clock, a UE ID or other factors, etc. The network side would know what communication parameter(s) are used by the UEs in the different regions based on these predefined rules. As a consequence, a traveling UE can reduce an amount of time and workload involved when transitioning from one communication region to another, e.g., reduce signalling delay, etc. Thus, the UE can allocate more resources for the transmission of information or data, e.g., payload data, and forth.

In another exemplary embodiment, there is provided a communication system and a method thereof. The communication system comprises a plurality of remote samplers for receiving wireless signals transmitted by one or more user equipment using a transmission matrix from one or more transmission matrices, each of the remote samplers capturing N samples during a word interval and transforming the N samples into M samples, where M<N/2, using a sensing matrix from one or more sensing matrices; and a solver for receiving the M samples from each of the remote samplers and formulating a soft estimate of data vectors based on a knowledge of the transmission matrices used by each of the one or more user equipment. All pairs of a sensing matrix and transmission matrix satisfy a Restricted Isometry Property.

For example, the communication system can comprise a plurality of remote samplers $\{1, \ldots, j, \ldots, z\}$ where z is a number of remote samplers, a $j^{th}$ remote sampler capturing N samples during a word interval and transforming the N samples into $M_j$ samples denoted collectively as $y_j$ using a sensing matrix $\Phi_j$ where $M_j<N/2$ and $M=M_1+\ldots+M_j+\ldots+M_z$; and a solver for receiving samples $\{y_i, \ldots, y_j, \ldots, y_z\}$ from the remote samplers and formulating a soft estimate of a collection of data vectors $\{\tilde{x}_1, \ldots, \tilde{x}_k, \ldots, \tilde{x}_l\}$ based on knowledge of transmission matrices $\{\Psi_1, \ldots, \Psi_k, \ldots, \Psi_l\}$ where l is a number of user equipment $\{1, \ldots, k, \ldots, 1\}$. The transmission matrix $\Psi_k$ is incoherent within a sensing matrix $\Phi_j$ for all pairs k, j according to a Restricted Isometry Property. A quantized vector $\hat{x}_k$ is associated with a soft vector $\tilde{x}_k$ using a sparsity value $s_k$. The solver can create a soft estimate $\tilde{x}$ using a zero forcing method, a maximum-likelihood method, or so forth.

Further, there can be a plurality of regional leaf brains for receiving samples from remote samplers in their respective regions, wherein a regional leaf brain from the plurality of regional leaf brains assigns a value $s_k$ to a $k^{th}$ user equipment. The plurality of regional leaf brains can include a first regional leaf brain and a second regional leaf brain, the first regional leaf brain assigning a sparsity value $s_k$ to a first user equipment, and the second regional leaf brain assigning a value $s_{k+1}$ to a second user equipment.

The plurality of regional leaf brains can include a first regional leaf brain and a second regional leaf brain, the first regional leaf brain assigning to a $k^{th}$ user equipment a transmission matrix $\Psi_{reuse}$ and a second regional leaf brain assigning to a $k+1^{th}$ user equipment the matrix $\Psi_{reuse}$, wherein the solver is aware of the assignments and the solver estimates a complex path gain from the $k^{th}$ user equipment to the $j^{th}$ remote sampler.

The $k^{th}$ user equipment can use a pilot matrix $\Psi_k$ in a given word interval at a time $t_w$ where: (1) the $k^{th}$ user equipment determines the pilot matrix $\Psi_k$ by evaluating a formula using $t_w$ or by reading a table using $t_w$ and (2) a $(k+1)^{th}$ user equipment determines a pilot matrix $\Psi_{k+1}$ by evaluating a formula using $t_w$ or by reading a table using $t_w$. The pilot matrix $\Psi_{k+1}$ can be identical to $\Psi_k$ at a time $t=t_w$.

Furthermore, during certain word intervals, a set of transmission matrices $\Psi$ comprises pilot matrices and a $k^{th}$ element $x_k$ is a pattern with sparsity $s_k=1$ and $x_k$ is known to the solver. The set of transmission matrices $\Psi$ may comprise columns of a Discrete Fourier Transform matrix, or columns generated using a pseudo random number generator.

In accordance with a further embodiment, there is provided a method of operating user equipment. This method can involve: learning a number of uplink antennas passed per second; and apportioning an uplink transmission bandwidth between data, signaling and pilot transmissions based on a learned number. A data transmission comprises s-sparse transmission based on a pseudo-random number-based transmission matrix $\Psi$ which is repopulated at certain time intervals.

In another exemplary embodiment, a communication system includes a plurality of remote samplers $\{1, \ldots, j, \ldots, z\}$ where z is a number of remote samplers, a $j^{th}$ remote sampler capturing N samples during a word interval and transforming the N samples into $M_j$ samples denoted collectively as $y_j$ using a sensing matrix $\Phi_j$ where $M_j < N/2$ and $M = M_1 + \ldots + M_j + \ldots + M_z$; and a solver for receiving samples $\{y_1, \ldots, y_j, \ldots, y_z\}$ from the remote samplers and formulating a soft estimate of a collection of data vectors $\{\tilde{x}_1, \ldots, \tilde{x}_k, \ldots \tilde{x}_l\}$ based on a knowledge of transmission matrices $\{\Psi_1, \ldots, \Psi_k, \ldots, \Psi_l\}$ where l is a number of user equipment $\{1, \ldots, k, \ldots, l\}$. The remote samplers perform sampling of a sparse or non-sparse data transmission. An entropy of a transmitted user constellation can be either 16-bits or 32-bits.

Furthermore, when implementing a non-sparse data transmission mode, the non-sparse data transmission from a UE can include an error detection code(s) such as a checksum (e.g., a cyclic redundancy code (CRC), etc.). The solver can compute a checksum from data formulated from the received samples, and delete blocks of data where a checksum fails. A UE may implement a non-sparse or sparse data transmission mode based on instructions or parameters provided by a base station, automatically upon a triggering event or condition, and so forth. For example, a base station may instruct a UE to enable error detection capability, such as a checksum, in its transmissions.

Turning to the exemplary figures, FIG. 1A illustrates an exemplary sensor-based communication system 100 in accordance with one embodiment. The system 100 includes a plurality of user equipment (UEs) 102, a plurality of sensors 104, a core network, e.g., Central Brain (CB) 106, and a plurality of transmitters 108, e.g., cell towers. The CB can coordinate with other network nodes (or elements) to facilitate communications with UEs and support various network functions. In this example, the sensors 104 can be connected to the CB 106, across fiber optics connection, coaxial connection, other connections or a combination thereof.

Sensors 104 may be designed to be low cost with, for example, an antenna, an RF front-end, baseband circuitry, interface circuitry, a controller, memory, other elements, or a combination of elements. A plurality of sensors 104 may be used to support, for instance, antenna array operation, SIMO operation, MIMO operation, beamforming operation, other operations or combination of operations. A person of ordinary skill in the art will recognize that the aforementioned operations may allow UEs to transmit at a lower power level resulting in, for instance, lower power consumption.

In system 100, the UE 102 and the CB 106 can communicate using, for instance, a network protocol. The network protocol can be, for example, a cellular network protocol, Bluetooth protocol, wireless local area loop ("WLAN") protocol or any other protocol or combination of protocols. A person of ordinary skill in the art will recognize that a cellular network protocol can be anyone of many standardized cellular network protocols used in systems such as LTE, UMTS, CDMA, GSM and others. The portion of the network protocol executed by the sensors 104 may include, for instance, a portion of the physical layer functions. A person of ordinary skill in the art will recognize that reduced functionality performed by sensors 104 may result in lower cost, smaller size, reduced power consumption, other advantages or combination of advantages.

The sensors 104 can be powered by, for instance, a battery power source, an alternating current ("AC") electric power source or other power sources or combination of power sources.

Figure 1B:
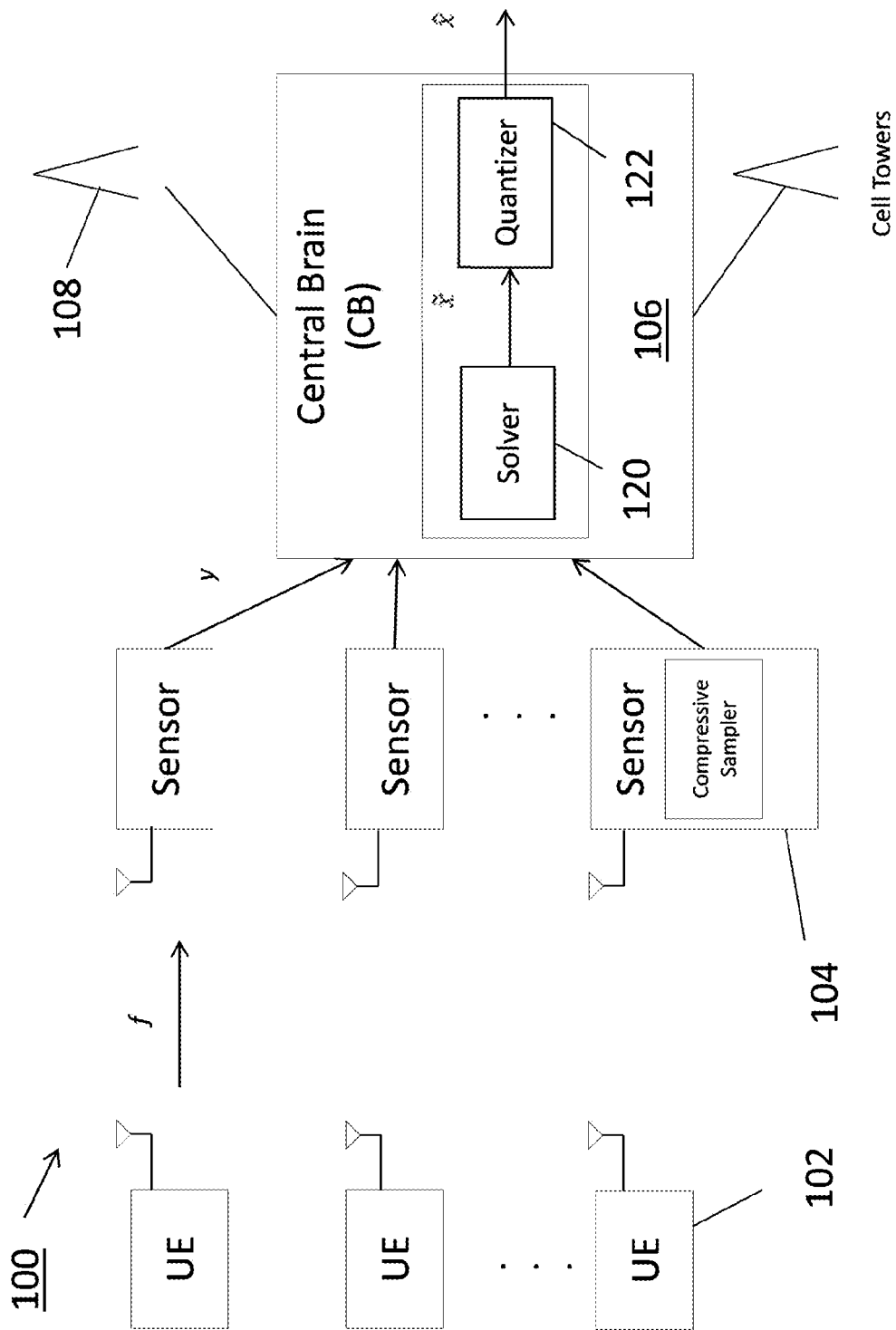
FIG. 1B illustrates an exemplary network environment in accordance with an embodiment.

In the current embodiment, each sensor 104 can compress a received uplink signal ("f") or a noisy version of the uplink signal ("g") from each UE 102 to form a corresponding sensed signal ("y"). The sensors 104 can provide the sensed signals ("y") of the multiple UEs to the CB 106 across communication links. The CB can then process the sensed signals ("y") and determine information or data ("x"), mapped from user data, contained in the uplink signal. In one exemplary embodiment as shown in FIG. 1B, the CB 106 may use a combination of a solver 120 and quantizer 122 to detect the information or data transmitted in an uplink signal. For example, the solver 120 formulates a soft estimate ("x̃") of the information or data, and the quantizer 122 determines an associated hard estimate ("x̂") accordingly. The hard estimate x̂ is demultiplexed to obtain the information or data for each UE $\{x_1, \ldots, x_l,$ where l or L is a number of UEs$\}$. Although signals from multiple UEs can be processed and detected altogether by the CB, they can also be processed and detected individually or in smaller UE sub-groups.

The CB 106 may also communicate instructions to the sensors 104. The instructions can relate to, for instance, data conversion, oscillator tuning, beam steering using phase sampling, other instructions or combination of instructions. Further, the UEs 102, sensors 104, CB 106, base stations, other networks or any combination thereof may communicate including real-time communication using, for instance, a medium access control ("MAC") hybrid-ARQ protocol, other similar protocols or combination of protocols. The UEs 102, sensors 104, CB 106, base stations, other networks or any combination thereof also may communicate using, for instance, presence signaling codes which may operate without the need for cooperation from the sensors 104; space-time codes which may require channel knowledge; fountain codes which may be used for registration and real-time transmission; other communication codes or combination of communication codes. Some of these communication codes may require, for instance, applying various signal processing techniques to take advantage of any inherent properties of the codes.

In FIG. 1A, the CB 106 may perform, coordinate or control various functions such as transmitting system overhead information; detecting a presence of UEs 102 using the sensors 104; two-way, real-time communication with UEs 102; other functions or combination of functions. A person of ordinary skill in the art will recognize that the sensors 104 may be configured with minimum hardware and software sufficient to implement compressive sampling as discussed herein to power consumption and cost.

Sampling is performed by measuring a value of a continuous-time signal at a periodic rate, aperiodic rate, or both to form a discrete-time signal. In the current embodiment, the effective sampling rate of the sensors 104 can be less than the actual sampling rate used by the sensors 104. The actual sampling rate is the sampling rate of, for instance, an analog-to-digital converter ("ADC"). The effective sampling rate is measured at the output of sensors 104, which corresponds to the bandwidth of sensed signal ("y"). By providing a lower effective sampling rate, the sensors 104 can consume less power than other sensors operating at the actual sampling rate without any compression. Redundancy can be designed into the deployment of a system so that the loss of a sensor would minimally affect the performance of the system. For many types of signals, reconstruction of such signals can be performed by the CB 106, base stations, other network, or any combination thereof.

In the current embodiment, the sensors 104 may each contain a direct sequence de-spreading element, a fast Fourier transform ("FFT") element, other elements or combination of elements. The CB 106 can send to the sensors 104 instructions, for instance, to select direct sequence codes or sub-chip timing for a de-spreading element, to select the number of frequency bins or the spectral band for an FFT element, other instructions or combination of instructions. These instructions may be communicated at, for example, one-millisecond intervals, with each instruction being performed by the sensors 104 within one tenth of a millisecond after being received. Further, UEs 102 may transmit and receive information in the form of slots, packets, frames or other similar structures, which may have a duration of, for instance, one to five milliseconds. Slots, packets, frames and other similar structures may include a collection of time-domain samples successively captured or may describe a collection of successive real or complex values.

In FIG. 1A, the system 100 can involve communication of system overhead information between the UEs 102, CB 106, sensors 104, base stations, other network or any combination thereof. The system overhead information may include, for instance, guiding and synchronizing information, wireless wide area network information, WLAN information, other information or combination of information.

In FIG. 1A, a UE 102 may transmit uplink signals at a low transmission power level if the UE 102 is sufficiently proximate to the sensors 104. The sensors 104 can compressively sample the received uplink signals ("f") to generate sensed signals ("y"). Each of the sensors 104 can send these compressed samples, e.g., sensed signals ("y"), to the CB 106 across communication link(s). The CB 106 may perform, for instance, layer 1 functions such as demodulation and decoding; layer 2 functions such as packet numbering and ARQ; and higher-layer functions such as registration, channel assignment and handoff. The CB 106 may have substantial computational power to perform computationally intensive functions in real time, near-real time or both.

In the current embodiment, the CB may apply, coordinate or control link adaptation strategies using, for instance, knowledge of the communication channels such as the antenna correlation matrix of the UEs 102; the number of sensors 104 in proximity to the UEs 102; other factors or combination of factors. Such adaptation strategies may require processing at periodic intervals, for instance, one-millisecond intervals. Such strategies may allow for operating, for instance, at the optimum space-time multiplexing gain and diversity gain. Further, base stations may communicate between each other to perform, for instance, dirty paper coding ("DPC"), which is a technique for efficiently transmitting downlink signals through a communication channel that is subject to some interference that is known to the CB 106. To support these techniques, other base stations that receive extraneous uplink signals from a UE 102 may provide the uplink signals ("f") to a base station or other network node associated with the UE.

An exemplary general framework of a communication system based on compressive sampling is described in detail in U.S. Provisional Application No. U.S. 61/121,992 filed Dec. 12, 2008, entitled LOW POWER ARCHITECTURE AND REMOTE SAMPLER INVENTIONS, and in U.S. patent application Ser. No. 12/635,526 filed Dec. 10, 2009, entitled SENSOR-BASED WIRELESS COMMUNICATION SYSTEMS USING COMPRESSIVE SAMPLING, both applications of which are incorporated by reference in their entirety.

Figure 1C:
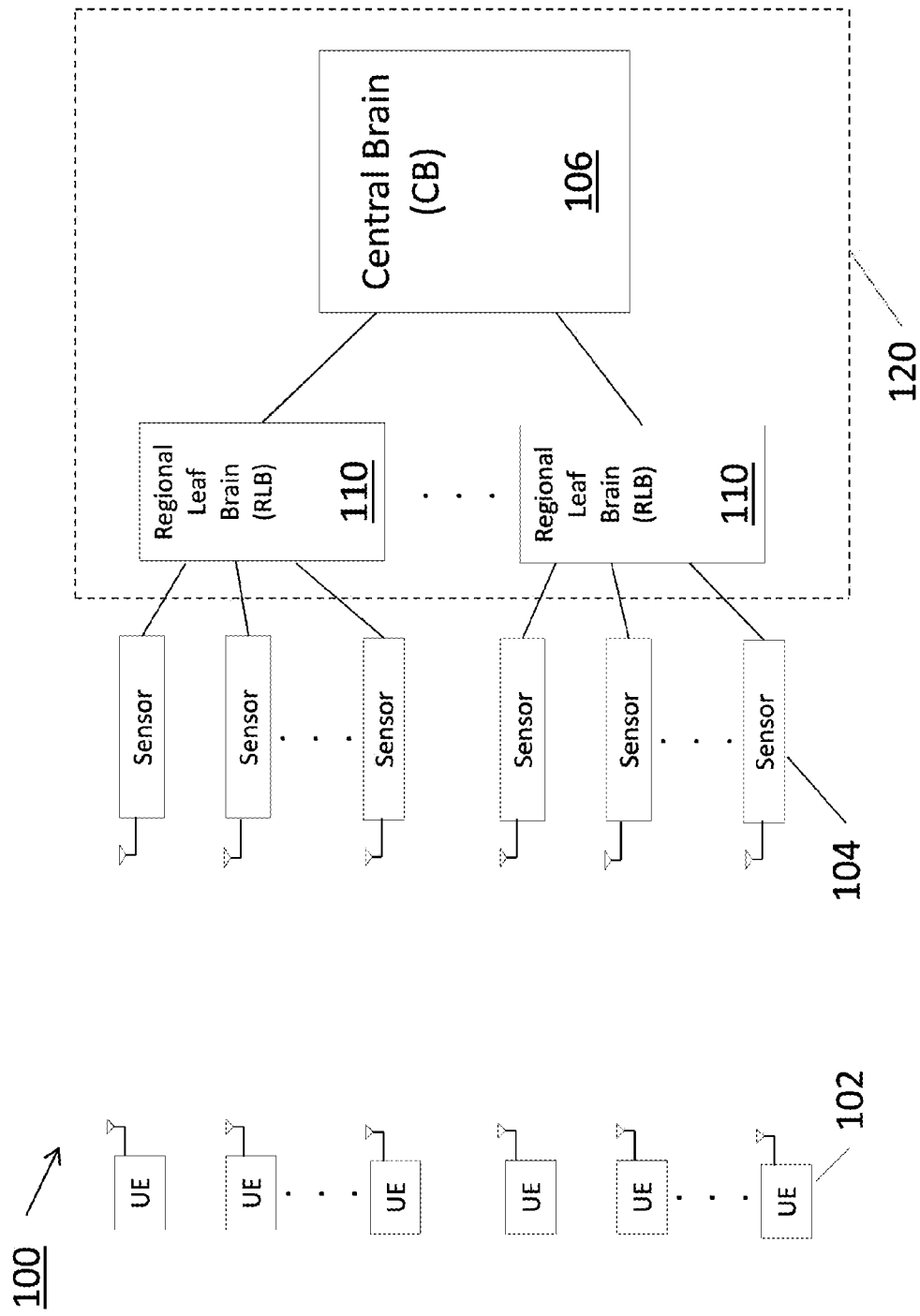
FIG. 1C illustrates an exemplary network environment in which network elements are further distributed in accordance with an embodiment.

In FIG. 1A, there is shown a single remote central processor, i.e., a Central Brain (CB). However, the various methods and approaches may be employed in system 100 in which processing and other operations are conducted in a more distributed environment or infrastructure, such as shown in FIG. 1C. In FIG. 1C, there is shown a distributed processing environment 120 in which the CB is connected to the sensors 104 across a plurality of remote regional processors, e.g., regional leaf brains (RLBs) 110. As shown, the sensors 104 communicate with their respective RLBs, which in turn communicate with the CB.

Each of the RLBs 110 can be associated with a geographic communication region or sub-region, and can perform various functions of the CB, as discussed above, in their respective region. As discussed above, these functions may involve transmission of overhead messages, assignment of resources (e.g., communication parameters) to UEs in their region, or other functions in the oversight and maintenance of their respective region. The RLBs would share information with each other and the CB. The CB would perform oversight of all of the regions and decide, for instance, which RLBs should be carrying out joint detection for which UEs. As will be explained further below, the CB can construct an overall matrix encompassing all the regions (e.g., a city, state, etc.) for use in detecting wireless transmissions for one or more or all of the UEs in the various regions based on compressively sampled signals.

An exemplary embodiment is described below with reference to FIGS. 2-5, to address a situation in which several UEs traveling at highway speeds (e.g., 60-70 mph) transmit signals which are observed by low elevation antennas spaced at about 100 m. Downlink signals are provided by conventional cell towers spaced at 1-2 km. Many of the issues solved here will apply to the office case as well.

Figure 2:
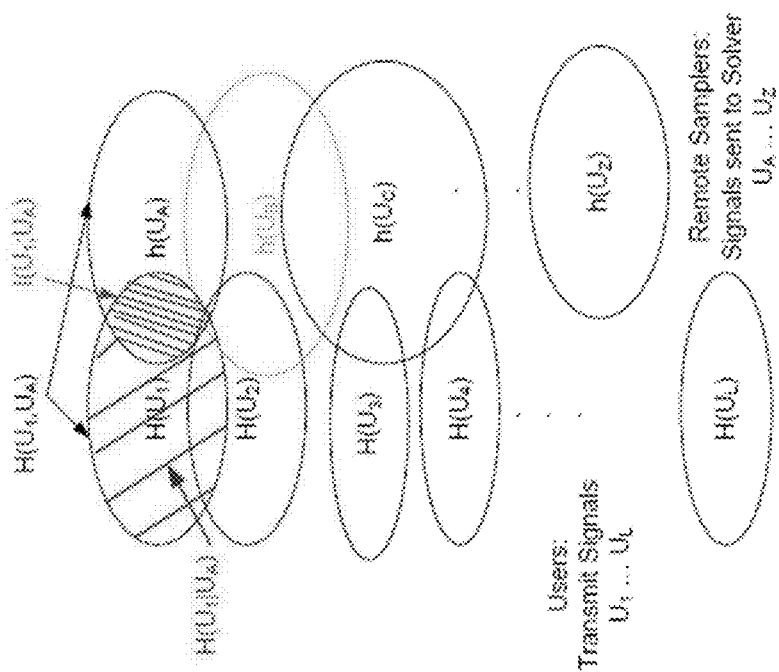
FIG. 2 illustrates an example of entropies of prominent discrete and continuous random variable for a moving user equipment (UE) or mobile.

FIG. 2 illustrates entropies of the prominent discrete and continuous random variables in accordance with an example. This figure can be used to visualize what happens with high speed mobiles. In the notation, H is the entropy of a discrete rv and h is the differential entropy of a continuous rv, [A3]. Using U for a signal in this Figure was simply a convention used from [A4]: $U_1$ is the source signal to be determined, and $U_A$ is the observation at a remote sampler A. As shown, there are multiple transmit signals $U_1 \ldots U_L$ from multiple UEs, and multiple signals $U_A \ldots U_Z$ sent to the solver from multiple remote samplers.

To address this mobility issue, the following exemplary designs and results are presented. The designs and results are summarized by discussing how signals are created or affected by the following system characteristics:

1. In the remote sampler system, coherent uplink communication of payload data can be achieved by a design where each UE uses a specific $\Psi$ matrix for payload data transmission and a specific $D_i$ for pilot transmission. Each mobile station using a $\Psi$ matrix determined, for example, by the UE ID, the time and overhead information received on the downlink (DL). The columns of the $\Psi$ matrices in use are not orthogonal from one UE to the next. Each mobile station uses an uplink pilot signal $D_i$ assigned by an assignment message on the downlink. The pilot signals form a fairly small set and that set is orthogonal. A given pilot signal can be in use by several different UEs at the same time, but not in the same place. The geographical separation of pilot signal use is determined with the help of pilot zones or regions.

As a UE crosses from one pilot zone into the next, the Central Brain (CB), commands the UE to use new specific pilot signal. The infrastructure may be arranged with regional leaf brains (RLBs) carrying out this radio resource assignment. In this example, the fibers from the remote samplers would converge at a local RLB, and the RLBs would communicate with the CB. The RLBs would share information with each other and the CB. The CB would construct an overall H matrix for the city, and decide which RLBs should be carrying out joint detection for which UEs. The RLBs would control the $\Psi_{data}$ matrices in use for UL data transmission by DL control signals. Those DL control signals may be either directed to a specific UE, or simply command groups of UEs to compute the matrix $\Psi_{data}$ each member of that group should be using (possibly different within the group).

Alternatively, the UE can pick a pilot index according to predefined rules, such as a scheduled assignment. The schedule can be based on its own ID and time on a system clock received via overhead message. It may be constrained in its pick by other overhead information. The CB knows the rule the UE uses for the pick and so knows the pilot the UE will use. Exemplary results are provided in graphs shown in FIGS. 15 and 16 (described below).

In existing systems, mobile stations monitor downlink channels and when a routing area (similar to GSM, spec 45.008) is crossed, the network loses track of the UE until the UE makes a RACH transmission and identifies itself through a handshaking sequence. In an exemplary system embodiment, crossing boundary areas would not be as abrupt as a hard handoff event in CDMA or repeating a RACH sequence in GSM. Rather, the CB would know where the UE, call it $UE_i$, is and would know when the $UE_i$'s signal is observed by two groups of remote samplers. A first group with fibers connected to a $RLB_1$ and a second group of remote samplers connected to another RLB, call it $RLB_2$. The corresponding samples, y1 and y2, visible to these RLBs could be forwarded to the CB (as well as processed locally for this and other user signals) for detection of the data sent by $UE_i$.

The pilot set in use $\Psi_{pilot}$ may be a set of orthogonal waveforms, or a set of pseudo random waveforms (e.g., each element of the matrix being a draw on a complex Gaussian distribution with zero mean and unit variance). An exemplary performance result for both types of $\Psi_{pilot}$ is described below with reference to FIG. 15.

2. The uplink signals, g (e.g., noisy version of uplink signals f), excite the antennas at the remote samplers. The remote samplers sense the received signals and send sense measurements, y, to the CB.

3. The CB estimates the uplink channel, $H_{ij}$, from the $i^{th}$ UE to the $j^{th}$ remote sampler. The CB uses its knowledge of the assigned pilots to do this estimation.

4. The CB can carry out detection of the received signals by one of several ways. For example, it may use an $L_1$ or LS (Least Squares), or MMSE (Minimum Mean Squared Error) solver to generate an estimated transmit vector, $\tilde{x}$ (also referred to as a "soft estimate" of the transmit vector). The transmit vector $\tilde{x}$ would then be quantized to produce $\hat{x}$ (also referred to as a "hard estimate" of the transmit vector). An iterative, or turbo, solution method may be applied at this point. The data may be re-modulated, the channel re-estimated, and the new estimate blended in to the old. For example, the channel can be re-estimated as a function of the prior reconstructed information $\hat{x}$, where the UE transmits the following sequence of information $x_t$ over time (t): pilot $x_0$, data $x_1$, data $x_2$, etc. The re-estimated channel H could be expressed as $\hat{H}_0 = f(y_0)$ at time $t=t_0$ when $x_0$=pilot, $\hat{H}_1 = f(y_1, \hat{x}_1)$ at $t=t_1$, $\hat{H}_2 = f(y_2, \hat{x}_2)$ at $t=t_2$, and so forth. The re-estimated channel H can then be used to reconstruct information, such as that transmitted by the UEs in a subsequent time period.

Also, the data may be detected again. For example, the first step could be LS. The second step could be a trial and error approach to see if changing any two UE detected indices to other values would bring a remodulated y vector, call it $\hat{y}$ closer to the observed y. Estimate $\hat{x}$. If components corresponding to some users are deemed correct, remove them from the problem and re-estimate the others with a more complex approach, perhaps ML. One approach reported here of LS followed by 2-level-search.

A mapper processes $\hat{x}$ to determine an estimated transmission index, $p_i$ from the $i$-$^{th}$ UE.

Figure 3:
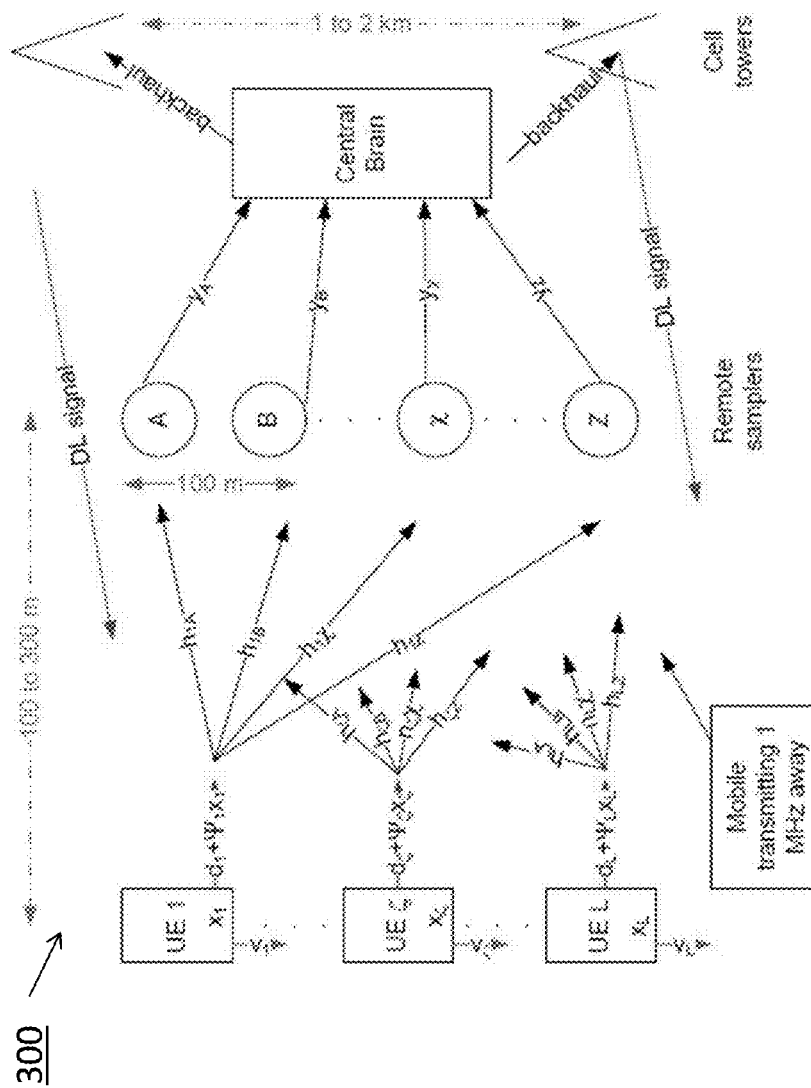
FIG. 3 illustrates an exemplary mobility scenario with Pilots and Out-of-band transmitter in a network environment in accordance with an embodiment.

5. The simulation reported here then determines WER (word error rate) for each UE. The WER values can be used in Fano's inequality [A3, p. 38] to determine an average upper-bound on throughput. Thus, upper bounds can be given based on Fano's Inequality for mutual information in a remote sampler system in which pilot assignment and co-channel interference of pilots and data transmissions are modeled FIG. 3 illustrates an exemplary environment of a mobility scenario with pilots and out-of band transmitters in accordance with one embodiment. In this Figure, each UE sends a pilot signal, $d_\zeta$, which is used by the Central Brain (CB) to estimate each of the fading path gains, $h_\zeta$. A $UE_\zeta$ moves with velocity $v_\zeta$. Each UE maps its user data to a vector x for transmission. In this example, the elevation of any given remote sample is about 1 to 3 m, a distance between a UE and remote sampler is about 100 to 300 m, a distance between remote samplers is about 100 m, and a distance between cell towers is about 1 to 2 km.

Figure 5:
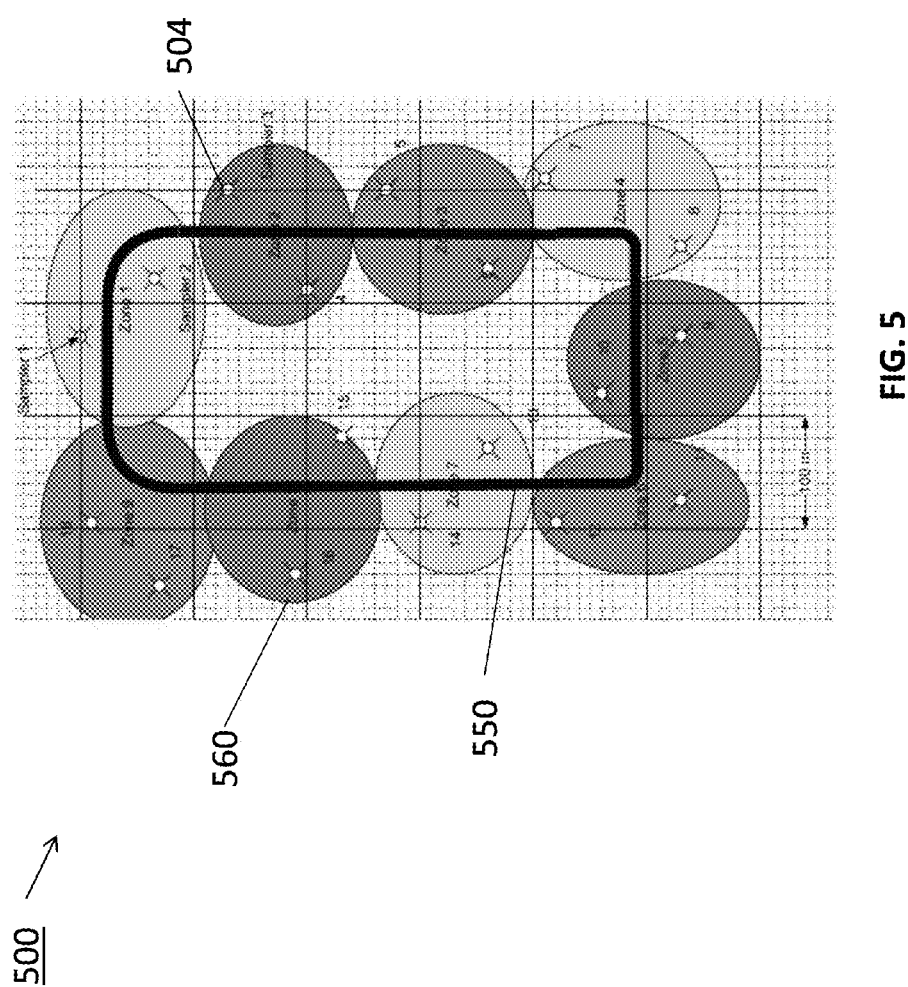
FIG. 5 illustrates an exemplary Highway Loop with Z=18 remote samplers and 9 pilot zones in accordance with an embodiment.

FIG. 5 illustrates a scale drawing of a geographic region 500 with a highway loop 550. In this example, there are nine (9) pilot zones 560 and eighteen (18) remote samplers 504. The remote samplers 504 are grouped together in groups of two (2) in each zone. Each group is denoted a pilot zone 560. The pilot zones are then counted off, and every third pilot zone is allocated the same set of pilots. Thus, in this example, the global pilot set is deployed over groups of three pilot zones. As shown in FIG. 5, pilot zones 1, 4 and 7 are shown in yellow and share the same set of pilots; pilot zones 2, 5, 8 are shown green and share the same set of pilots; and pilot zones 3, 6 and 9 are shown in green and share the same set of pilots.

UEs (or mobiles) inside pilot zones of the same color are assigned pilots from the same subset. When a UE crosses from one pilot zone in to another, a pilot signal resource management entity in the CB releases the old pilot for use by another mobile. A new pilot associated with the new pilot zone is assigned to the entering mobile. In particular, the center of each pilot zone is in a database in the CB. UEs are associated with whichever zone's geographic center they are closest to in Euclidean distance.

As shown in FIG. 5, the use of the same pilot subset in the zones marked in yellow leads to interference on the pilot signal transmission in the uplink. The propagation constant, β, is a fixed exponent, such as β=2 for free space. With this model, it is possible to estimate the cost in throughput of a delay in re-assigning a pilot signal. For instance, the assignment algorithm could be inhibited until the mobile has penetrated a certain number of meters into the pilot zone.

Currently, however, the simulation uses block fading and re-positions (re-"drops") the UE every time a new channel realization occurs. The simulation is also capable of having the UEs drive down the highway a fixed distance between new channel realizations.

An exemplary signal model is shown in the Equations (A) through Equation (C) below.

$$Y = \Phi[H\Psi x + n] \quad (A)$$

$$= \Phi H \Psi \quad (B)$$

$$\begin{matrix} M_A | \\ M | \\ \text{samples } M_j | \\ \text{to Brain} \\ M_Z | \end{matrix} \begin{pmatrix} [y_A] \\ \vdots \\ [y_j] \\ \vdots \\ [y_Z] \end{pmatrix} = \begin{bmatrix} \phi_A & 0 & 0 \\ 0 & \phi_j & 0 \\ 0 & 0 & \phi_Z \end{bmatrix} * \begin{matrix} Z | \\ \text{Remote} \\ \text{Samplers} \end{matrix} \quad (C)$$

$$\begin{bmatrix} h_{A1}I_N & h_{A2}I_N & \ldots & h_{AL}I_N \\ \ldots & & & \\ & h_{jb}I_N & & \\ \ldots & & & \\ h_{Z1}I & h_{Z2}I_N & \ldots & h_{ZL}I_N \end{bmatrix} * \begin{bmatrix} P_1 & P_k & P_L \\ - & - & - \\ N | & \Psi_1 & 0 & 0 \\ N | & 0 & \Psi_k & 0 \\ N | & 0 & 0 & \Psi_L \end{bmatrix} \begin{pmatrix} [x_1] \\ \vdots \\ [x_k] \\ \vdots \\ [x_L] \end{pmatrix}$$

L users $$N + \begin{bmatrix} \phi_A & 0 & 0 \\ 0 & \phi_j & 0 \\ 0 & 0 & \phi_Z \end{bmatrix} \begin{pmatrix} [n_1] \\ \vdots \\ [n_j] \\ \vdots \\ [n_L] \end{pmatrix} | ZN \text{ ADC samples}$$

Figure 4A:
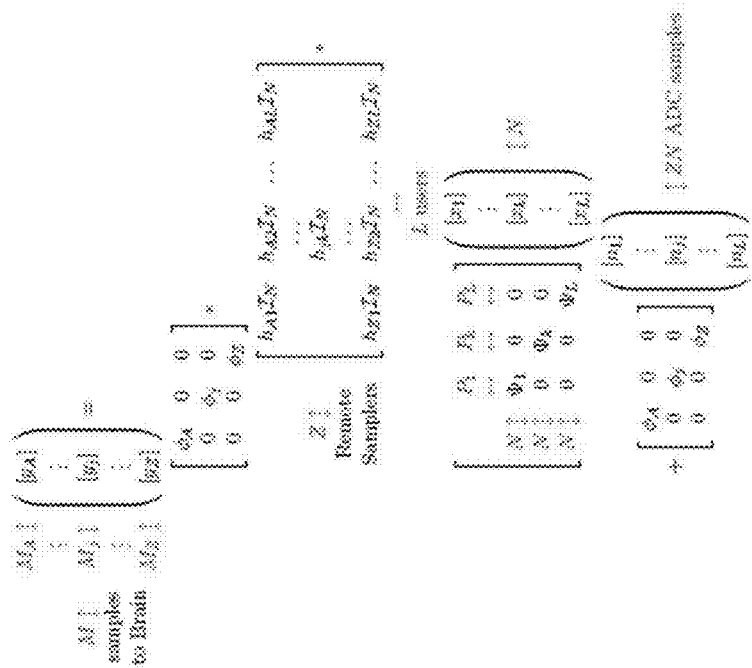
FIG. 4A illustrates a signal model for multiple UE scenario in accordance with an embodiment.

The equation (C) also is reproduced in FIG. 4A, and is an explicit break-out of the terms in equation (A).

In equation (C), the inputs to the Central Brain are the collection of sense measurements $Y=[[y_A]^t: \ldots : [y_Z]^t]^t$. $\Phi j$ is the sensing matrix at remote sampler j. It is noted that ellipses ("..") have been used sparingly in this equation. For example, when a signal such as $\phi_j$ appears, the existence of $\phi_{j-1}$ and $\phi_{j+1}$ is implicit despite the suppressed "..". The term $\Psi_k$ is the representation matrix at UE k. The term $h_{jk}$ is the (generally complex) path gain from UE k to sampler j, and also is referred to as $\alpha$ or $\alpha_{jk}$ herein. The number of samplers is Z, e.g., {1, ..., Z}. The number of UEs is L, e.g., {1, ..., L}. $I_N$ is the N×N identity matrix. $P_k$ is the number columns in $\Psi_k$. $M_j$ is the number of samples generated at remote sampler j. $n_j$ is the additive noise at sampler j. In general, Mj is less than or equal to N. N is the duration of the transmit waveform. For CDMA modulation technique, N is the number of chips per symbol waveform. In general, N is the number of samples needed to feed a digital to analog converter in creating a waveform for one data symbol interval.

TABLE I

Nature of the Matrices, example of all-real system

| Nature at Creation | $\Psi_{ij}$ | $\Phi_{ij}$ |
|---|---|---|
| Random-like | iid Gaussian | iid Gaussian |
| Deterministic | 1 if i = j, else 0 | cos(($\pi$ij)/N) |

After the matrices are created, they are no longer random and their fixed values are known to both the UE and the solver in the CB. As shown in Table 1 (above), "iid"="independent, identically distributed." For complex matrices, replace "cos (arg)" with "exp(sqrt(−1)*arg)" and "Gaussian" with "Complex Gaussian".

An exemplary definition of SNR is a ratio of the desired energy Y to the noise energy in Y as shown in equation (A) and is provided as follows:

$$SNR = (E\{y'y\} | E\{n'n\} = 0)/(E\{y'y\} | E\{x'x\} = 0), \text{ or}$$

$$SNR_{Total} = \frac{Y'Y|_{n'n=0}}{Y'Y|_{x'x=0}}$$

An alternative definition is given by replacing y with g from equations (A) and (B).

The above signal model assumes that the user transmissions are received synchronized at the chip level. Also, that the number of chips is N for every transmit waveform. It may be that some users are not visible to others by frequency or time division. Or that users are separated by nonorthogonal spreading codes which are components of the $\Psi$ matrices. The random received samples are drawn according to the conditional probability distribution $p(y_A, \ldots, y_Z | x_1, \ldots, x_L)$. Here $p(\cdot|\cdot)$ expresses the effects of the noise and interference present in the network. If $p(\cdot|\cdot)$ takes on only the values 0 and 1, the network is deterministic. [A3, pg. 511]. FIG. 4B illustrates an exemplary detector problem statement. This is an example problem statement where the detector method is L=1 UE and Z=1 remote sampler. The channel coefficient is called "a" and is taken to be 1. Generalization to the vector versions can be done by comparing with the signal model shown above. Additional discussion on detecting signals x in a multi-UE scenario is described below.

The items solved or to evaluate in the Moving Mobile Scenario include at least the following:

1. UE Pilot Transmission During Payload.

The current problem formulation includes the variable H for the channel, as in equation (A). The channel is block fading as in [A8], a channel estimator is provided, and the resulting performance is reported in this note. A conventional pilot scheme is used here. That is, all of the UEs transmit a pilot signal during a pilot epoch. After that a certain number of payload transmission intervals occur. The CB estimates the channel based on the pilot. During the payload transmission intervals, it uses the estimate to help demodulate the data. In an approach called "re-estimate" or "re-hash", the CB augments the conventional pilot to improve the channel estimate based on the demodulated data. The amount of energy to be put in to the pilot and the resulting mutual information is the central, question. Two relevant papers are set forth in [A7] and [A2].

2. UE Payload Transmission.

The initial simulations use a CDMA-like M-ary waveform scheme. For the long run, assume OFDM with various levels of QAM. A good reference on adaptive modulation design choices is described in paper [A10]. The Hochwald paper is saying that no special STBC design is needed, only a grey mapping [A5, p. 390 bottom left column]. Sethuraman's Division Algebras in [A11] mean that Alamouti's encoding/decoding technique is not the only approach if decoding complexity is not an issue, and Hochwald's conclusions mean that the number of eligible codes is very high (i.e., greater than the union of Alamouti's design and Division-Algebra based designs). Note the receiver design of in [A1, Ch. 5]. This is a discussion of SPA, sum of products algorithm in [A6], for turbo designs. There is also a paper, [A9], which treats Optimum Combining, MRC and beamforming in CCI situations with Rice, Rayleigh, Nakagami fading. Antennas may have different statistics (e.g., LOS to one antenna, other dist. at others). According to the abstract, the paper in [A16] discusses smart antenna systems in mesh and ad hoc networks.

Figure 6:
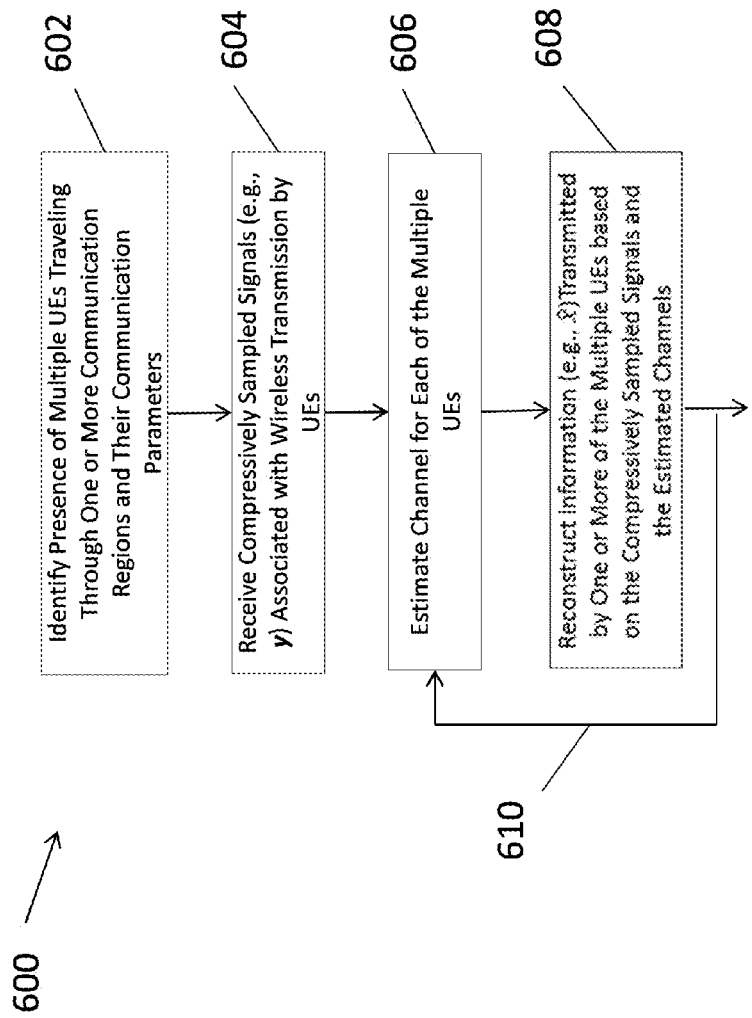
FIG. 6 illustrates a flow diagram of an exemplary process implemented by a Central Brain (CB) for detecting signals for one or more UEs from compressed samples in accordance with an embodiment.

Turning to FIG. 6, there is shown an exemplary process 600 implemented by a CB for detecting signals for one or more UEs from compressed samples in accordance with an embodiment. The process 600 begins at step 602 by identifying a presence of multiple UEs traveling through one or more communication regions and their communication parameters. In an example, the communication regions can be pilot zones and the communication parameters can be any assignable parameter used by UE in a region, such as a pilot, $\Psi$, etc. At step 604, the CB receives compressively sampled signals (or compressed samples), e.g., y, associated with transmission by UEs, across wireless channels. The sampled signals can be received directly from the Remote samplers or indirectly from the Remote samplers via other network nodes such as a Regional Leaf Brain (RLB), etc. At 606, the CB estimates a channel for each of the multiple UEs. The channel can be estimated based on pilot signals employed by the UEs. In step 608, the CB detects or reconstructs information (or data) transmitted by one or more of the multiple UEs based on the compressively sampled signals and the estimated channels. Various detection methods can be used as discussed herein. When using a linear program to perform detection, the CB may employ a matrix to recover a signal x for multiple UEs at the same time. For example, the CB could generate an overall matrix, such as an H matrix or other matrices, for multiple or all UEs that are used for example in the Signal Models described herein to recover a composite x transmit vector (e.g., $\hat{x}$) for multiple UEs.

The channel matrix H can be re-estimated as a function of previously reconstructed $\hat{x}$ by feeding the solution in step 608 back into step 606 (as shown by reference numeral 610. As previously discussed, the re-estimated channel H could be expressed as $\hat{H}_0=f(y_0)$ at time $t=t_0$ when $x_0$=pilot, $\hat{H}_1=f(y_1, \hat{x}_1)$ at $t=t_1$, $\hat{H}_2=f(y_2, \hat{x}_2)$ at $t=t_2$, and so forth. The re-estimated channel H can then be used to reconstruct information, such as that transmitted by the UEs in a subsequent time period. In this example, $x_0$ is the pilot signal; $\hat{x}_1$ can be reconstructed based on $y_1$ and $\hat{H}_0$; $\hat{x}_2$ can be reconstructed based on $y_2$ and $\hat{H}_1$; and so forth.

Figure 7:
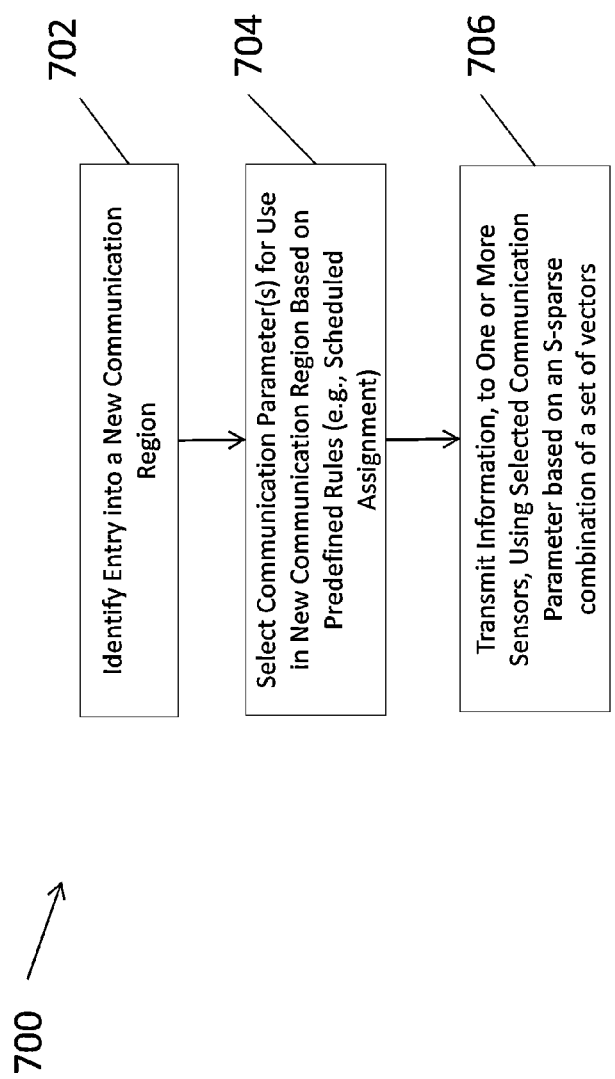
FIG. 7 illustrates a flow diagram of an exemplary process implemented by user equipment to conduct communication in a new communication region in a compressive sampling system in accordance with an embodiment.

FIG. 7 illustrates a flow diagram of an exemplary process 700 implemented by a UE to conduct communication in a new communication region in a compressive sampling system in accordance with an embodiment. The communication regions can be pilot zones, and the communication parameters can be any assignable parameter used by UE in a region, such as a pilot, $\Psi$, etc. At step 702, the UE identifies that it has entered or crossed into a new communication region. The UE can identify this event based on information from an overhead message. In step 704, the UE selects communication parameter(s) for use in the new communication region based on predefined rules. For example, the predefined rules can be a scheduled assignment which is based on system clock and UE identifier (ID). In Step 706, the UE transmits a wireless transmission (or signal) to one or more sensors using the selected communication parameter(s) based on an S-sparse combination of a set of vectors. As will be discussed in more detail below, such an arrangement allows a UE traveling, particularly at higher speeds, to avoid resource collision when transitioning from one communication region to another. As a consequence, the UE can, for instance, maintain coherent communications at higher vehicle speeds in order to transmit more payload data at such higher speeds.

Figure 8:
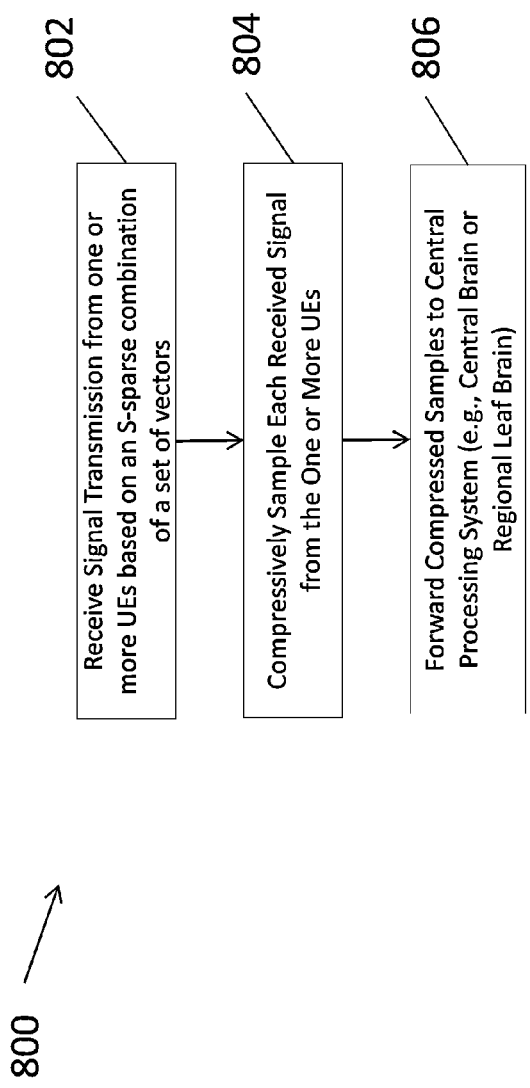
FIG. 8 illustrates a flow diagram of an exemplary process implemented by a sensor, such as a remote sampler, to sense UE signals and generate compressed samples in a compressive sampling system in accordance with an embodiment.

FIG. 8 illustrates a flow diagram of an exemplary process 800 implemented by a sensor, such as a remote sampler (RS), to sense UE signals and generate compressed samples in accordance with an embodiment. Likewise, in an exemplary environment, the communication regions can be pilot zones, and the communication parameters can be any assignable parameter used by UE in a region, such as a pilot, $\Psi$, etc. In step 802, the RS receives a wireless transmission or signal across a channel(s) from one or more UEs based on an S-sparse combination of a set of vectors. In step 804, the RS compressively samples each received signal from the one or more UEs. At 806, the RS forwards these compressed samples to a CB or RLB.

Figure 9:
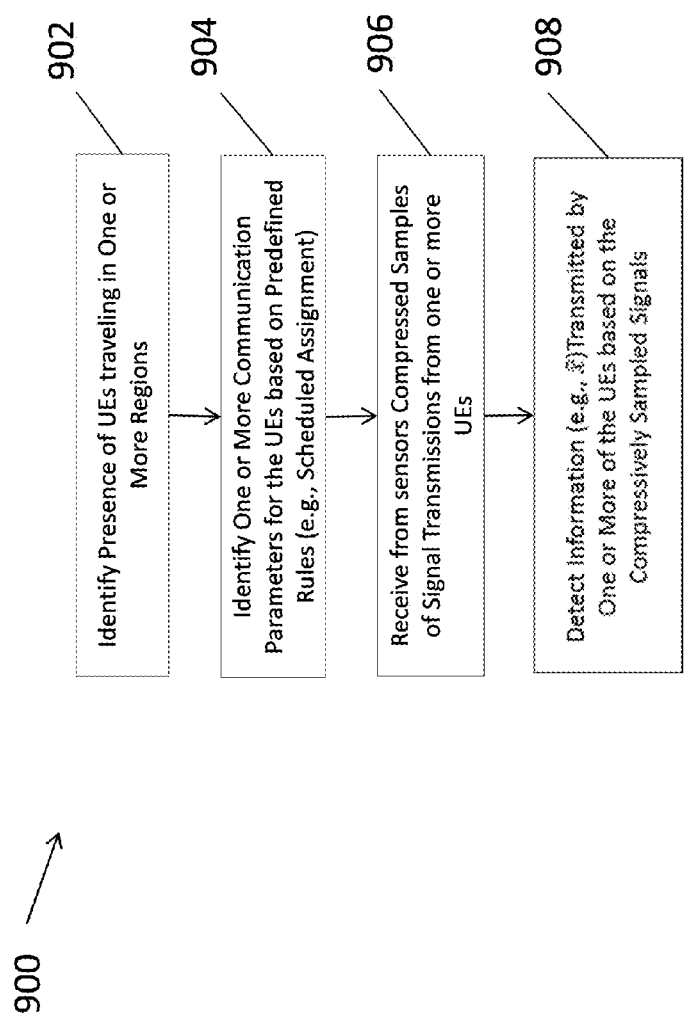
FIG. 9 illustrates a flow diagram of an exemplary process implemented by a CB for detecting signals for one or more UEs from compressed samples in accordance with an embodiment.

FIG. 9 illustrates a flow diagram of an exemplary process 900 implemented by a CB for detecting signals for one or more UEs from compressed samples in accordance with an embodiment. In an exemplary environment, the communication regions can be pilot zones and the communication parameters can be any assignable parameter used by UE in a region, such as a pilot, $\Psi$, etc. At step 902, the CB identifies a presence of multiple UEs traveling through one or more communication regions. As discussed herein, a presence of a UE is discernable from presence signals or the like transmitted by UEs at various events, e.g., on powering on, traveling to a new communication region, periodically or aperiodically, and so forth. At step 904, the CB identifies one or more communication parameters for the UEs based on predefined rules. As discussed above with reference to FIG. 6, the predefined rules can be based on a scheduled assignment. Further, as noted above, an overall matrix can be generated for various parameters, e.g., H matrix, etc. In step 906, the CB receives from the sensors compressed samples of signal transmissions from one or more UEs. In step 908, the CB detects or reconstructs the information or data transmitted by the one or more of the UEs based on the compressed samples. The CB can use any of the various detector methods discussed herein.

Figure 10:
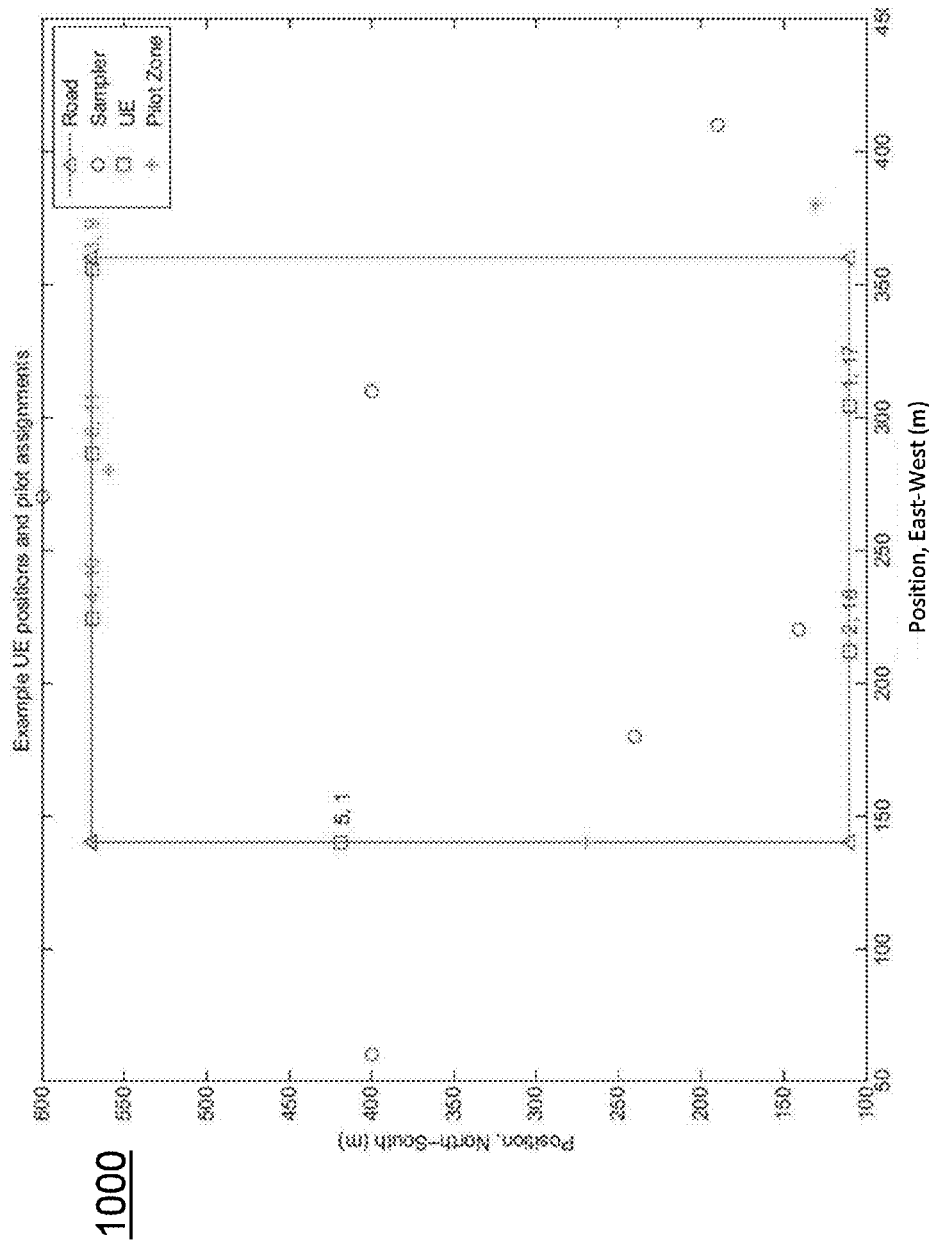
FIG. 10 illustrates an exemplary placement of UEs on a road with Z=6 remote samplers and L=6 UEs in accordance with an embodiment.
Figure 11:
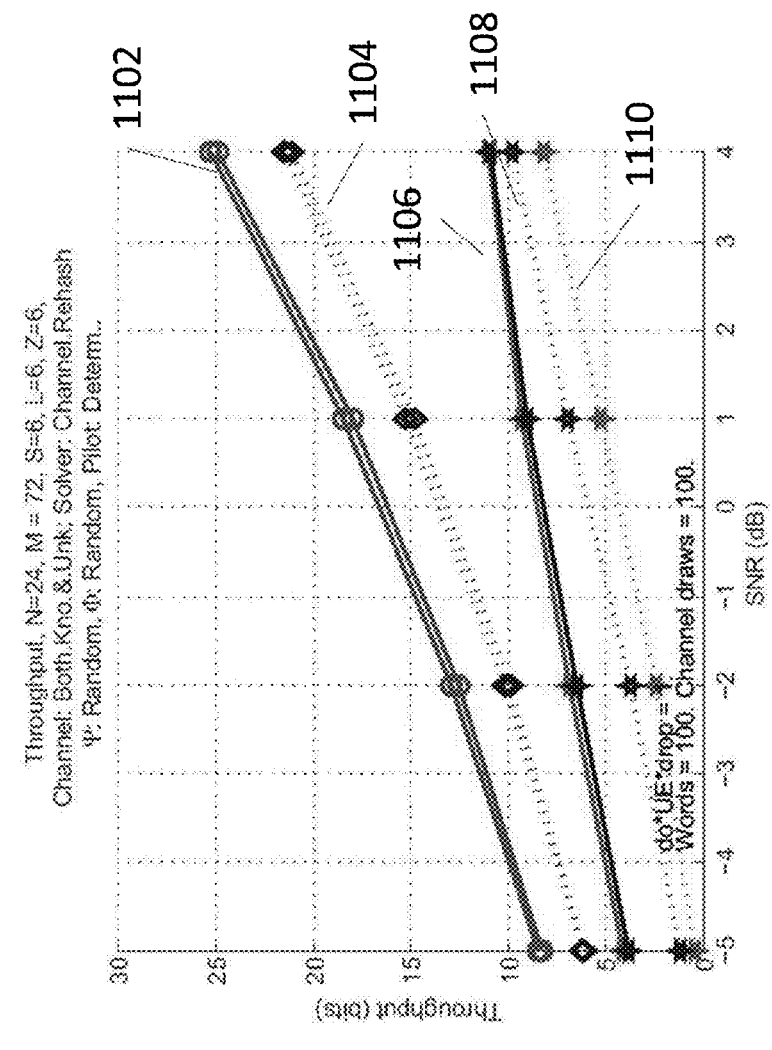
FIG. 11 illustrates an exemplary graph of Throughput (bits) versus Signal to Noise Ratio (SNR) in dbs for Z=6 remote samplers in accordance with an embodiment.

FIGS. 10 through 24 illustrate results of simulations conducted with respect to the various system configurations. In these Figures, Z refers to a number of remote samplers, L refers to a number of UEs, S refers to a sparsity, N refers to a length of a signal and M refers to a number of samples. For example, FIG. 10 illustrates an exemplary placement 1000 of UEs on a road with Z=6 and L=6 in accordance with an embodiment. FIG. 11 illustrates an exemplary graph 1100 of Throughput (bits) versus Signal to Noise Ratio (SNR) in dbs for Z=6 in accordance with an embodiment. Various scenarios are compared with respect to throughput and estimated MI, and CSI Known and Unknown. This is a slightly rough Figure. The correlation matrices converge slowly, and the upper bound for known channel in blue with bubbles (1102) is showing two slightly different curves for the same quantity. The upper bound for mutual information when only the second order statistics of H are known is shown as a black dotted line with diamonds (1104). The average throughput curves for known channel (1106) are for the same configuration, but 100 different channel draws. The black dotted line with hexagrams (1108) is for the re-estimated channel. The dotted red line (1110) is for simply estimated CSI.

Figure 12:
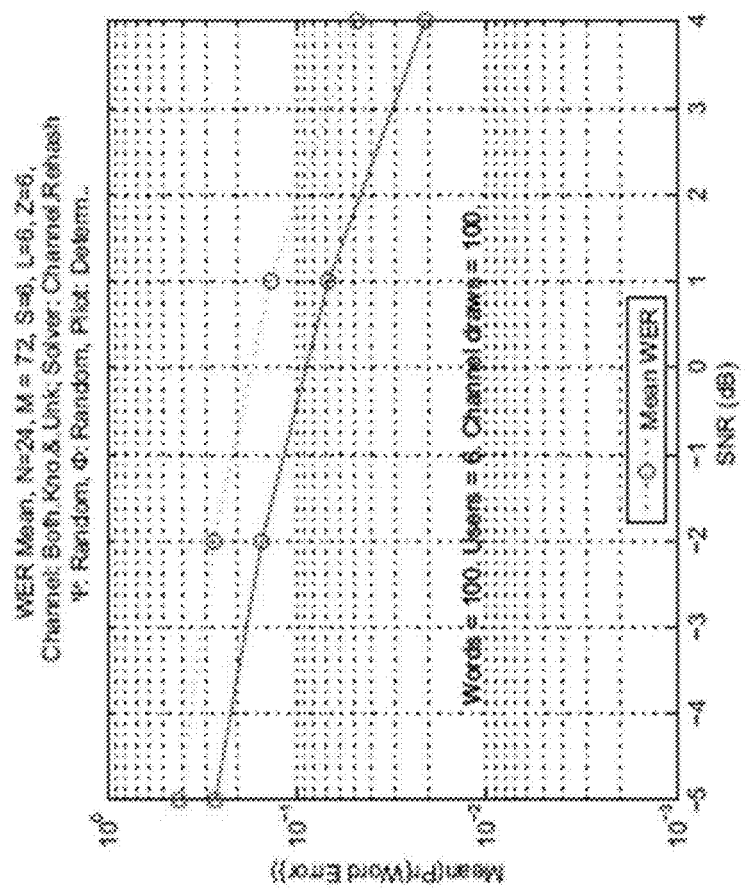
FIG. 12 illustrates an exemplary graph of Mean Words Per Error (WER) versus SNR for Z=6 remote samplers in accordance with an embodiment.

FIG. 12 illustrates an exemplary graph 1200 of Mean Words Per Error (WER) versus SNR for Z=6 in accordance with an embodiment. This graph shows WER for CSI Known and CSI re-estimated. FIG. 12 corresponds to the Throughput curve of FIG. 11.

Figure 13:
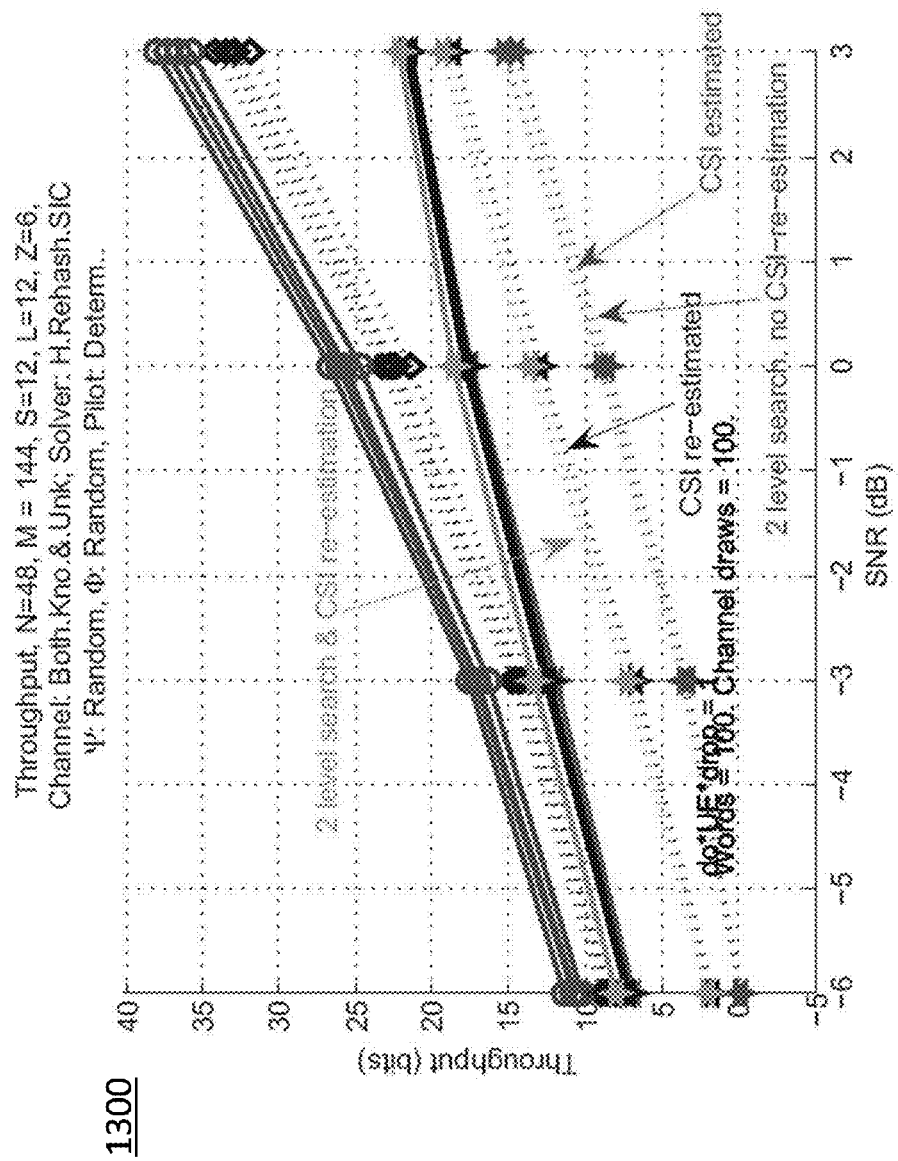
FIG. 13 illustrates an exemplary graph of Throughput versus SNR for Z=6 remote samplers comparing Throughput for LS Detector and LS followed by 2-level-local-search in accordance with an embodiment.

FIG. 13 illustrates an exemplary graph 1300 of Throughput versus SNR for Z=6 comparing Throughput for LS Detector and LS followed by 2-level-local-search in accordance with an embodiment. This graph shows the throughput where the CSI is known, estimated, or re-estimated. The 2-level search is of no benefit.

Figure 14:
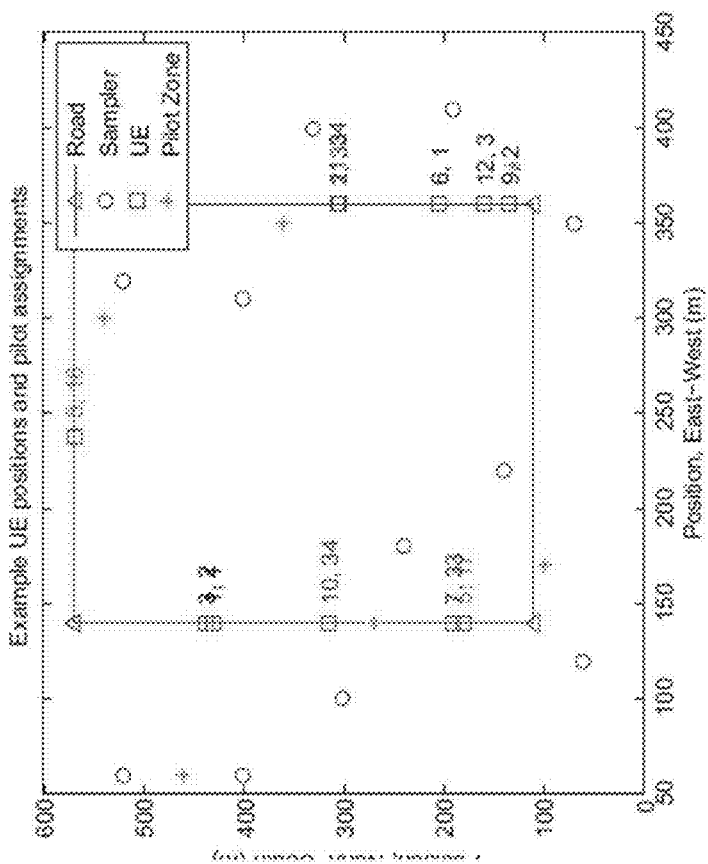
FIG. 14 illustrates an exemplary placement of UEs on a road for Z=12 remote samplers and L=12 UEs in accordance with an embodiment.
Figure 15:
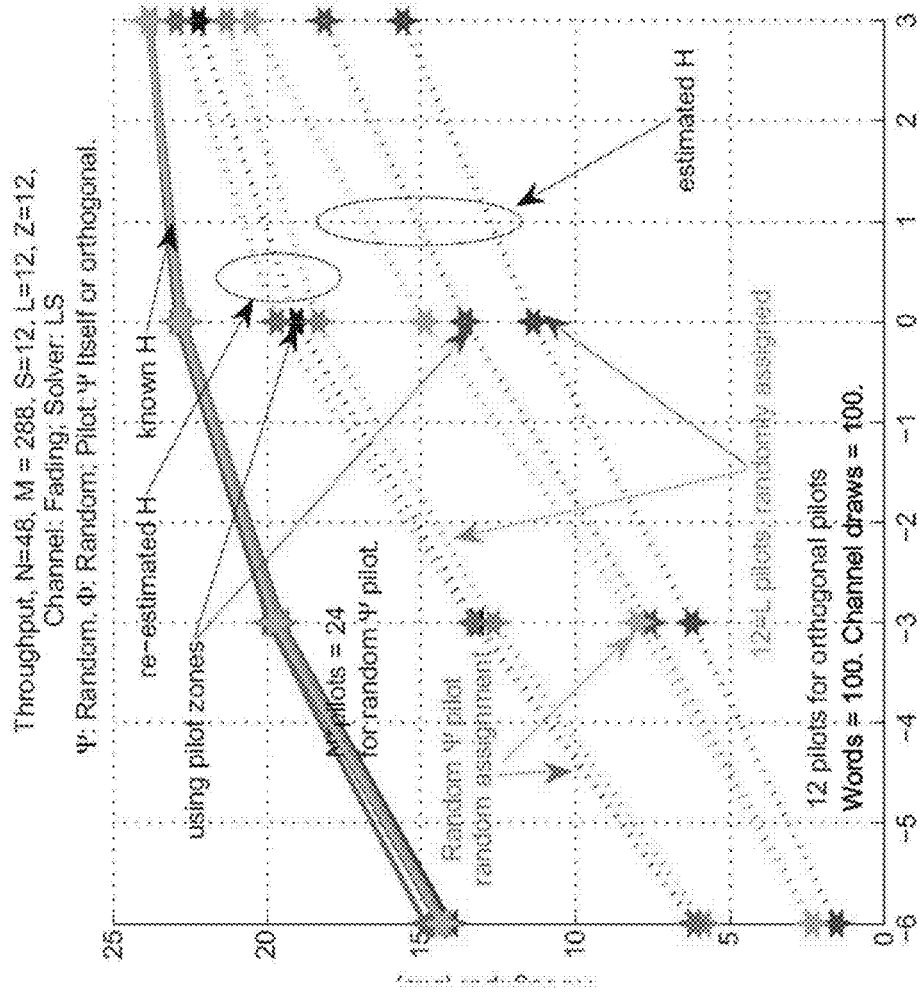
FIG. 15 illustrates an exemplary graph of Throughput versus SNR for Z=12 remote samplers comparing Throughput for LS Detector and CSI known (solid curves), CSI estimated and pilot zones (dotted red), CSI estimated and random pilots assigned (dotted blue), or pilot zones with CSI estimated and then re-estimated after data detection (dotted black), or random pilot assignments with CSI estimated and then re-estimated after data detection (dotted green) and CSI known (solid curves), CSI estimated and pilot zones (dotted red), CSI estimated and random pilots assigned (dotted blue), or pilot zones with CSI estimated and then re-estimated after data detection (dotted black), or random pilot assignments with CSI estimated and then re-estimated after data detection (dotted green) in accordance with an embodiment.

FIG. 14 illustrates an exemplary placement 1400 of UEs on a road where Z=12 and L=12 in accordance with an embodiment. FIG. 15 illustrates an exemplary graph 1500 of Throughput versus SNR for Z=12 comparing Throughput for LS Detector and CSI known (solid curves), CSI estimated and pilot zones (dotted red), CSI estimated and random pilots assigned (dotted blue), or pilot zones with CSI estimated and then re-estimated after data detection (dotted black), or random pilot assignments with CSI estimated and then re-estimated after data detection (dotted green) and CSI known (solid curves), CSI estimated and pilot zones (dotted red), CSI estimated and random pilots assigned (dotted blue), or pilot zones with CSI estimated and then re-estimated after data detection (dotted black), or random pilot assignments with CSI estimated and then re-estimated after data detection (dotted green) in accordance with an embodiment. N_Pilots=2*L and $\Psi_{pilot}$ is a set of random waveforms for two of the curves (the cyan and magenta curves). N_Pilots=L and $\Psi_{pilot}$ is a set of orthogonal waveforms for the other four curves. This is perhaps the most important plot in this report. It shows for mobile stations travelling at a speed such that the word period is less than approximately $$\frac{1^{th}}{10}$$

of the coherence interval, $10*T_{word} \approx T_{coh}$ (or larger $T_{coh}$), that pilots can be selected from a set of random waveforms and assigned randomly to the UEs and the throughput is quite good. For $T_{word} \approx 3*T_{coh}$, the same approach can be used and the random $\Psi_{pilot}$ approach still outperforms a difficult-to-coordinate pilot zone scheme. The $\Psi_{pilot}$ waveform in use might be determined by a hash on the UE's identity. In this case, more pilots are allowed to the random scheme, because for a given bandwidth, there are many more waveforms with low, but nonzero correlation, than the number of waveforms with zero correlation (i.e., orthogonal) which can be designed in the same bandwidth.

Figure 16:
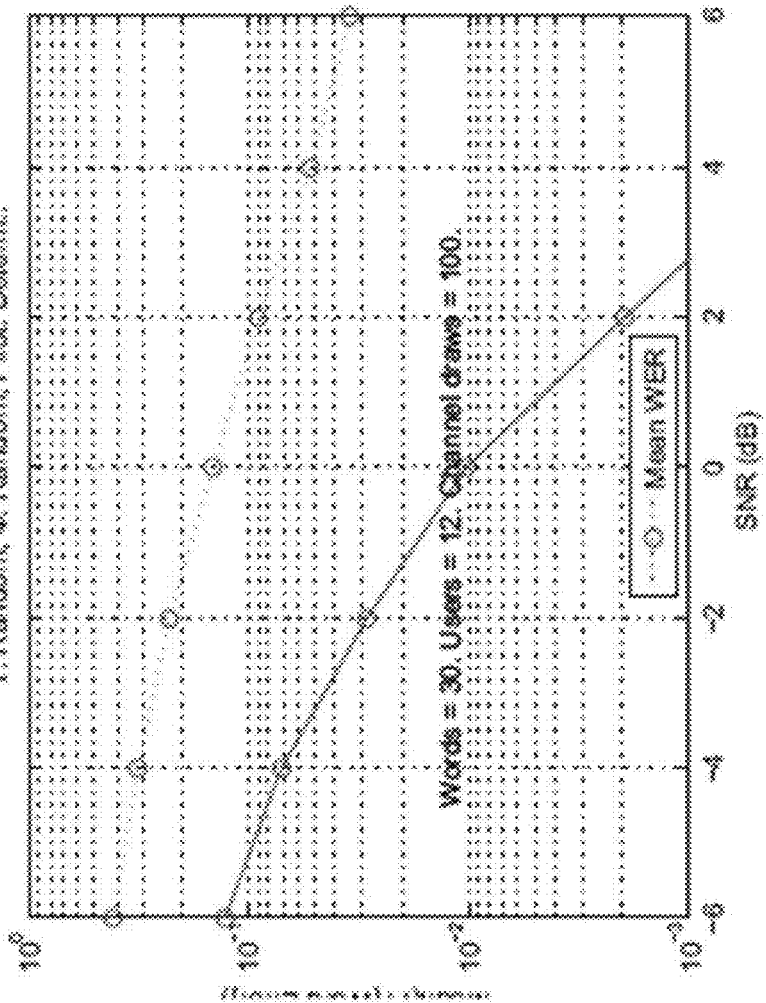
FIG. 16 illustrates an exemplary graph of WER Mean versus SNR for Z=12 remote samplers in accordance with an embodiment.

FIG. 16 illustrates an exemplary graph 1600 of WER Mean versus SNR for Z=12, M=288, S=12 and L=12 in accordance with an embodiment. This graph addresses the scenario for CSI Known and CSI Estimated, and LS Detector. These are WER values associated with the CSI known and CSI estimated throughput curves in FIG. 15.

Figure 17:
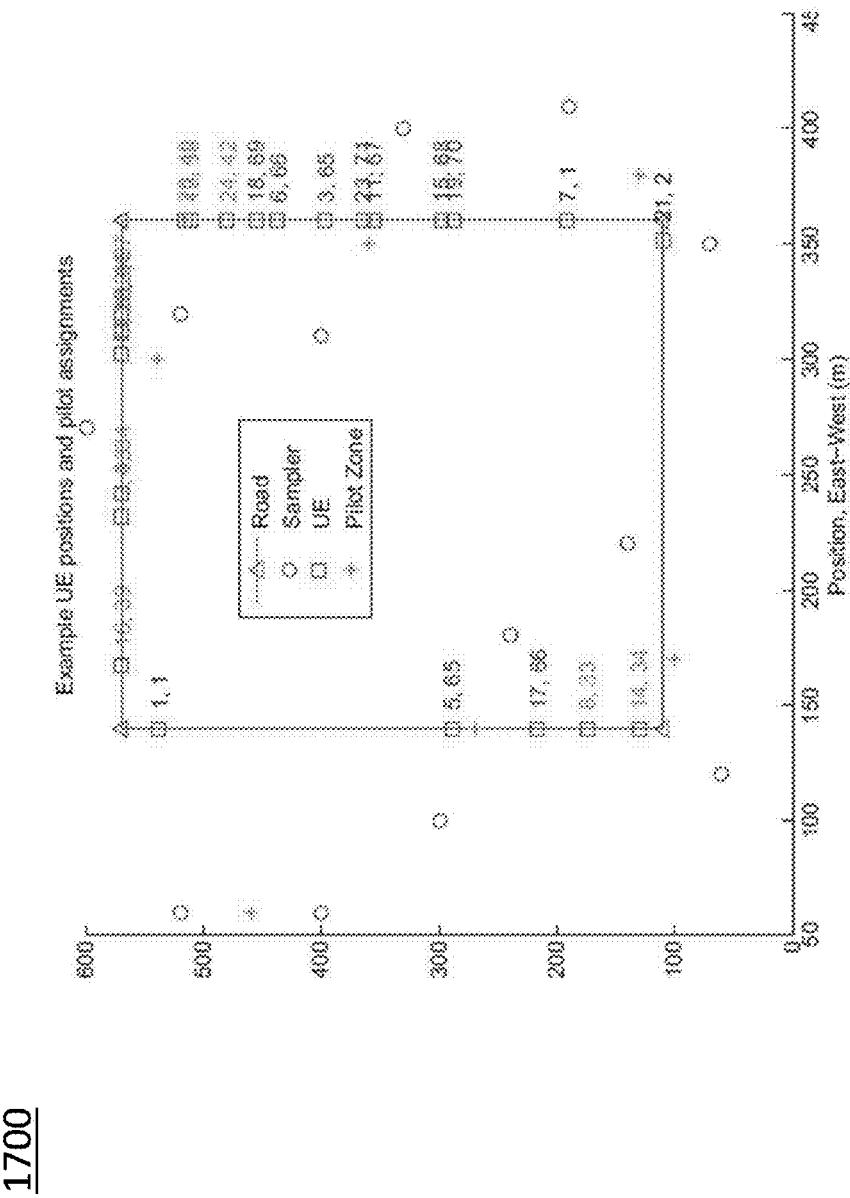
FIG. 17 illustrates an exemplary graph of a placement of UEs on a road for Z=12 remote samplers and L=24 UEs in accordance with an embodiment.
Figure 18:
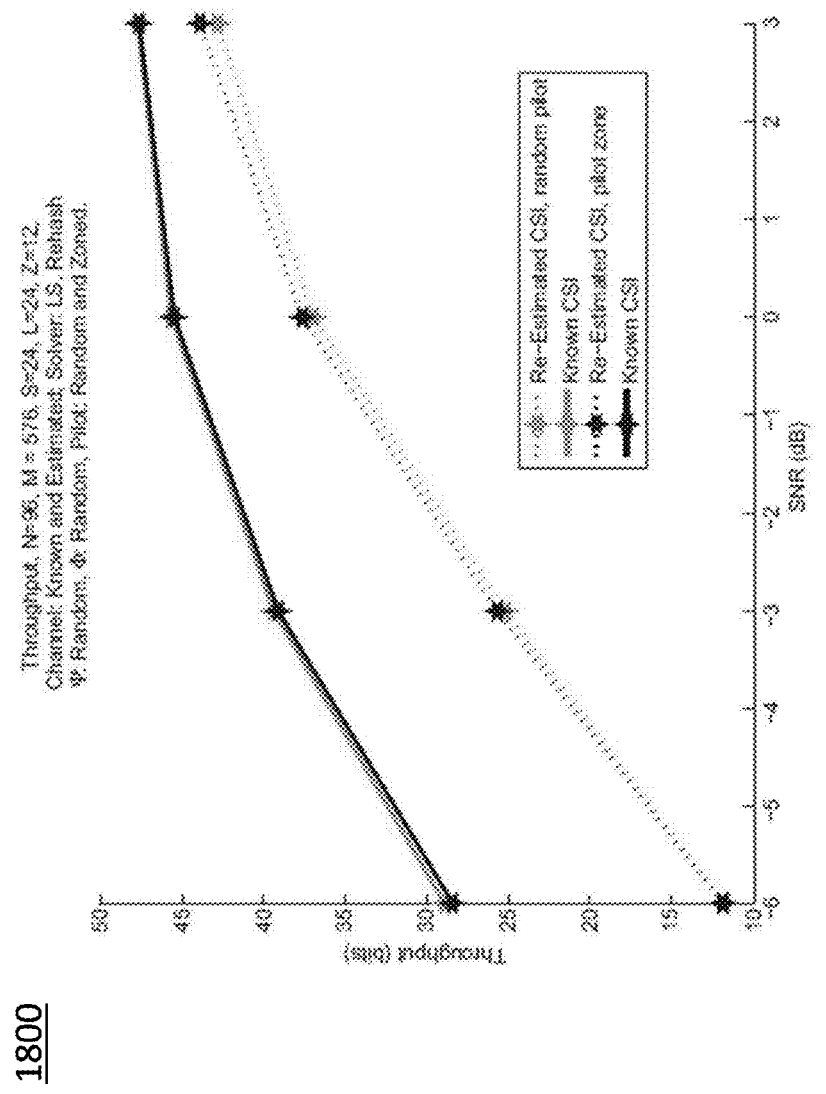
FIG. 18 illustrates an exemplary graph of Throughput versus SNR for L=24 UEs and Z=12 remote samplers in accordance with an embodiment.

FIG. 17 illustrates an exemplary placement 1700 of UEs on a road where Z=12 and L=24 in accordance with an embodiment. FIG. 18 illustrates an exemplary graph 1800 of Throughput versus SNR for L=24, Z=12, M=576 and S=24 in accordance with an embodiment. In this example, N_Pilots also equals 24. This graph shows a throughput for re-estimated CSI and random pilot, for known CSI, for re-estimated CSI and pilot zone and for known CSI. Pilots are assigned in one of two ways: either by geographic zone or randomly.

Figure 19:
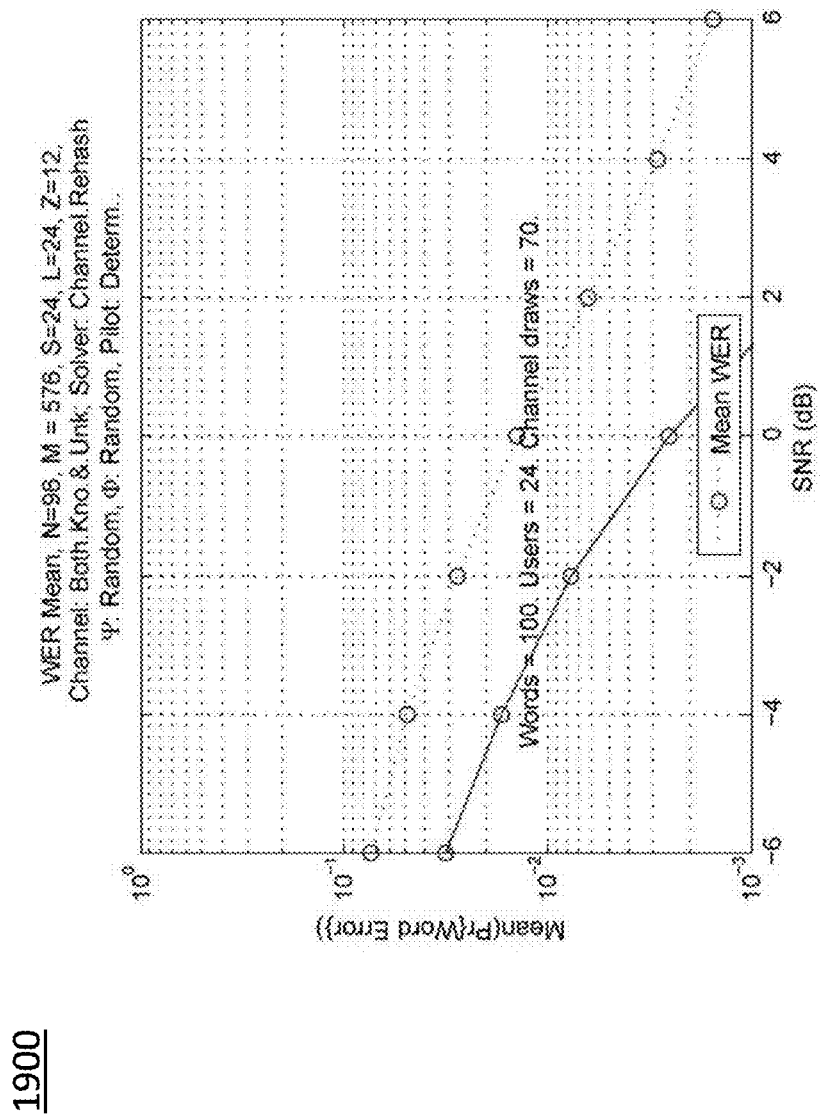
FIG. 19 illustrates an exemplary graph of WER Mean versus SNR for L=24 UEs and Z=12 remote samplers in accordance with an embodiment.

FIG. 19 illustrates an exemplary graph 1900 of WER Mean versus SNR for L=24, and Z=12, M=576 and S=24 in accordance with an embodiment. In this graph, the WER Mean is determined for CSI known and re-estimated. These are the WER values associated with the throughput curves in FIG. 18 for random pilot assignment.

Figure 20:
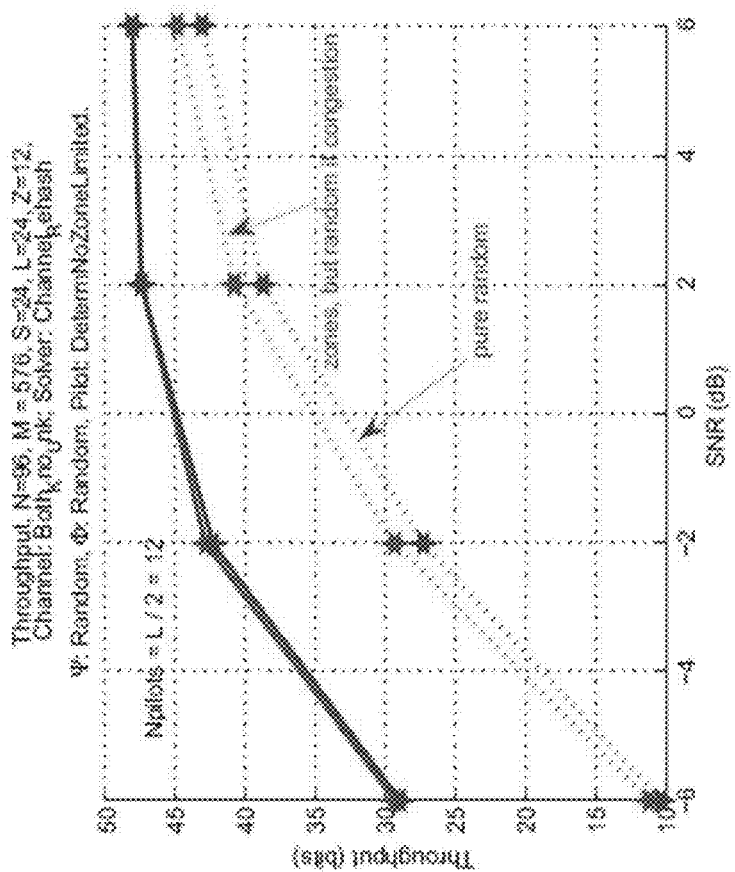
FIG. 20 illustrates an exemplary graph of Throughput versus SNR for L=24 UEs and Z=12 remote samplers in accordance with an embodiment.

FIG. 20 illustrates an exemplary graph 2000 of Throughput versus SNR for L=24, Z=12, M=576 and S=24 in accordance with an embodiment. In this example, N_Pilots is equal to 12. This graph shows a throughput for CSI known and re-estimated. Pilots also are assigned in one of two ways: either by geographic zone or randomly.

Figure 21:
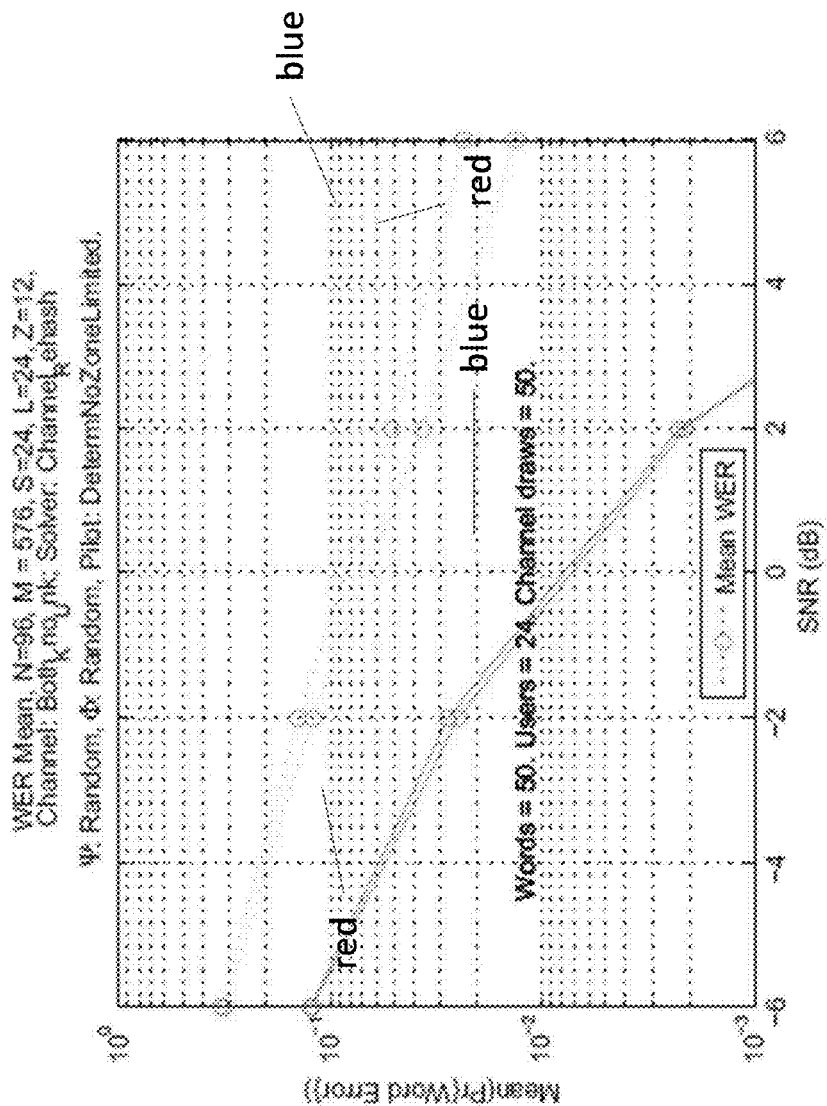
FIG. 21 illustrates an exemplary graph of WER Mean versus SNR for L=24 UEs and Z=12 remote samplers in accordance with an embodiment.

FIG. 21 illustrates an exemplary graph 2100 of WER Mean versus SNR for L=24, Z=12, M=576 and S=24 in accordance with an embodiment. In this example, N_Pilots is equal to 12. This graph shows a WER for CSI known and re-estimated. Pilots also are assigned in one of two ways: either by geographic zone or randomly.

Figure 22:
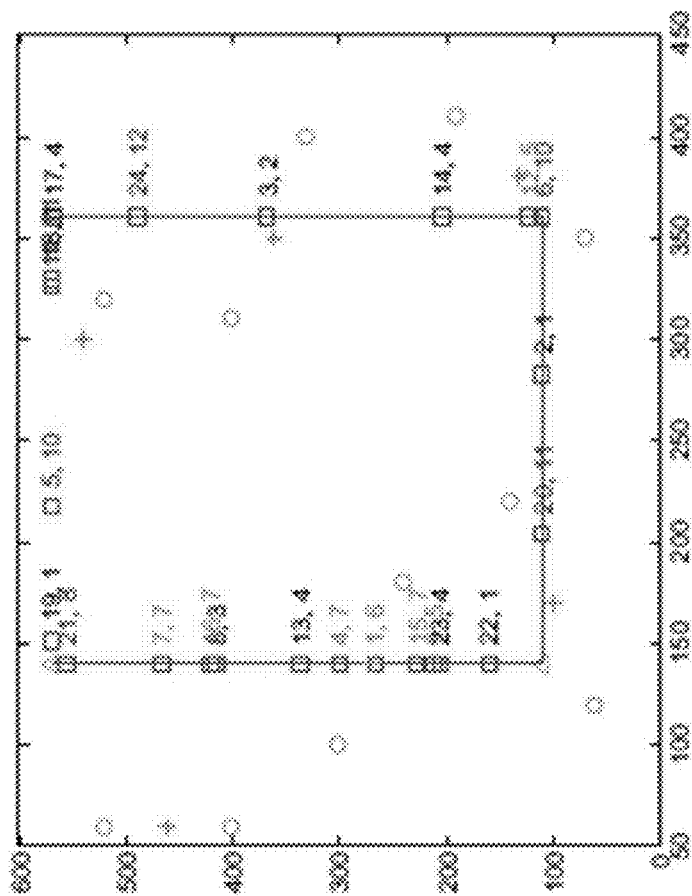
FIG. 22 illustrates an exemplary graph of a placement of UEs on a road for Z=12 remote samplers and L=24 UEs in accordance with an embodiment.

FIG. 22 illustrates an exemplary graph of a placement 2200 of UEs on a road for Z=12 and L=24 in accordance with an embodiment. In this case, N_Pilots is equal to 12 and there are random pilot assignments. The first digit by each UE is the UE ID. The second digit is the pilot index assigned.

Figure 23:
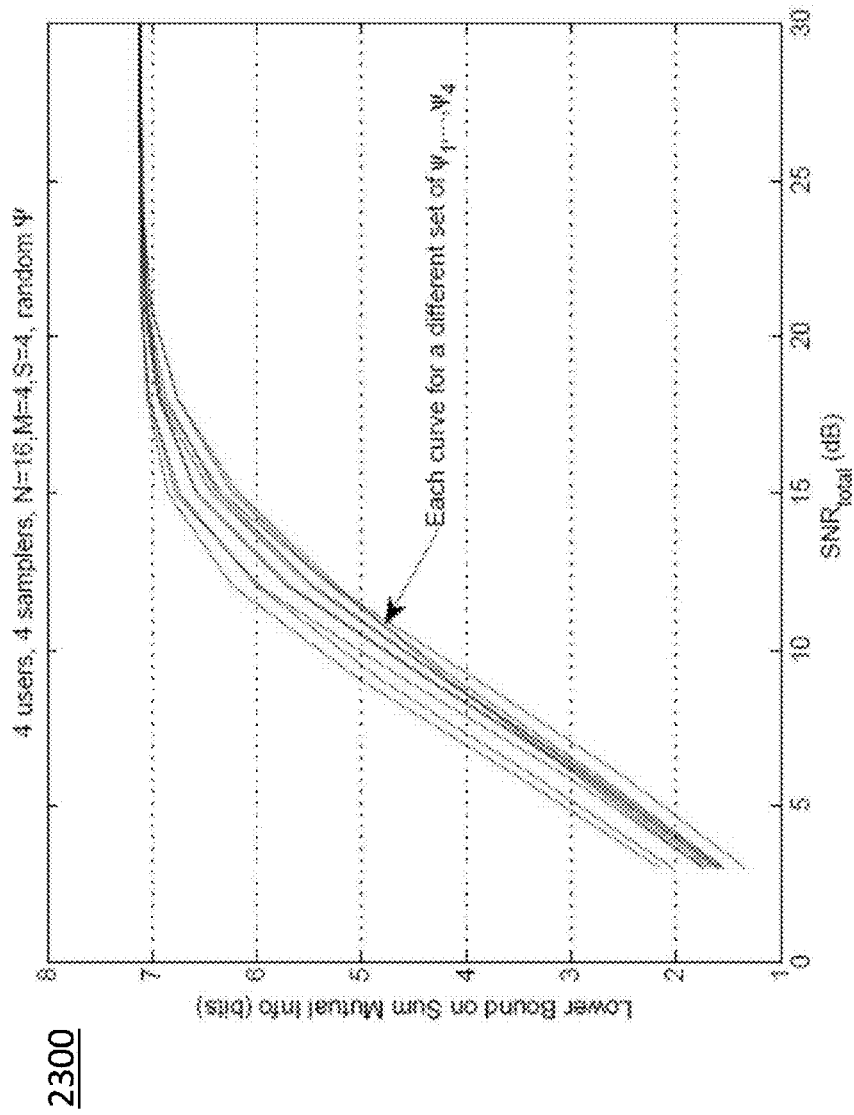
FIG. 23 illustrates a graph of a Lower Bound on Sum Mutual Information (bits) versus SNR in accordance with an embodiment.

FIG. 23 illustrates a graph of a Lower Bound on Sum Mutual Information (bits) versus SNR in accordance with an embodiment. $\Psi$ is a random-like matrix at each UE; 10 sets of realizations. It is seen that the best to worst variation within the plot in sum mutual information (bound) is about 1.0 bits. The average is about 1.5 dB worse than the best in the steep part of the curve, and the average (and all outcomes observed here) comes up to the same lower bound at high SNR. This is for an AWGN channel. An exemplary method of calculating this lower bound is described in U.S. Provisional Patent Application Ser. No. 61/169,596 filed Apr. 15, 2009, which is incorporated herein by reference in its entirety. This means that, despite the collision event, little loss (with the proper detector) is expected in ability to convey information across the channel when using the $\Psi$-schedule algorithm.

There are many methods for a user equipment (UE) to access a wireless communication system. One type of access method is, for instance, the Aloha random access method, which is performed when an unrecognized UE attempts to access the network. Two-way communication with a base station may take place, for instance, after the user equipment has been given permission to use the system and any uplink and downlink channels have been assigned.

Figure 24:
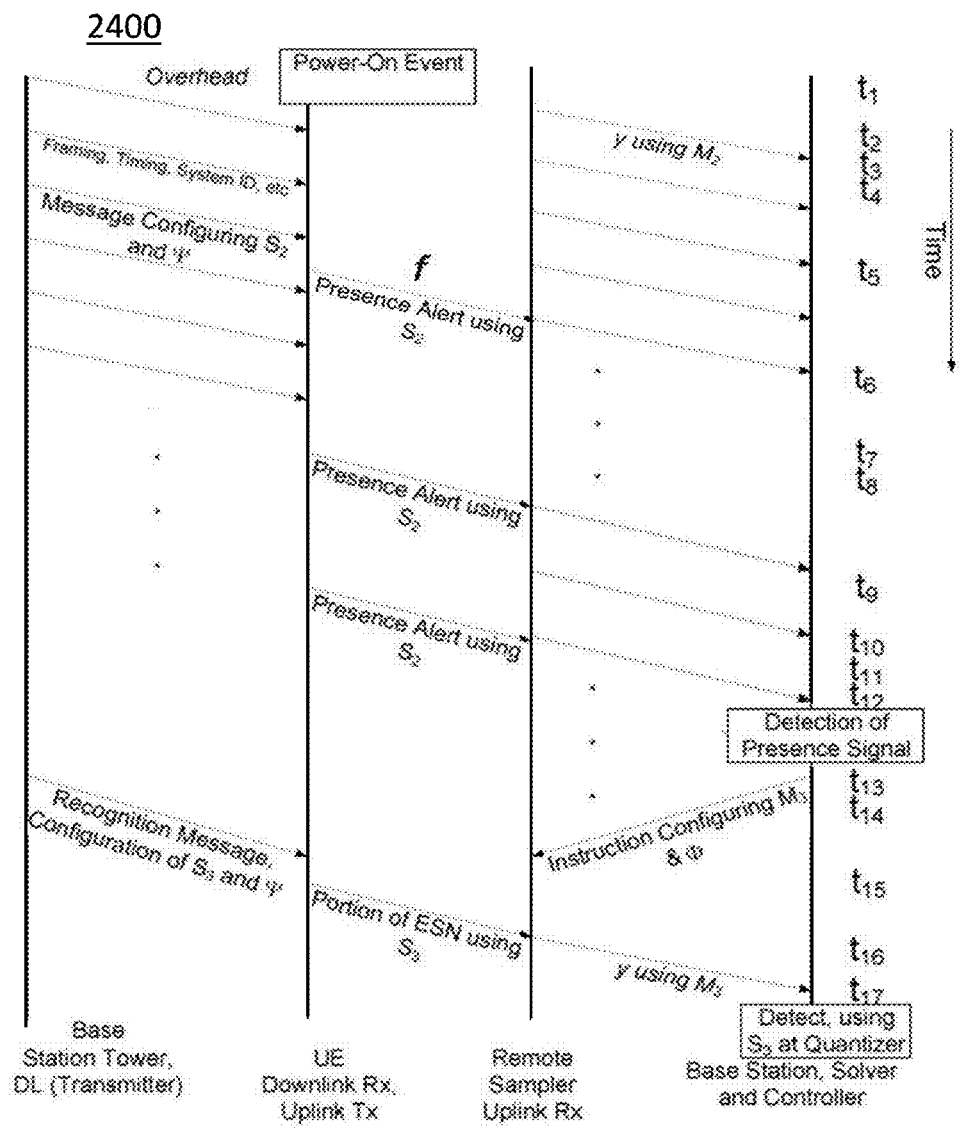
FIG. 24 illustrates an exemplary scenario for Presence, Overhead, Instruction and Sensing in accordance with an embodiment.

FIG. 24 illustrates one exemplary embodiment of an access method or scenario 2400 in a sensor-based wireless communication system using compressive sampling. This exemplary scenario involves various operations, such as for example Presence, Overhead, Instruction and Sensing. Various illustrative structures are shown in the lower portion of FIG. 24 to facilitate understanding of this access method. Further, FIG. 24 illustrates base station twice but should be interpreted as one and the same base station. Accordingly, in this example, the access method includes communication amongst base station (BS), user equipment (UE), remote sampler (RS) or any combination thereof. UE can have, for instance, a power-on event and begin observing overhead messages sent from BS. A person of ordinary skill in the art will recognize that a base station can communicate with a user equipment using, for instance, broadcast communication, point-to-multipoint communication, point-to-point communication or other communication methods or combination of communication methods. Overhead messages may contain system parameters including, for instance, the length of message frames, the value of M associated with the number of sensing waveforms ("$\phi_j$") and the sparseness S of the uplink signals ("f") being sent.

In FIG. 24, BS may send, for instance, an overhead message to configure UE to use sparseness $S_i$ and sparse representation matrix ("$\Psi$"). UE may then send, for instance, presence signals using sparseness $S_i$. In another embodiment, UE may send presence signals using $S_i$, when it determines that it is approaching BS (or a new communication region). In this situation, UE may determine that it is approaching BS (or a new communication region) via, for instance, overhead messages sent by BS, another BS or both.

In FIG. 24, BS may also send, for instance, an overhead message containing system information such as framing, timing, system identification, system clock, other system information or combination of information. In addition, BS may instruct RS to use, for instance, M ("φj") of sensing matrix ("Φ"). RS may then continuously process received uplink signals ("f") and send sensed signals ("y") using M sensing waveforms ("φ$_j$") of sensing matrix ("Φ") to BS.

As discussed, FIG. 24 is illustrative of an exemplary situation where the UE sending Presence signals. In this example, the UE powers on, observes overhead signals, and begins to send Presence Alert signals. The term "Presence Signal" includes any signal which is sent by the UE to the base station which can be incoherently sampled by sense waveforms. "Sense waveforms" includes a column from the sensing matrix, Φ, which is correlated with a frame of the input to obtain a correlation value. The correlation value is called y, where i is the column of Φ used in the correlation. In general, the UE may use Presence Alert signals whenever it determines, through overhead information, that it is approaching a cell which is not currently aware of the UE. For example, the UE may be traveling into a new communication region that may require the use of new communication parameters, such as a pilot, transmission waveforms, etc. The remote sampler sends sense measurements, y, continuously unless M=0.

Sense parameters are the parameters which characterize the variables in the expression. An Overhead is sent continuously. The Presence Alert signal is sent with the expectation that it will be acknowledged. The UE and base station exchange messages in this way: UL (uplink) is UE to remote sampler. The remote sampler continuously senses, without detecting, and sends sense measurements y to the base station over a communication pathway, e.g., a fiber optic line. The DL (downlink) is the base station tower to UE, for instance the message instructing UEs to use sparsity $S_2$ when sending a Presence signal. A sparse signal includes an N-chip waveform which can be created by summing S columns from an N×N matrix. An important characteristic of this signal is the value of S, "sparsity". For nontrivial signals, S ranges from 1 to N. An instruction changing the value of M used by the remote sampler is shown. An indication is a way of messaging to a UE or instructing a remote sampler as the particular value of a particular variable to be used. The Figure is not intended to show exactly how many messages are sent.

The UE also has access to the system clock via overhead transmissions from the base station on the downlink (DL). The remote sampler observes a bandwidth of radio energy, B, centered at some frequency $f_c$. Generally, it does not treat B as the only information it has, so it does provide samples at rate 2B over the fiber to the base station. Rather, the sampler obtains N samples of the N chip waveform, and computes M correlations. The resulting M values are sent over the fiber to the base station. If the sampler does not have chip timing lock, it can acquire 2N samples at half-chip timing and compute 2M correlations. The reduction in samples sent to the base station is from 2N for a conventional approach to 2M.

The sampler is able to compute sensing measurements, y, by correlating with independently selected columns of the Φ matrix. Sensing parameters are the parameters which characterize the variables in the correlation of the received signal g with columns of the Φ matrix. These parameters include the number of elements in y, i.e. M, the values of the elements of Φ and the number of chip samples represented by g, i.e., N. Selection of the columns of the Φ matrix which are used is without any knowledge of x except selection of the value of M itself relies on an estimate of S. So, which columns of Φ are used is independent of Ψ, but the number of columns of Φ used is dependent on an estimate of a property of f. Or, the sparsity of f can be controlled by DL transmissions as shown at time t17 in FIG. 24.

A necessary condition for successful detection of x at the base station, is that the value of M used by the remote sampler must be chosen greater than S. The lack of knowledge of S can be overcome by guessing at the base station, and adjusting thereafter. For instance, M may start out with a maximum value of N, and as the base station learns the activity level of the band B, M can be gear shifted to a lower, but still sufficiently high, value. In this way, power consumption at the remote sampler, both in computing correlations, y, and in transmissions to the base station on the fiber, can be kept low. The base station might periodically boost M (via instruction to the remote sampler) to thoroughly evaluate the sparsity of signals in the band B. The base station can direct the sampler as to which columns it should use, or the sampler may select the columns according to a schedule, or the sampler may select the columns randomly and inform the base station as to its selections.

Detection includes operating on an estimated value to obtain a nearest point in a constellation of finite size. A constellation includes a set of points. For example, if each point in the constellation is uniquely associated with a vector containing N entries, and each entry can only take on the values 0 or 1 (in general, the vector entries may be booleans, or reals, or complex) then the constellation has 2N or fewer points in it.

The UE, upon powering on or other event, wishes to let the system know of its existence. To do this, the UE sends a Presence Alert signal. The Presence Alert signal is an informative signal constructed by selecting columns out of the Ψ matrix and summing them. The selection of columns can be influenced by the base station overhead signal. For instance, the base station may specify a subset of ψ columns which are to be selected from.

The base station can require, via a DL overhead message, that a UE which has not yet been recognized, to transmit one particular column, say $\phi_0$. This would act as a pilot. The remote sampler would operate, according to Incoherent Sampling, and send samples y to the base station. The base station 2216 would then process this signal and detect the presence of $\phi_0$, estimate the complex fading channel gain, α, between the previously-unrecognized UE and the remote sampler, and then instruct any UEs which had been sending $\phi_0$ to commence sending the last two bits of their ESN (Electronic Serial Number, a globally unique mobile station identifier), for example. "Sampling" includes changing a signal from one which has values at every instant of time to a discrete sequence which corresponds to the input at discrete points in time (periodic or aperiodic).

If a collision occurs between transmissions from two different mobile stations the uplink (UL), standard Aloha random back-off techniques may be used to separate subsequent UL attempts.

The remote sampler is unaware of this protocol progress, and simply keeps sensing with columns from Φ and sending the samples y to the base station. The base station may instruct the remote sampler to use a particular quantity, M, of sensing columns. This quantity may vary as the base station anticipates more or less information flow from the UEs. If the base station anticipates that S, which has a maximum of N, is increasing, it will instruct the remote sampler to increase M (the maximum value M can take on is N). For example, in FIG. 24, the Recognition Message can include a new value of S, $S_3$, to be used by the UE, and at the same time the base station can configure the remote sampler to use a higher value of M, called $M_3$ as shown in FIG. 24. In the figure these events occur at times $t_{13}$, $t_{15}$ and $t_{16}$. At $t_{17}$ the base station expects a message with sparsity $S_3$ and that that message has probably been sensed with an adequate value of M, in particular the value called here $M_3$. A sequence of events is illustrated, but the timing is not meant to be precise. In the limit as M is increased, if Φ is deterministic (for example, sinusoidal) and complex, when M takes on the limiting value N, Φ in the remote sampler has become a DFT operation (Discrete Fourier Transform possibly implemented as an FFT). Continuing with the scenario description, once the base station has a portion of the ESNs of all the UEs trying to access the system, the base station can tell a particular UE, with a particular partial ESN, to go ahead and transmit its full ESN and request resources if it wishes. Or the base station may assign resources, after determining that the UE is eligible to be on this system.

For example, once the above steps are done, the base station can command the UE to use a certain pilot as the UE moves from one pilot region or zone to another. The base station uses the observed signals and the knowledge of the assigned pilots to estimate the overall channel matrix, H, when detecting wireless transmission from multiple UEs.

The Remote Sampler/Central Brain system conducts information signaling in a noisy environment and with almost no intelligent activity at the remote sampler. The system has the benefit of feedback via a conventional DL. The link budget includes design of a radio system to take account of the RF energy source and all of the losses which are incurred before a receiver attempts to recover the signal. For more details, please see [A24]. Our initial link budget calculations show that a UE may be able to operate at a transmission power of 10 to 100 μWatts at a range of 20 to 30 m if a reuse factor of 3 can be achieved and a received SNR of 0 to 10 dB can be achieved. These figures are "order of" type quantities with no significant digits. For detection of the presence signal, usually more than one sampler can receive noisy, different, versions of f and joint detection can be done. This will allow M to be lower at each sampler than if f is only visible at one remote sampler. Thus, the battery drain at each sampler is reduced by deploying the samplers in a dense fashion. For brevity, sometimes the noisy version of f is referred to as g.

"Reuse" includes how many non-overlapping deployments are made of a radio bandwidth resource before the same pattern occurs again geographically.

For a worst-case design, it is assumed that the signal from the UE only impinges on one remote sampler. In general, for indoor transmission, it is expected that two remote samplers to be within a 30 m range with a path loss exponent between 2 and 3. The design is not limited to indoor transmission. Outdoors, the range will be larger, but the path loss exponent will tend to be smaller. For successful detection, the probability of detecting a single transmission should be above 10% (presuming the error mechanism is noise-induced and therefore detection attempts will be independent). The remote sampler can be deployed in macro cells to support vehicular traffic and microcells to support pedestrian or indoor-office communication traffic.

Coming to a concrete example, then, a following exemplary scenario has been fashioned: 1. There is one or more UEs. 2. The Incoherent Sampling scheme uses a random pair (Ψ, Φ) or a deterministic pair ($\Psi_d$, $\Phi_d$), in any case the solver knows everything except the signals x, f and noise. 3. The base station has instructed the sampler to use a specific set of M columns of Φ. 4. The base station has instructed the UE and the sampler that transmission waveforms comprise or consist of N intervals or chips. 5. A pilot ($\Psi_{pilot}$, $D_i$ or $\phi_0$, etc.) may be assigned to a UE or predefined for a UE from a set of pilots on a one region-by-region (e.g., pilot zone-by-pilot zone) basis.

For example, the UE may receive a pilot assignment via DL message (e.g., an overhead message) or may select a pilot based on predefined rules, e.g., a scheduled assignment based on its own ID and time on a system clock received via overhead. It may be constrained in its pick by other overhead information. The CB knows the rule the UE uses for the pick and so knows the pilot the UE will use.

Figure 25:
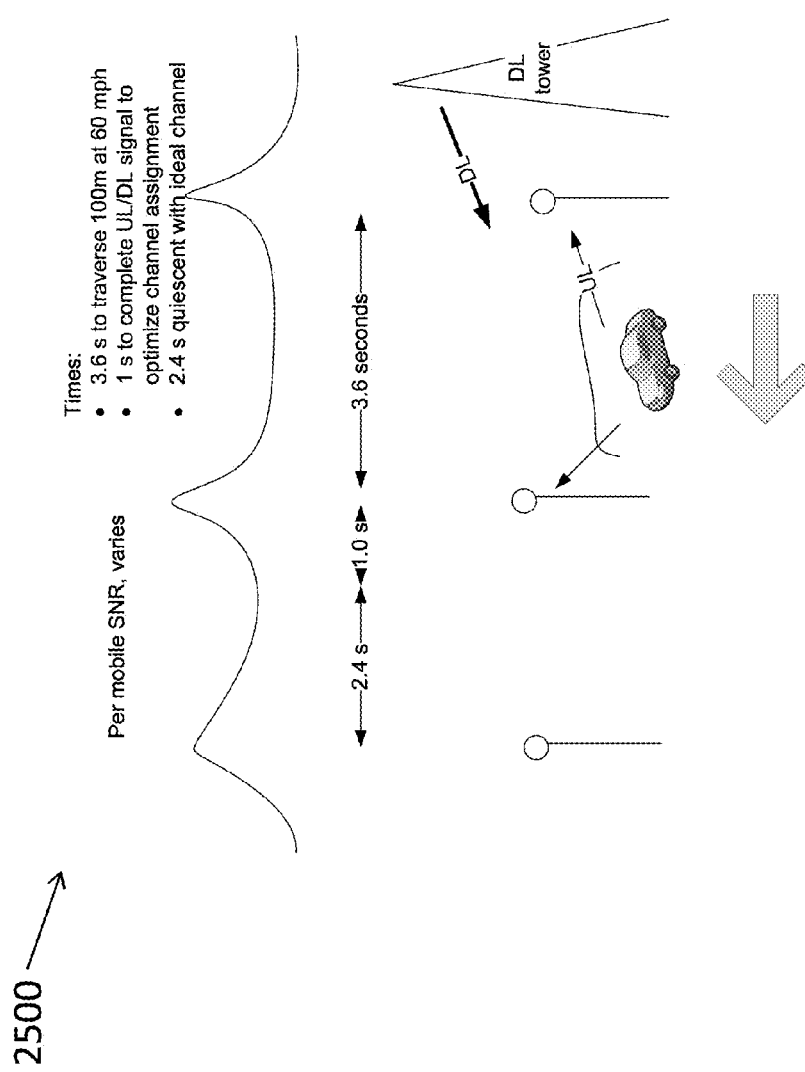
FIG. 25 illustrates an example of a traditional uplink (UL) channel optimization.

FIG. 25 illustrates an example of a traditional uplink (UL) channel optimization 2500. For example, in a traditional cellular system, each time a UE approaches a new cell site, signalling is performed to update the channel or channels the UE should use in accessing the system. This is true in both TDMA and CDMA. Applying that solution to the architecture of FIGS. 1A, 1B and 1C, a UE travelling at 60 mph will pass from being near one remote sampler to being near a second remote sampler in a time span of about 3.6 s (in this example, with 100 m between remote samplers). For purposes of discussion, if it is assumed that the total signalling activity interval lasts for 1.0 s, then there is a 2.4 s stable period measured from when signalling completes, until signalling to update the radio access address begins again. Some communication can still take place during this 1.0 s, generally. As the UE moves faster, this stable period of 2.4 s will decrease, until it reaches a point where the UE is simply constantly signalling about the observed channel and getting a new channel assignment, with no stable period (see the blue curve for tradition channel assignment in FIG. 27). In the traditional solution, there are three transmission activities: 1. pilot transmission. 2. control signal transmission for handoff. 3. payload data transmission.

As shown by FIG. 25, there is a new problem: Signalling Delay. Because the time needed for signalling does not decrease with UE speed, the signalling interval delay causes the payload radio access address value to be fresh (as opposed to stale) for a shorter and shorter time. So, at high UE speeds with uplink receiving points spaced close together, the traditional solution is inefficient.

Figure 26:
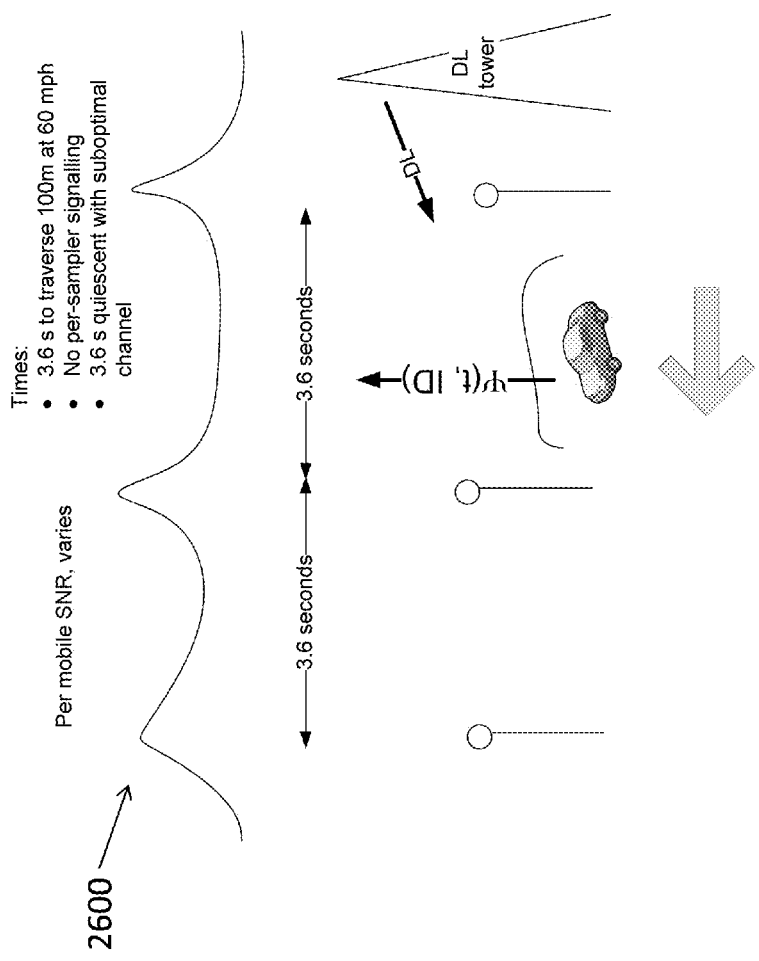
FIG. 26 illustrates an exemplary approach using access code space without signaling in accordance with an embodiment.

FIG. 26 illustrates an exemplary approach 2600 using access code space without signaling in accordance with an embodiment. In this example, Ψ is based on a time, UE ID and broadcast message. There is no per-sampler radio access channel assignment. On a less frequent basis, there may be a pilot assignment to the UE. The Central Brain (CB) tracks the UE using received pilot signals. So, the CB constantly estimates the channel between the UE and each remote sampler. There is no per se 1:1 assignment of a UE to a remote sampler. Because the UE determines the Ψ matrix to use based on global time (e.g., system CLK), its own identity and possibly a broadcast message to UEs in a certain downlink sector, there may be more correlation between Ψ1 and Ψ2 than there would be in a traditional assignment. Correlation between Ψ matrices leads (which we call "the collision event") to unhelpful correlation which makes correct detection of the data from each UE to statistically decrease. Therefore, for low speeds, using the traditional assignment can lead to better throughput. However, the collision event does not bar communication, and quite useful rates are still obtained despite collisions (see FIGS. 23 and 32). Therefore at high speeds, the Ψ-schedule approach will lead to better throughput.

Figure 27:
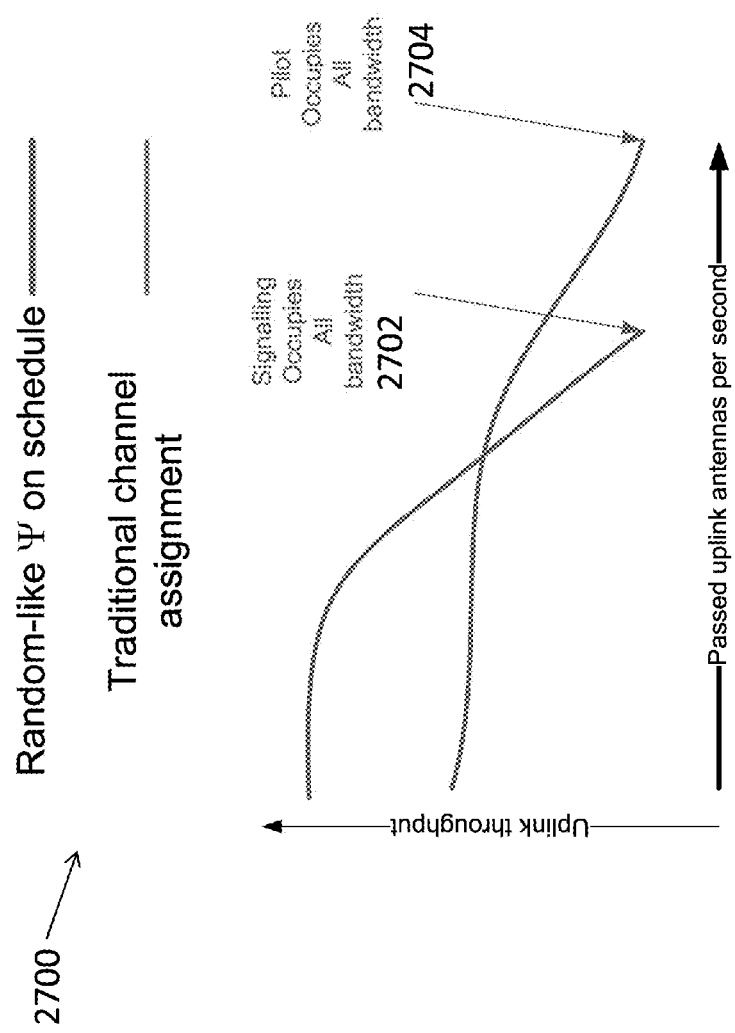
FIG. 27 illustrates a graph of an exemplary qualitative resulting performance for a traditional channel assignment and Ψ-schedule in accordance with an embodiment.

FIG. 27 illustrates a graph 2700 of an exemplary qualitative resulting performance for a traditional channel assignment and Ψ-schedule in accordance with an embodiment. In this alternative embodiment, the network senses the mobile speed based on the pilots and uses the blue curve algorithm ("traditional assignment") 2702 for slowly moving UEs, and the green curve algorithm ("Ψ-schedule") 2704 for UEs traveling above the speed where the curves cross. So, the realized performance will be approximated by taking the higher of the two curves at each UE rate of travel.

Figure 28:
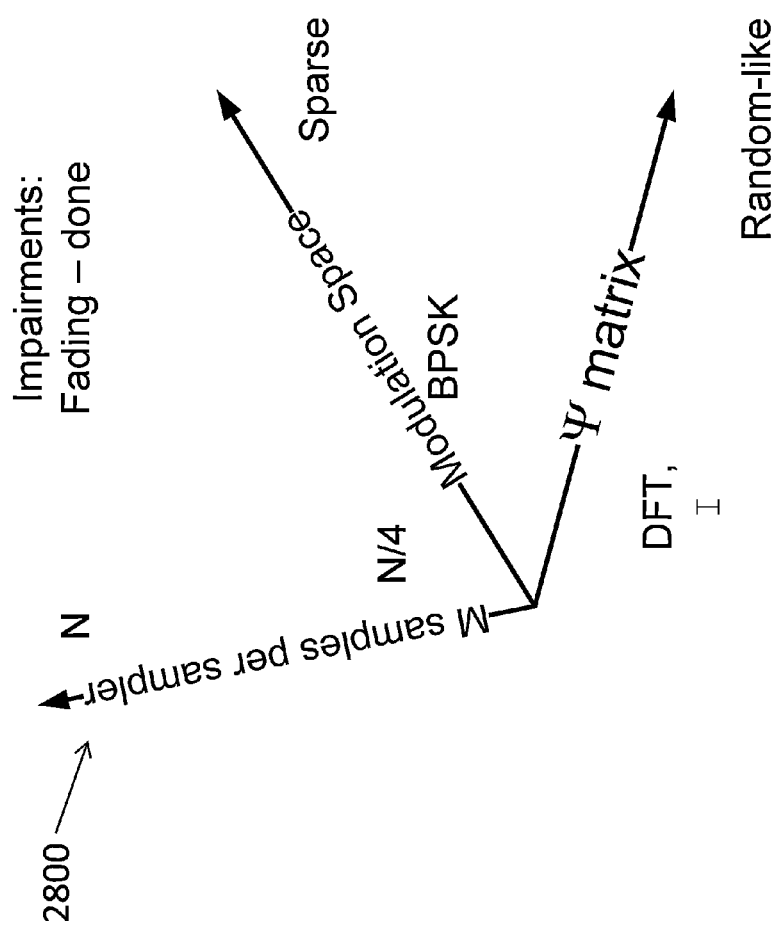
FIG. 28 illustrates an exemplary design space in accordance with an embodiment.

FIG. 28 illustrates an exemplary design space 2800 in accordance with an embodiment. As shown in this example, In optimizing the throughput for UEs, for example, in the system of FIG. 3, the CB can command the UEs and the remote samplers to different points in the design space.

Figure 29:
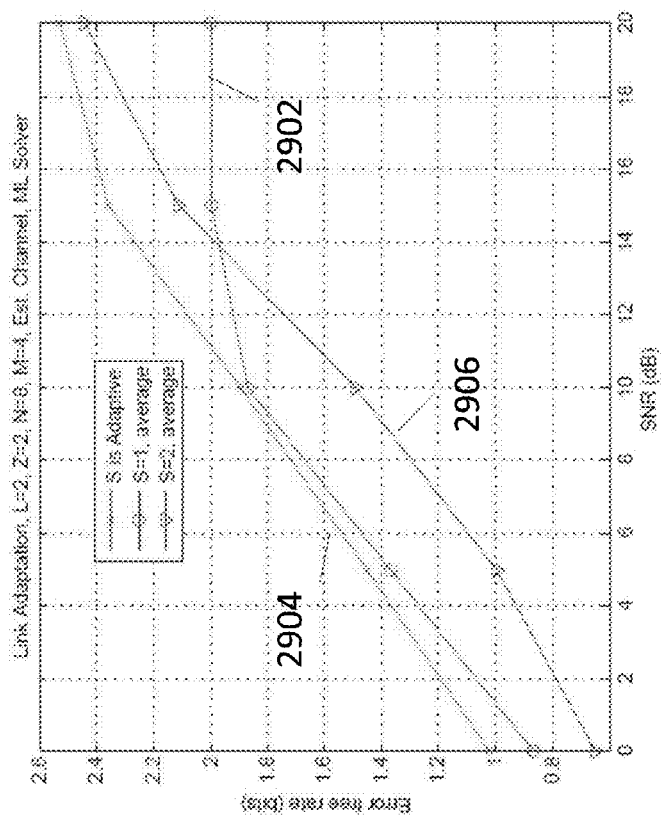
FIG. 29 illustrates an exemplary graph of Error free rate versus SNR for different sparsities S in accordance with an embodiment.

FIG. 29 illustrates an exemplary graph 2900 of Error free rate versus SNR for different sparsities S in accordance with an embodiment. In this example, the number of bits received without error is plotted on the ordinate. For the blue curve (2902), a sparsity of S=1 is used. For the gray curve (2906) a sparsity of S=2 is used. At low SNR (signal-to-noise ratio), greater throughput is achieved with S=1. If the CB examines the channel at each word transmission and commands the UE as to which value of S to use accordingly, the red curve (2904) can be achieved.

Figure 30:
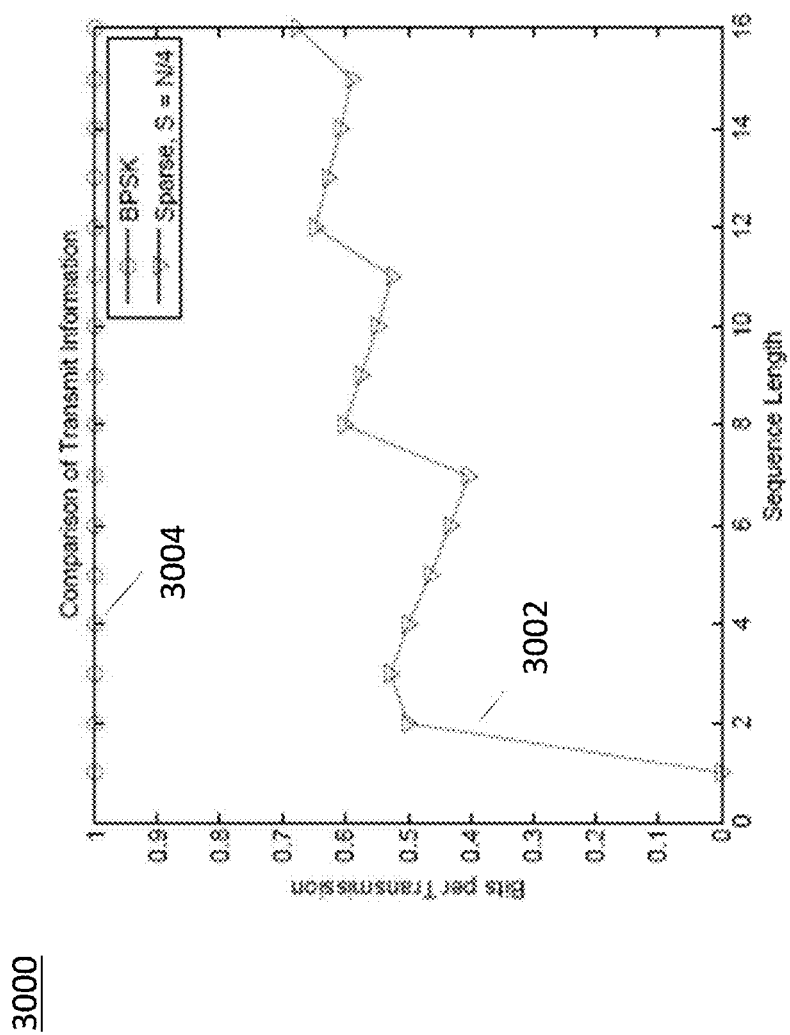
FIG. 30 illustrates an exemplary graph for comparison of transmit information in accordance with an embodiment.

FIG. 30 illustrates an exemplary graph 3000 for comparison of transmit information in accordance with an embodiment. As shown in FIG. 30, the bits per use improves with sequence length. The black curve 3002 is a plot of (1/N) log 2((N choose S)) for a value of S=N/4. The blue curve 3004 is a plot of (1/N)*N. The abscissa is N. As N increases, sparse transmission is about 70% as spectrally efficient as BPSK for N=16. The tendency of the sparse transmission is to approach that of BPSK as N increases.

Figure 31:
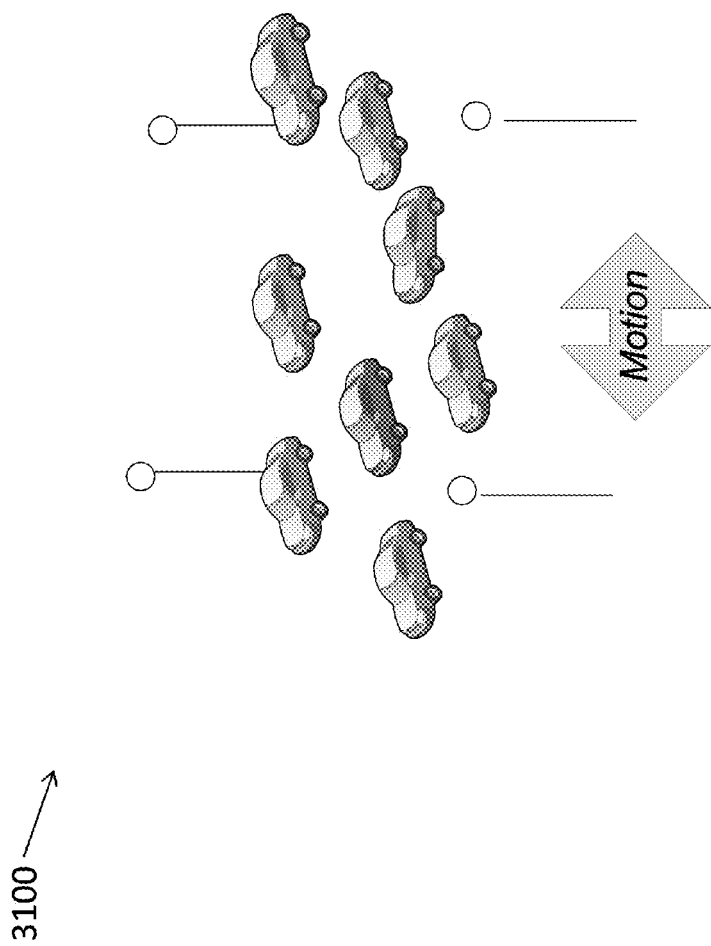
FIG. 31 illustrates a payload example in accordance with an embodiment.
Figure 32:
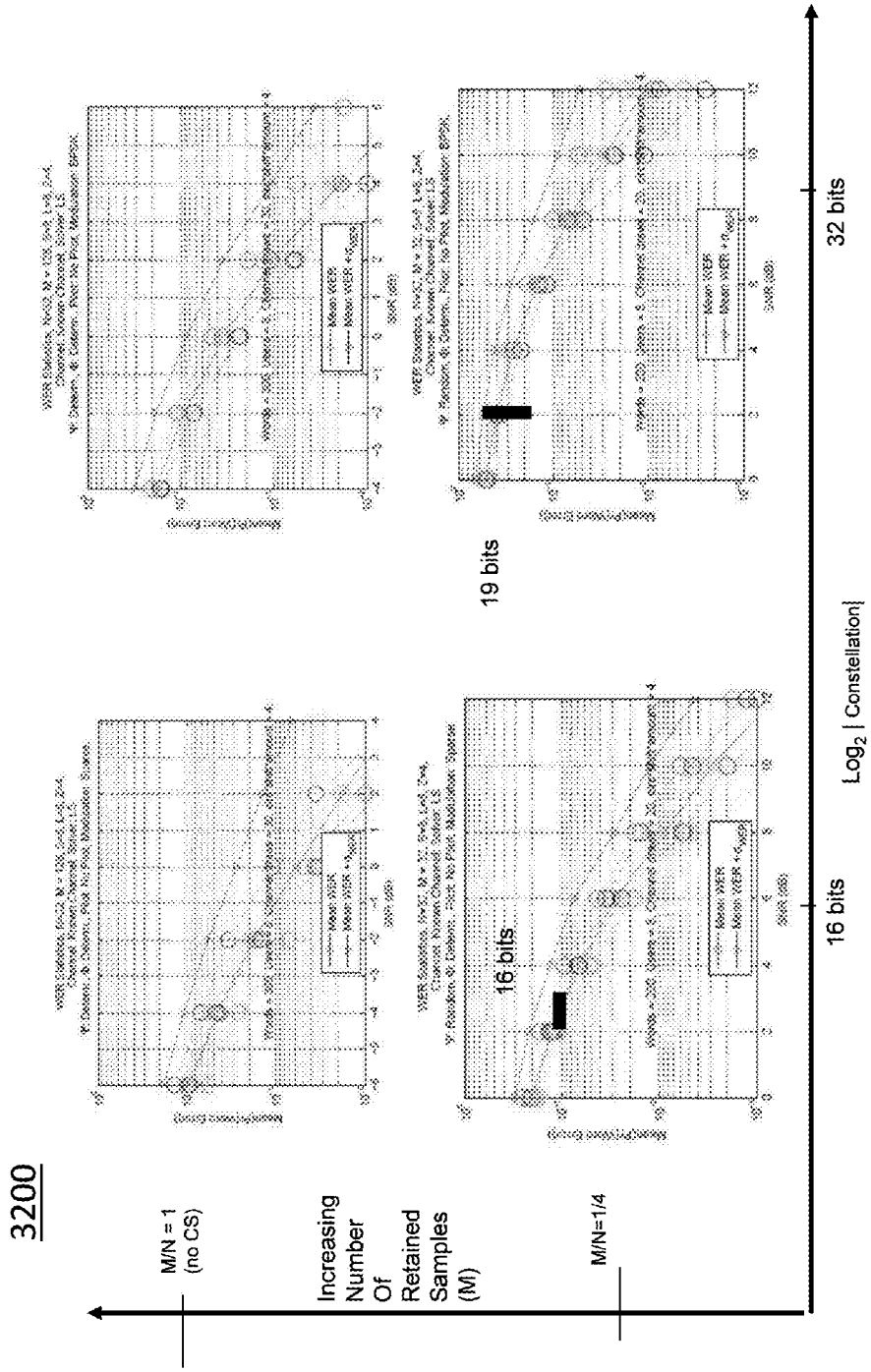
FIG. 32 illustrates a payload example performance of FIG. 31 in accordance with an embodiment.

FIG. 31 illustrates a payload example 3100 in accordance with an embodiment. In this exemplary scenario, 8 UEs (cars) communicate with the CB on the Uplink (UL) via 4 remote samplers (sticks with dots). The pathloss is the same from all UEs to all remote samplers. The channel is AWGN (Additive White Gaussian Noise) in this example. The samplers and UEs operate at various points in the design space of FIG. 28 and the corresponding performance is shown in FIG. 32 (discussed below). Fading channel performance for a multi-UE multi-sampler system is addressed elsewhere.

FIG. 32 illustrates a payload example performance 3200 of FIG. 31 in accordance with an embodiment. In this example, a number of samples can be determined by a resolution desired at an output, e.g., a number bits, such as 16-bits when the sum of transmit entropies is 16 bits or 19 bits when the sum of entropies is 32-bits (discussed in terms of the effect of SNR on WER below). As a generalization of the results shown in FIG. 32, for a signal with S sparse components, M<S samples is able to approach recovery of the largest M components in the absence of noise. For M>S, all signal components can be recovered in the absence of noise. The resolution can thus be incrementally improved.

As shown in FIG. 32, the lower left and lower right plots are for the case where the remote sampler sends M=N/4=8 samples to the CB as to each word transmission. There is Z=4 remote samplers in the system (see FIG. 31). Comparing the lower left curve (sparse transmission with S=8 and N=32) with the lower right curve (N=32 and every element of x is from {−1,1} (i.e., BPSK)), the throughput is similar. The lower left curve reaches a WER (Word Error Rate) of 0.1 at between 2 and 4 dB on the average for the L=8 users simulated. The lower right curve reaches a WER of 0.4 at about the same range and so the number of correct words is about 0.6 or 0.6*32 is approximately 19 correct bits per transmission. These are estimates. An appropriate coding scheme needs to be applied to approach these throughput values. The upper left and upper right plots are for performance with the remote sampler sends M=N samples to the CB.

Detection/Solver Method

As discussed above, an exemplary communication system may employ compressive sensing or sampling techniques at various network nodes to sample wireless transmissions from one or more UEs. One exemplary Compressive Sensing approach uses properties of signal sparsity and basis incoherence to reconstruct transmitted data after being sampled below the Nyquist Rate. By using these properties, it is possible to exactly reconstruct a given signal with high probability. However, the presence of noise may decrease a likelihood that a reconstructed signal is equivalent to the original transmitted signal. For example, a signal transmission may pick up some additive noise elements. Further, when there is more than one signal being transmitted, signals may interfere with each other, i.e., signal interference, and contribute to an error in signal reconstruction. It is desirable to reduce the effects of additive noise as well as signal interference.

As explained below, there are various ways to choose or select incoherent bases to minimize or reduce the effects of additive noise. Provided below is a discussion of two distinct matrix operations to minimize signal interference: matrix multiplication and a multi-UE matrix. Further, to reconstruct signals, the communication system may employ a solver(s) that utilizes an $L_1$ (simplex) approach or $L_2$ approach (e.g., Minimum Mean Squared Error (MMSE), Zero-Forcing (ZF), Maximum Likelihood (ML) if the channel(s) is known, etc.) or a combination thereof.

1. Introduction 1.1 Compressive Sampling

An overview of an exemplary Compressive Sampling approach is described below. For example, given an S-sparse signal, x, we recast this signal using a suitable basis, $\Psi$. This transformation amounts to a matrix multiplication from the left; given an N-dimensional column vector, x, we multiply on the left by an N×N change of basis matrix, $\Psi$.

$$f = \Psi x$$

This new signal, f, is essentially an N-dimensional vector representation of x in the basis, $\Psi$. This new signal, f is sampled using a new basis that is incoherent with $\Psi$, $\Phi$. Because of the incoherence of the two bases, it is possible to use $\Phi$ to sample f at a rate M<<N. In terms of matrix operations, the new signal f is multiplied from the left by an M×N matrix, $\Phi$, with M<<N.

$$y = \Phi \Psi x$$

The signal y is now an M-dimensional vector representation of x after being transformed by matrices $\Psi$ and $\Phi$ respectively. There are methods to find a sparsest approximation of x, e.g., $\tilde{x}$. (See e.g., [B7], [B8]) One method solves the $l_0$-minimization problem to resolve $\tilde{x}00$ from knowledge of only $\Psi$, $\Phi$ and y.

$$\min \|\tilde{x}\|_0 \text{ subject to } \Phi\Psi\tilde{x}=y \quad (1)$$

This method reconstructs x exactly. This $l_0$-minimization problem is computationally intensive. However, under certain conditions equation (1) can be recast to the following $l_1$-minimization problem:

$$\min \|\tilde{x}\|_1 \text{ subject to } \Phi\Psi\tilde{x}=y \quad (2)$$

(See e.g., [B3], [B2], [B1], [B9])

Thus, solving equation (2) also solves equation (1) and yields exact recovery of the signal x using a number of measurements, M, significantly less than the Nyquist Rate. The actual number of necessary measurements, M, is based on (i)

a sparsity S of a signal, (ii) a length N of a signal and (iii) the incoherence of our two bases, $\mu(\Phi, \Psi)$.

$$M_{min} \geq C_M \mu^2(\Phi,\Psi) S \log N \quad (3)$$

where $C_M$ is a small constant.

(See e.g., [B5]) If a number of measurements is $M > M_{min}$, then the exact recovery of the original signal x is guaranteed; however, using a number of measurements $M < M_{min}$ does not guarantee exact signal reconstruction.

In the presence of noise, it may not be possible to recover the signal x exactly with equation (2). The equation (2) may incorporate a constraint base on the magnitude of the noise present in the signal. (See e.g., Theorem 1 in [B3]) The resulting equation is:

$$y = \Phi\Psi x + e \quad (4)$$

where the term x is a S-sparse signal, the term y is a signal received by the solver, and the term e represents some noise.

Thus a signal $\tilde{x}$ is reconstructed by solving the problem:

$$\min\|\tilde{x}\|_1 \text{ subject to } \|\Phi\Psi\tilde{x} - y\|_2 \leq \epsilon \quad (5)$$

This reconstructed signal, $\tilde{x}$, will obey the following relationship:

$$\|\tilde{x} - x\|_2 \leq C_S \epsilon \quad (6)$$

where $C_S$ is some known constant (referred herein as "the Candes Noise Coefficient"), and $\epsilon$ is the maximum value attained by the noise in which $\epsilon \leq \|e\|_2$. Thus, increasing the noise e decreases a likelihood of exact signal reconstruction. It is desirable to minimize or reduce the effects of noise on signal reconstruction.

1.2 Remote Sampler Architecture

Figure 33:
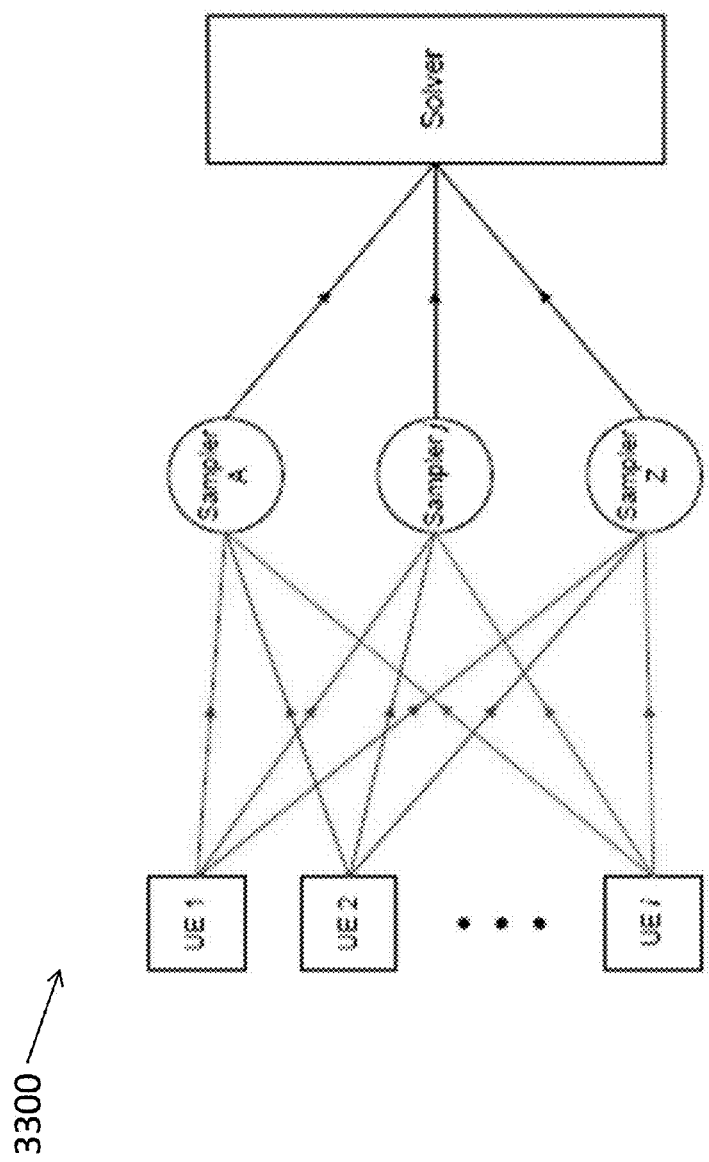
FIG. 33 illustrates an exemplary Multiple UE-Multiple Remote Sampler Architecture in accordance with an embodiment.

As previously described above with reference to FIGS. 1-3, an exemplary sensor-based system may have several UEs and remote samplers that are connected to a central solver, such as a Central Brain (CB). In an exemplary method, using compressive sensing techniques, each UE encodes an S-sparse signal $x_i$ as an N-dimensional vector using its respective N×N $\Psi_i$ matrix. It then transmits this encoded signal to each available remote sampler, as shown in FIG. 33. This transmission may introduce a fading coefficient, $\hat{\alpha}_i$ as the signal moves along the channel to each remote sampler. The remote sampler receives these encoded signals from each UE concurrently. The signal received at a $j^{th}$ remote sampler is in the form:

$$f_j = \Sigma_i \hat{\alpha}_i \Psi_i x_i \quad (7)$$

Thermal noise is added to the signal at the sampler. Each remote sampler will then sample this total signal using its respective M×N $\Phi_j$ matrix, transforming the signal into an M-dimensional vector, before passing a final signal to the solver. The signal received at the solver from the $j^{th}$ remote sampler is of the form:

$$y_j = \Phi_j(\Sigma_i \alpha_i \Psi_i x_i + n_j) \quad (8)$$

The final signal, $y_j$, is received by the solver shown in FIG. 33.

$$y_j = \Phi_j(\Sigma_i \Psi_i x_i) + \Phi_j n_j \quad (9)$$

As discussed above, the terms h and α are used interchangeably. FIG. 33 illustrates an example of this system with multiple UEs and multiple remote samplers. Thus, one problem is to use compressive sampling methods to exactly reconstruct the $i^{th}$ original signal $x_i$, using the received signal $y_i$, the matrices $\Psi_i$ and $\Phi_j$, and the signal sparsity S.

2. White Noise

This subsection will discuss a Restricted Isometry Property and how to utilize this property to choose $\Psi$-$\Phi$ pairs which will minimize or reduce the effects of additive noise. For example, in order to reduce error in signal reconstruction, a magnitude of the noise should be reduced. One way to do this is to select $\Psi$-$\Phi$ matrices which minimize (or reduces) the Candes Noise Coefficient, $C_S$. Minimizing this constant should minimize the effects of random noise on signal reconstruction.

In order to solve compressive sensing problems, the solutions of equations (1) of and (2), i.e., the $l_0$-minimization problem and the $l_1$-minimization problem respectively, preferably are the same. For reference, some terminology used in [B10] is used, and the following is defined:

Definition 2.1.

Let the set of all S-sparse, N-dimensional vectors be denoted as $X_N(S) = \{x \in R^N : \|x\|_0\}$. Given the two minimization problems:

$$\min\|x\|_{l_0} \text{ subject to } \Phi\Psi x = y \quad (10)$$

$$\min\|x\|_{l_1} \text{ subject to } \Phi\Psi x = y \quad (11)$$

Any point $x \in X_N(S)$ for which solving equation (10) also solves equation (11) is referred to as a point of $l_1$-$l_0$ equivalence.

In one exemplary approach suitable for use with compressive sensing programs, every $x \in X_N(S)$ is a point of $l_1$-$l_0$ equivalence. By taking advantage of a property of the matrix, $A = \Phi\Psi$, known as the Restricted Isometry Property, it is possible to guarantee that every point is $l_1$-$l_0$ equivalent. (See e.g., [B10], [B6], [B2], [B3], [B1], [B4], [B11])

Definition 2.2.

Let A be an M×N matrix with M<<N. The S-Restricted Isometry Constant (SRIC) $\delta_S$ is the smallest number such that:

$$(1-\delta_S)\|x\|_2^2 \leq \|Ax\|_2^2 \leq (1+\delta_S)\|x\|_2^2 \quad (12)$$

for every vector $x \in X_N(S) := x \in R^N : \|x\|_0 \leq S$.

If x is imagined as an N-dimensional vector, then the SRIC measures how much x is stretched when it is transformed into a new M-dimensional vector, Ax. (See equation (2)) When treating the set of all vectors with S or less non-zero elements, $\delta_S$ is the largest amount any one vector, $x \in X_N(S)$, is stretched by A.

In terms of Set Theory, for each vector, $x_i \in X_N(S)$, there exists a $\delta_i$ that defines a least element for the set of solutions to the inequality in equation (12). The set of these non-zero elements $\delta_i$'s forms a set of lower bounds, $\Delta$. $\delta_S$ is the greatest element of this new set, $\Delta$. In essence, $\delta_S$ is the supremum of the set of infimums defined by equation (12). (See equation (3)).

Corrollary 1.

Let $x_i \in X_N(S) := x \in R^N : vx\|_0 \leq S$. $\forall x_i \exists \delta_i$ such that:

$$(1-\delta_i)\|x_i\|_2^2 \leq \|Ax_i\|_2^2 \leq (1+\delta_i)\|x_i\|_2^2 \quad (13)$$

Let $\Delta$ be the set of all $\delta_i$'s. Then the S-Restricted Isometry Constant, $\delta_S = \sup(\Delta)$.

Figure 34:
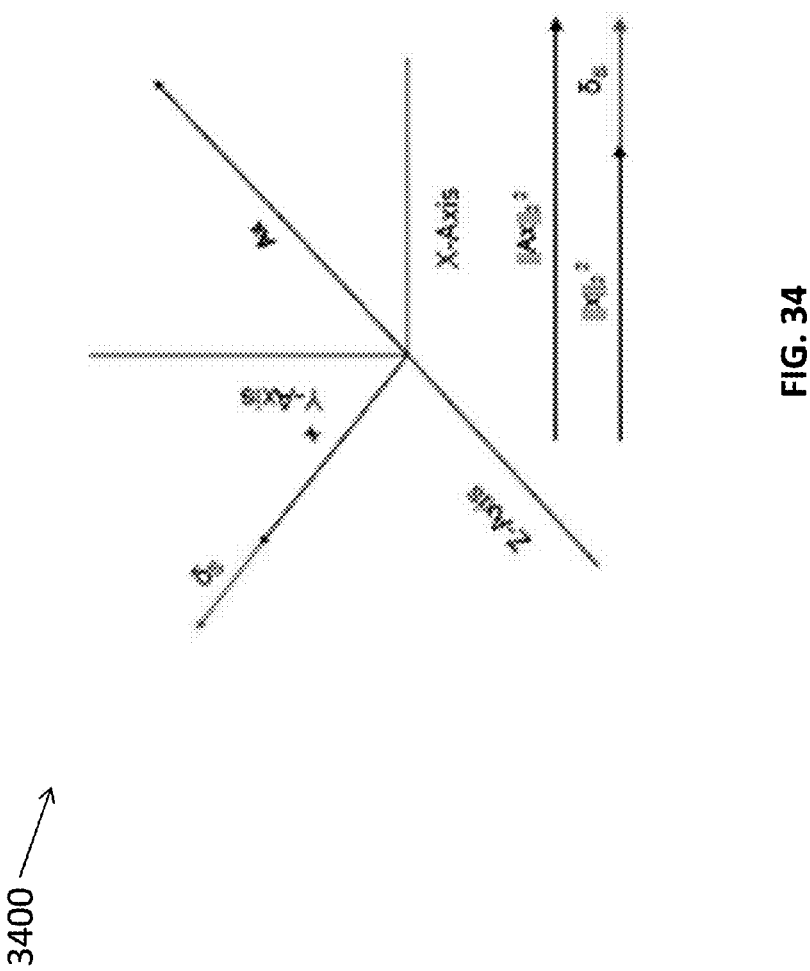
FIG. 34 illustrates a vector x stretched or compressed by an amount $\delta_S$ when transformed to Ax in accordance with an embodiment.
Figure 35:
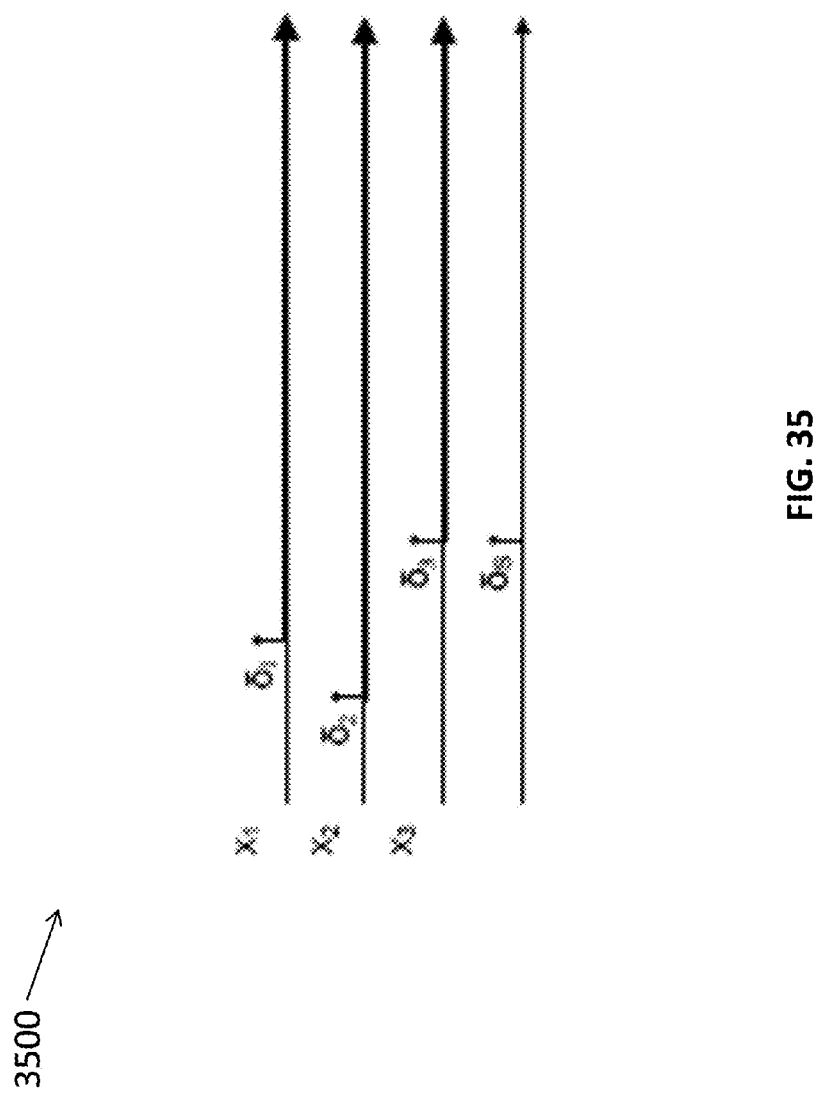
FIG. 35 illustrates individual $\delta_S$ providing lower bounds for solutions to equation (12) for $x_t \in X_N(S)$ in accordance with an embodiment.

FIG. 34 illustrates vector x being stretched or compressed by an amount $\delta_S$ when transformed to Ax. FIG. 35 illustrates an individual $\delta_S$ to provide lower bounds for solutions to equation (12) for each $x \in X_N(S)$. The greatest of these lower bounds is $\delta_S$.

In order for each point x to be point of $l_1$-$l_0$ equivalence, constraints are placed on the SRIC. According to Theorem 1.4 in [B1]:

$$\delta_S + \delta_{2S} + \delta_{3S} + < 1 \quad (14)$$

According to Theorem 1 in [B3]:

$$\delta_{3S}+\delta_{4S}<2 \qquad (15)$$

According to Theorem 2.2 in [B6]:
For an integer k≤2

$$\delta_{kS}+k\delta_{(k+1)S}<k-1 \qquad (16)$$

Each of these constraints is sufficient to guarantee $l_1$–$l_0$ equivalence for all $x \in X_N(S)$.

In order to calculate the SRIC, $\delta_S$, equation (12) is evaluated for each vector x with sparsity less than or equal to S. The first step is to derive a more tractable version of the inequality in equation (12).

$$(1-\delta_S)\|x\|_2^2 \le \|Ax\|_2^2 \le (1+\delta_S)\|x\|_2^2 \qquad (17)$$

$$(1-\delta_S) \le \frac{\|Ax\|_2^2}{\|x\|_2^2} \le (1+\delta_S)$$

$$-\delta_S \le \frac{\|Ax\|_2^2}{\|x\|_2^2} - 1 \le \delta_S$$

$$\delta_S \ge \left|\frac{\|Ax\|_2^2}{\|x\|_2^2} - 1\right|$$

In order to calculate $\delta_S$, the Set Theory interpretation is used, recalling that $\delta_S$ is the supremum of the set of lower bounds defined by equation (17) for each relevant $x_i \in X_N(S)$. The lower bound to equation (17) is solved using the equality constraint.

$$\delta_i \ge \left|\frac{\|Ax_i\|_2^2}{\|x_i\|_2^2} - 1\right| \qquad (18)$$

Using equation (18), a particular $x_i \in X_N(S)$ is selected and equation (18) is solved for $\delta_i$. Next, an $x_j \in X_N(S)$ is selected and equation (18) is solved again for $\delta_j$. A comparison is made between $\delta_i$ to $\delta_j$, and the lower one is discarded. This process is then repeated, using a new element of $X_N(S)$, and this new $\delta$ value is compared to the retained $\delta$. With a sufficient number of repetitions, it is possible with a high probability to accurately calculate $\delta_S$, the S-Restricted Isometry Constant. The accuracy of the results should be proportional to the number of iterations.

With a means of calculating the SRIC, it is possible to ensure that Ψ-Φ matrix pairs are $l_1$–$l_0$ equivalent for all $x \in X_N(S)$. The SRIC also can be used to calculate the Candes Noise Coefficient, $C_S$, and to minimize the effects of noise on signal recovery.

The SRIC has a direct dependence on the signal sparsity, S. (See e.g., [B10]) Since the set of $x \in X_N(S)$ increases with increasing sparsity S, $\delta_S$ will also increase with increasing sparsity S. Essentially, as elements are added to the set $X_N(S)$ elements are added to the set Δ, thus sup(Δ) can only either increase or remain unchanged. As a consequence, $\delta_S$ also can only either increased or remain unchanged.

$$\delta_S \le \delta_S+1 \qquad (19)$$

Figure 36:
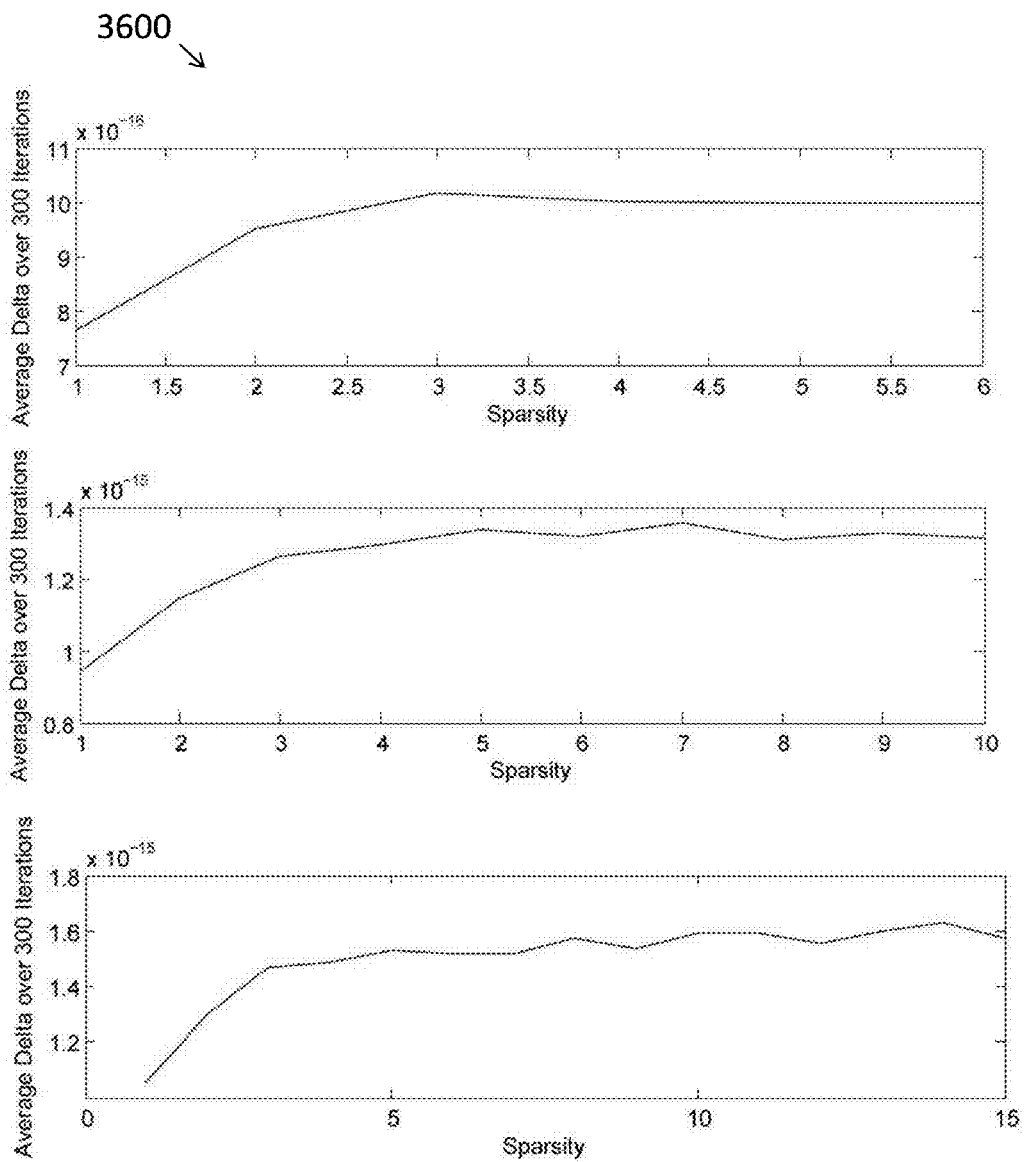
FIG. 36 illustrates $\delta_S$ for various Ψ-Φ pairs increases with sparsity, S in accordance with an embodiment.

FIG. 36 illustrates $\delta_S$ for various Ψ-Φ pairs increases with sparsity, S. As shown, an average SRIC $\delta_S$ is calculated for square matrices of varying sizes as a function of sparsity S. As S increases, $\delta_S$ is a monotonic, non-decreasing function. For reference, $\delta_S$ values are sought that are consistently low, or below average, e.g., below a trend line illustrated in FIG. 36.

As discussed above, the Candes Noise Coefficient is preferably minimized or reduced. According to [B3], the Candes Noise Coefficient, CS, is given by:

$$C_S(m) = \frac{2\sqrt{1+\frac{S}{M}}}{\left(\sqrt{1-\delta_{m+S}} - \sqrt{\frac{S}{m}(1+\delta_m)}\right)} \qquad (20)$$

with a constraint on the denominator in 20 to be positive. (See e.g., [B3]) If we choose an m to be a positive integer multiple of S such that:

$$\text{where } n \in Z, \text{ and } m=nS, \qquad (21)$$

the equation (20) is rewritten as:
where $n \in Z$ $$C_S(n) = \frac{2\sqrt{1+\frac{1}{n}}}{\left(\sqrt{1-\delta_{S(n+1)}} - \sqrt{\frac{1}{n}(1+\delta_{Sn})}\right)} \qquad (22)$$

Chartrand generalizes Candes's condition on $\delta_S$ [B10, B6] for $l_1$–$l_0$ equivalence to equation (16). Working from Chartrand's condition for $l_1$–$l_0$ equivalence:

For an integer $n \ge 2$ \qquad (23)

$$\delta_{nS} + n*\delta_{(n+1)S} < n-1$$

$$0 < n-1-\delta_{nS} - n*\delta_{(n+1)S}$$

$$0 < n(1-\delta_{(n+1)S} - (1+\delta_{nS})$$

$$0 < (1-\delta_{(n+1)S}) - \frac{1}{n}(1+\delta_{nS})$$

$$0 < \sqrt{(1-\delta_{(n+1)S}) - \frac{1}{n}(1+\delta_{nS})}$$

$$0 < \sqrt{(1-\delta_{(n+1)S})} - \sqrt{\frac{1}{n}(1+\delta_{nS})} \le \sqrt{(1-\delta_{(n+1)S}) - \frac{1}{n}(1+\delta_{nS})}$$

given $n \ge 2$

Thus, it is shown that the condition for a positive denominator in the expression for $C_S$ is a direct result of the conditions for $l_1$–$l_0$ equivalence. $C_S$ is a function of $\delta_S$, so it is clear that the effects of noise signal reconstruction are direct consequences of the selection of sampling matrices. By carefully choosing Ψ-Φ pairs, it is possible to minimize the effects of noise.

From equation (22), increasing n, increases $\delta_{M+S}$. One goal is to minimize $C_S$ with respect to n, thus minimizing the effects of our noise. Equation (20), however, contains not only $\delta_S$ but also $\delta_{M+S}$. Therefore, An expression can be created for an upper bound to the Candes Noise Coefficient. This way, there is provided an upper bound for the signal reconstruction error.

Using equation (19), an upper bound for $C_S$ can be created that contains only $\delta_{S+1}$.

$$\delta_S \leq \delta_{S+1}$$
$$\delta_{Sn} \leq \delta_{S(n+1)}$$
$$1 + \delta_{Sn} \leq 1 + \delta_{S(n+1)}$$
$$\frac{1}{n}(1 + \delta_{Sn}) \leq \frac{1}{n}(1 + \delta_{S(n+1)})$$
$$\sqrt{\frac{1}{n}(1 + \delta_{Sn})} \leq \sqrt{\frac{1}{n}(1 + \delta_{S(n+1)})}$$
$$-\sqrt{\frac{1}{n}(1 + \delta_{Sn})} \leq -\sqrt{\frac{1}{n}(1 + \delta_{S(n+1)})}$$
$$\sqrt{1 + \delta_{S(n+1)}} - \sqrt{\frac{1}{n}(1 + \delta_{Sn})} \leq \sqrt{(1 + \delta_{S(n+1)})} - \sqrt{\frac{1}{n}(1 + \delta_{S(n+1)})}$$
$$\frac{1}{\sqrt{1 + \delta_{S(n+1)}} - \sqrt{\frac{1}{n}(1 + \delta_{Sn})}} \leq \frac{1}{\sqrt{1 + \delta_{S(n+1)}} - \sqrt{\frac{1}{n}(1 + \delta_{S(n+1)})}}$$
$$\frac{2\sqrt{1 + \frac{1}{n}}}{\sqrt{1 + \delta_{S(n+1)}} - \sqrt{\frac{1}{n}(1 + \delta_{Sn})}} \leq \frac{2\sqrt{1 + \frac{1}{n}}}{\sqrt{1 + \delta_{S(n+1)}} - \sqrt{\frac{1}{n}(1 + \delta_{S(n+1)})}}$$

$$\overline{C}_S(n) = \frac{2\sqrt{1 + \frac{1}{n}}}{\sqrt{1 + \delta_{S(n+1)}} - \sqrt{\frac{1}{n}(1 + \delta_{S(n+1)})}}$$

Therefore, there is an upper bound CS(n). Using a method for calculating $\delta_S$, it also is possible to calculate $C_S(n)$.

Figure 37:
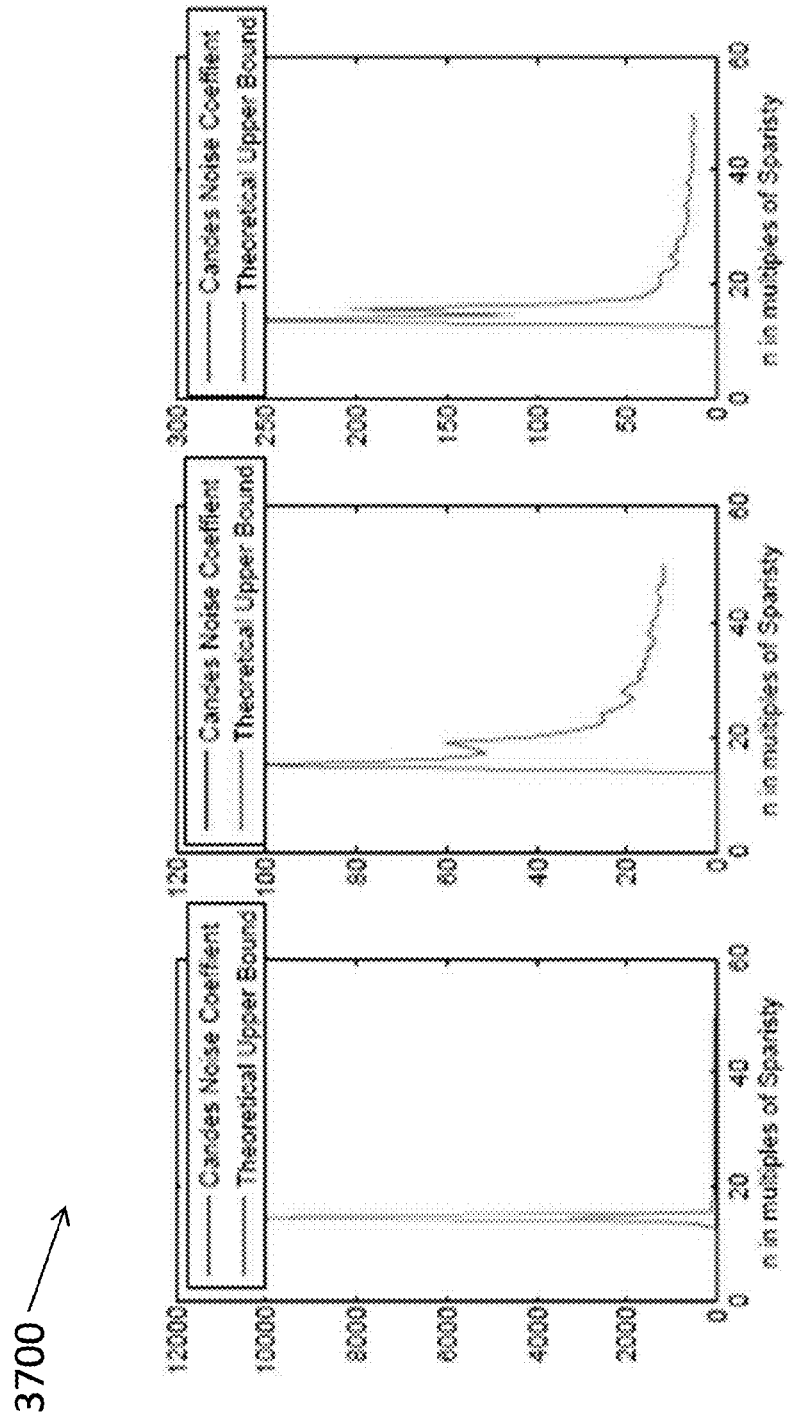
FIG. 37 illustrates an upper bound calculated for three particular Ψ-Φ pairs of differing dimensions in accordance with an embodiment.

$\overline{C}_S(n)$ roughly bounds the Candes Noise Coefficient, $C_S(n)$. It is noted that the computations of $\delta_S$ become increasingly difficult as a set of possible vectors, $X_N(S)$, grows larger. FIG. 37 shows an upper bound calculated for three particular $\Psi$-$\Phi$ pairs of differing dimensions.

$\overline{C}_S(n)$ is minimized to find the smallest upper bound for the noise coefficient $C_S(n)$. The advantage in calculating $\overline{C}_S(n)$ lies in the fact that instead of working with both $\delta_{S(n+1)}$ and $\delta_{S(n)}$, it is only necessary to work with $\delta_{S(n+1)}$. This makes derivations and calculation simpler. To minimize the upper bound, the first and second derivatives of $C_S(n)$ are found with respect to n.

$$\delta_{S(x)} = \delta_S(x)$$
$$\rho = \frac{d\delta_S(n+1)}{dn}$$
$$A = \sqrt{1 - \delta_{S(n+1)}} - \sqrt{\frac{1}{n}(1 + \delta_{S(n+1)})}$$
(25)

The derivative of $\overline{C}_S(n)$ is calculated with respect to n.

$$\overline{C}_S(n) = \frac{2\sqrt{1 + \frac{1}{n}}}{A} \quad (26)$$

$$\frac{d\overline{C}_S(n)}{dn} = \frac{d}{dn}\left[\frac{2\sqrt{1 + \frac{1}{n}}}{A}\right]$$

$$\frac{d\overline{C}_S(n)}{dn} = \frac{A}{\sqrt{1 + \frac{1}{n}} \, n^2 A^2} - \frac{2\sqrt{1 + \frac{1}{n}}}{A^2}\frac{dA}{dn}$$

$$\frac{d\overline{C}_S(n)}{dn} = -\overline{C}_S(n)\left[\frac{1}{2n^2\left(1 + \frac{1}{n}\right)} - \frac{1}{A}\frac{dA}{dn}\right]$$

Next, the first derivative of A is determined with respect to n.

$$A = \sqrt{1 - \delta_{S(n+1)}} - \sqrt{\frac{1}{n}(1 + \delta_{S(n+1)})} \quad (27)$$

$$\frac{dA}{dn} = \frac{d\sqrt{1 - \delta_{S(n+1)}}}{dn} - \frac{d\sqrt{\frac{1}{n}(1 + \delta_{S(n+1)})}}{dn}$$

$$\frac{dA}{dn} = \frac{1}{2\sqrt{1 - \delta_{S(n+1)}}}\rho - \frac{\sqrt{n(1 + \delta_{S(n+1)})}}{2n}\rho - \frac{\sqrt{1 + \delta_{S(n+1)}}}{2n^{\frac{3}{2}}}$$

$$\frac{dA}{dn} = \frac{1}{2}\left[\rho\left(\frac{1}{\sqrt{1 - \delta_{S(n+1)}}} - \frac{1}{\sqrt{n(1 + \delta_{S(n+1)})}}\right) + \frac{\sqrt{1 + \delta_{S(n+1)}}}{n^{\frac{3}{2}}}\right]$$

The second derivative of $C_S^0(n)$ is then calculated with respect to n.

$$\frac{d^2\overline{C}_S(n)}{dn^2} = \frac{dC_S^0(n)}{dn}\left[\frac{1}{2n^2\left(1 + \frac{1}{n}\right)} - \frac{1}{A}\frac{dA}{dn}\right] - \quad (28)$$

$$\overline{C}_S(n)\left[\frac{-1}{n^3\left(1 + \frac{1}{n}\right)} + \frac{1}{2n^4\left(1 + \frac{1}{n}\right)^2} + \frac{1}{A}\frac{d^2A}{dn^2} - \frac{\frac{dA^2}{dn}}{A^2}\right]$$

Next, the following is obtained from equations (26) and (28).

$$\frac{d^2\overline{C}_S(n)}{dn^2} = \overline{C}_S(n)\left[\frac{1}{2n^2\left(1 + \frac{1}{n}\right)} - \frac{1}{A}\frac{dA}{dn}\right] - \quad (29)$$

$$\overline{C}_S(n)\left[\frac{-1}{n^3\left(1 + \frac{1}{n}\right)} + \frac{1}{2n^4\left(1 + \frac{1}{n}\right)^2} + \frac{1}{A}\frac{d^2A}{dn^2} - \frac{\frac{dA^2}{dn}}{A^2}\right]$$

-continued $$\frac{d^2 \overline{C}_S(n)}{dn^2} = \overline{C}_S(n) \left[ \left( \frac{1}{2n^2\left(1+\frac{1}{n}\right)} - \frac{1}{A}\frac{dA}{dn} \right) - \right.$$

$$\left. \left( \frac{-1}{n^3\left(1+\frac{1}{n}\right)} + \frac{1}{2n^4\left(1+\frac{1}{n}\right)^2} + \frac{1}{A}\frac{d^2A}{dn^2} - \frac{\frac{dA^2}{dn}}{A^2} \right) \right]$$

With these equations, it is possible to ascertain the smallest value of $C_S$ for a given matrix $\Phi$-$\Psi$ pair.

3. Signal Interference

In this subsection, exemplary matrix operations and their use are described to reduce the effect of signal interference. As previously discussed, other than random white noise, signal reconstruction also can be inhibited by signal interference. There are two exemplary approaches to compensate for signal interference, and thus, mitigate the effects of this interference on signal reconstruction. For example, one method utilizes Row Equivalence properties of matrices to reduce the relative amplitude of the interference signal. The second method combines our encoding matrices and solves for a vector compilation of all the present signals.

Figure 38:
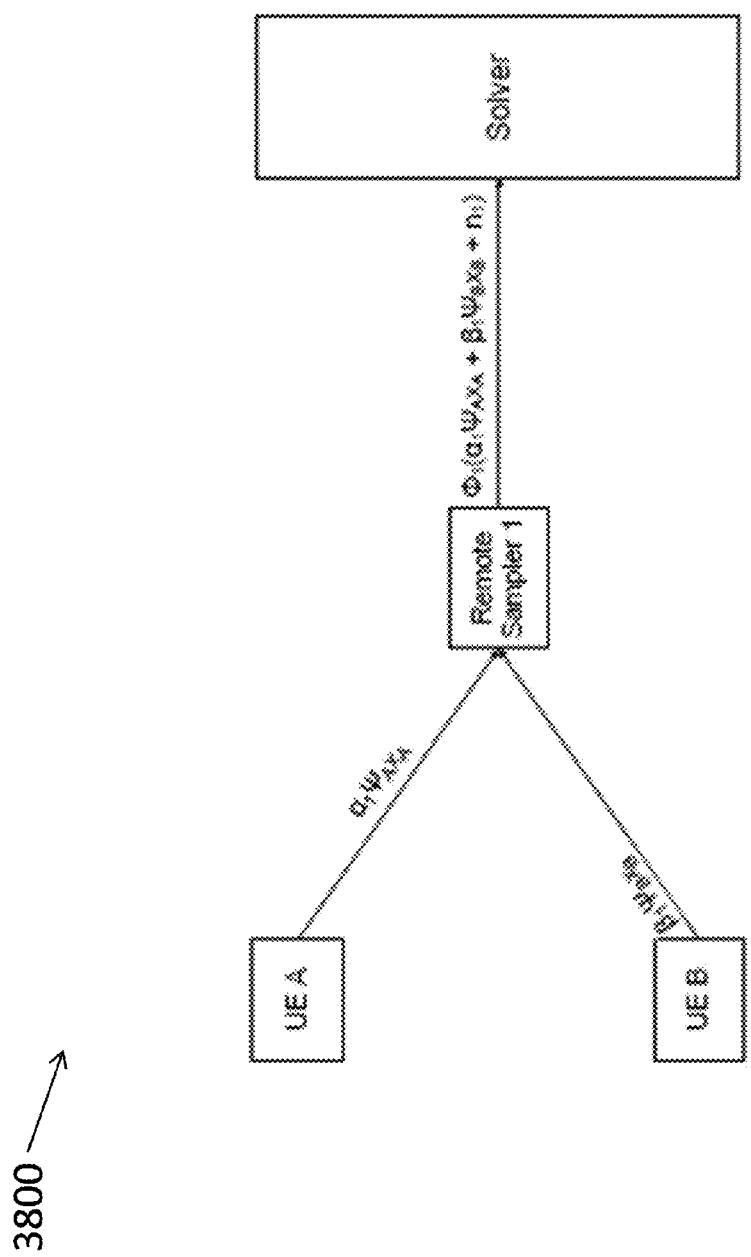
FIG. 38 illustrates an exemplary remote sampler system with two UEs and one remote sampler in accordance with an embodiment.

By way of example, a simple situation is when there are two UEs and one remote sampler, as shown in FIG. 38. There are two signals $x_1$ and $x_2$, each encoded with two bases, $\Psi_1$ and $\Psi_2$, with each incoming signal being sampled using the same sampling matrix $\Phi$. Thus, in this example, a final signal y is then passed to a Solver.

$$y = \Phi(\alpha_1 \Psi_1 x_1 + \alpha_2 \Psi_2 x_2) \tag{30}$$

where $\alpha_1$ and $\alpha_2$ are the fading coefficients of each signal.

To improve reconstruction of either $x_1$ or $x_2$, two exemplary approaches will be discussed to reduce the effects of signal interference—namely, (i) left matrix multiplication and (ii) a multi-UE matrix.

Matrix Multiplication:

The first method utilizes matrix multiplication from the left to reduce magnitudes of interference signals. Although there might be several methods to do this, one exemplary approach involves Row Equivalent Matrices.

When signal $x_i$ is sampled, it can be treated as a vector multiplied on the left first by an N×N matrix $\Psi_i$ and then by an M×N matrix $\Phi$. The problem is simplified by treating the product of $\Phi$ and $\Psi_i$ as an M×N matrix $U_i$.

$$U_i = \Phi \Psi_i$$

The signals represented in equations (30) and (36) are rewritten as:

$$y = U_1 \alpha_1 x_1 + U_2 \alpha_2 x_2 \tag{31}$$

$$y = \Sigma U_i \alpha_i x_i \tag{32}$$

Each signal is encoded with it's own matrix $U_i$, which is treated the same way as matrix multiplication from the left. As such, there is only reliance on operations on $U_i$ from the left. The idea of Row-Equivalent Matrices is now introduced.

Definition 3.1.

Let P and Q be two M×N matrices. P and Q are Row Equivalent if and only if there exists an M×M matrix, A, such that:

$$AP = Q$$

In other words, P can be transformed to Q through some series of elementary row operations.

If a series of Row Equivalent $U_i$ matrices is used, then by multiplying each $U_i$ on the left by some matrix, $P_i$, it is possible to transform each $U_i$ into a common matrix, U.

$$\overline{U} = P_i U_i \text{ for all } i \tag{33}$$

The first case examined here is when, the $\Psi$ matrices are equal, that is, each UE will encode its signal using a universal matrix, e.g., the same $\Psi$ orthobasis.

$$\Psi_1 = \Psi_2$$

Using this assumption, the equation (30) is simplified as follows:

$$y = \Phi(\alpha_1 \Psi_1 x_1 + \alpha_2 \Psi_2 x_2)$$

$$y = \Phi(\alpha_1 \Psi x_1 + \alpha_2 \Psi x_2)$$

$$y = \phi \Psi(\alpha_1 x_1 + \alpha_2 x_2) \tag{34}$$

This amounts to solving for the sum of the two signals.

$$y = \Phi \Psi \hat{x} \text{ where } \hat{x} = \alpha_1 x_1 + \alpha_2 x_2 \tag{35}$$

By solving this problem, the vector sum, $\hat{x}$, is exactly recoverable. The problem becomes the noiseless Compressive Sensing problem, where $\hat{x} = \alpha_1 x_1 + \alpha_2 x_2$ is sought. Thus, equation (2) is solvable for this new $\hat{x}$ exactly.

A remaining question is how many samples are taken in order to assure complete recovery. Since $\Phi$ or $\Psi$ has not been altered, the incoherence of $\Phi$ and $\Psi$ remains the same from the case of one signal. $C_M$ remains unchanged. Each vector has the same number of dimensions, $x_1, x_2 \in R^N$, thus $\hat{x} = x_1 + x_2 \in R^N$. Thus, the only variable of equation (3) that changes between the single signal and the multiple signal case is S, the total sparsity.

The sparsity of the vector sum, $\hat{x}$, is at most the sum of the sparsities of signals $x_1$ and $x_2$. Using this value as the sparsity of vector $\hat{x}$ and using a number of samples as specified in equation (3), it is possible to exactly recover the signal $\alpha_1 x_1 + \alpha_2 x_2$.

It becomes trivial to expand this to more than two signals. The received signal simply becomes:

$$y = \Sigma \Phi \Psi \alpha_i x_i$$

$$y = \Phi \Psi \Sigma(\alpha_i x_i) \tag{36}$$

Accordingly, the sparsity is at most the sum of the sparsities of every individual signal, $x_i$. Using this sparsity value, it is possible to recover $\Sigma \alpha_i x_i$ exactly, for any number of signals, $x_i$. Once this sum is recovered, the desired signal, $x_i$ can then be reconstructed.

Figure 39:
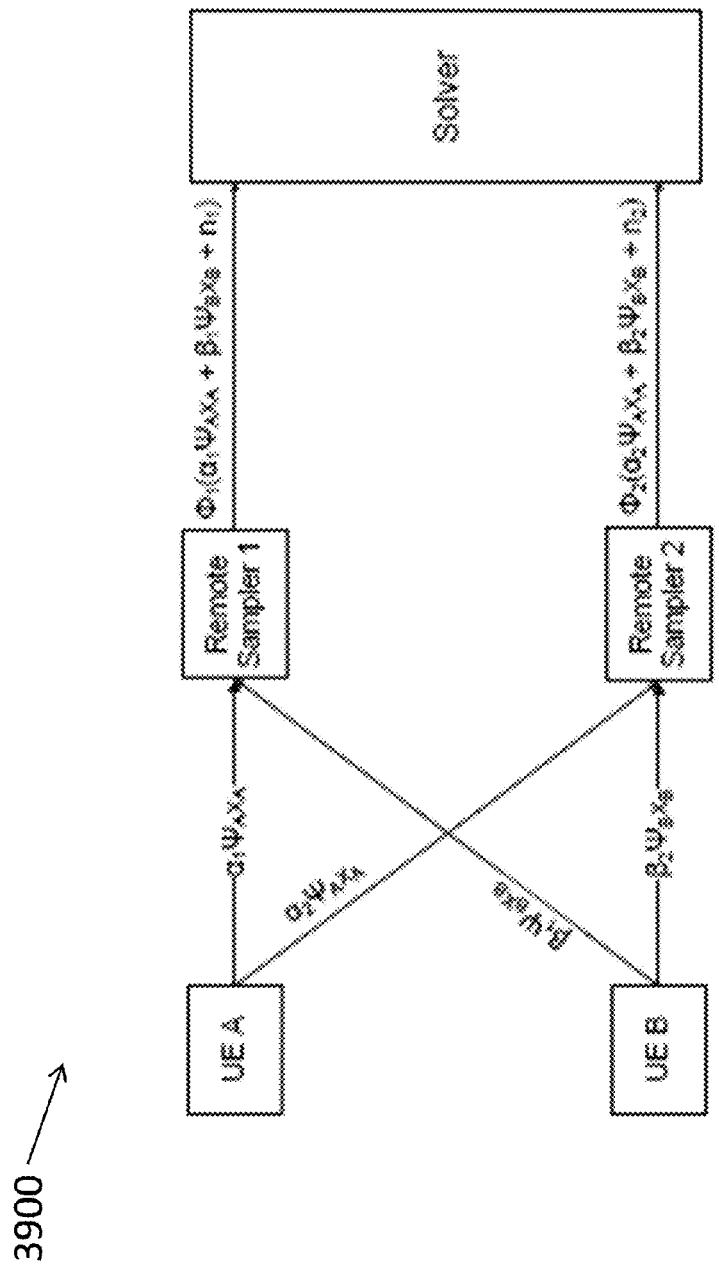
FIG. 39 illustrates an exemplary remote sampler system with two UEs and two remote sampler in accordance with an embodiment.

Multi-UE Matrix: In the multi-UE signal model, the $\Phi j$-$\Psi i$ matrices can be combined into larger matrices for multi-UEs. By way of example, consider a system of two UEs and two remote samplers. In this example, the final signals received by the Solver, (shown in FIG. 39) from each remote sampler in the communication system is of the form:

$$y_1 = \Phi_1(\alpha_1 \Psi_A x_A + \beta_1 \Psi_B x_B + n_1) \tag{50}$$

$$y_2 = \Phi_2(\alpha_2 \Psi_A x_A + \beta_2 \Psi_B x_B + n_2) \tag{51}$$

Since each remote sampler will have its own $\Phi$ matrix, with unique dimensions, each received signal, $y_1$ and $y_2$, will be of dimensions $M_1$ and $M_2$ respectively. This system of equations can be expressed as a matrix equation in the following manner:

$$\begin{vmatrix} \alpha_1 \Phi_1 \Psi_A & \beta_1 \Phi_1 \Psi_B \\ \alpha_2 \Phi_2 \Psi_A & \beta_2 \Phi_2 \Psi_B \end{vmatrix} \begin{vmatrix} x_A \\ x_B \end{vmatrix} + \begin{vmatrix} \Phi_1 n_1 \\ \Phi_2 n_2 \end{vmatrix} = \begin{vmatrix} y_1 \\ y_2 \end{vmatrix}$$

This equation is simplified even further as follows:

$$\text{Let: } \overline{A} = \begin{vmatrix} \alpha_1 \Phi_1 \Psi_A & \beta_1 \Phi_1 \Psi_B \\ \alpha_2 \Phi_2 \Psi_A & \beta_2 \Phi_2 \Psi_B \end{vmatrix}$$

$$\overline{x} = \begin{vmatrix} x_1 \\ x_2 \end{vmatrix}$$

$$\overline{N} = \begin{vmatrix} \Phi_1 n_1 \\ \Phi_2 n_2 \end{vmatrix}$$

$$\overline{y} = \begin{vmatrix} y_1 \\ y_2 \end{vmatrix}$$

Thus, a new problem is formulated:

$$\overline{A}\overline{x} + \overline{N} = \overline{y} \tag{53}$$

Figure 40:
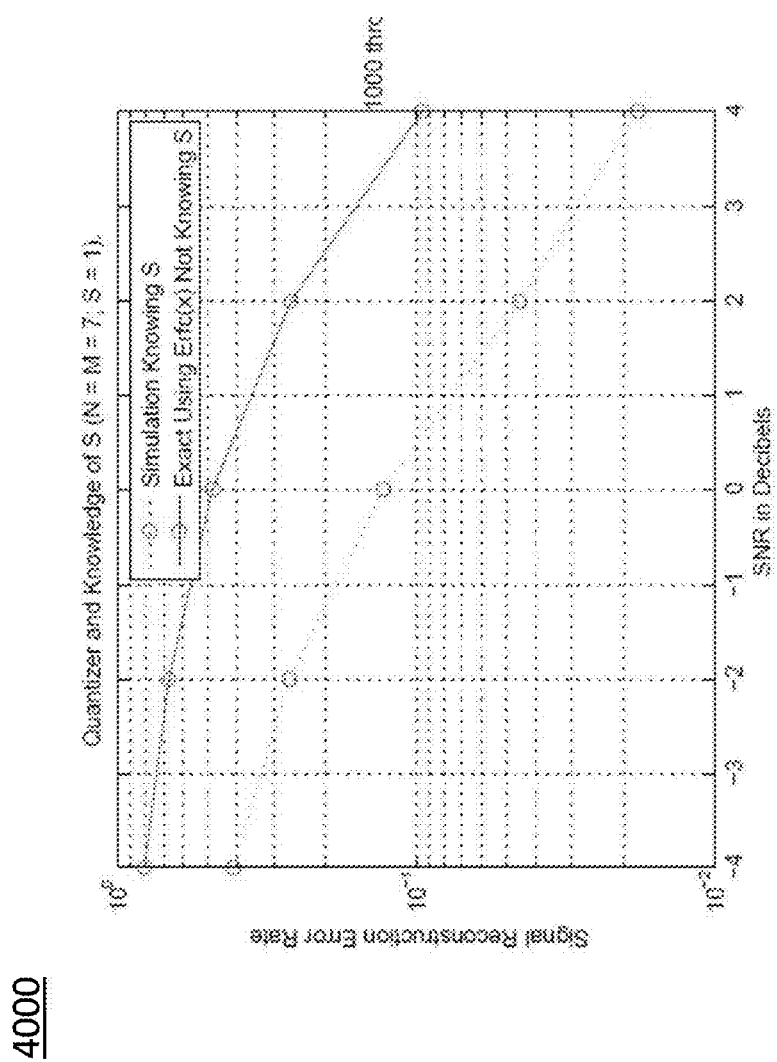
FIG. 40 illustrates exemplary results of signal recovery at varying SNR values using MP Pseudo-Inverse in accordance with an embodiment.

FIG. 40 illustrates exemplary results of signal recovery at varying SNR values using MP Pseudo-Inverse. In this example, the signal is a 7-dimensional vector, taking a number of measurements M=7, with sparisty S=1. The error is plotted in signal reconstruction for the system knowing the sparsity, as well as the ideal case without knowing the sparsity. Knowledge of the sparsity improves our signal recovery.

Figure 41:
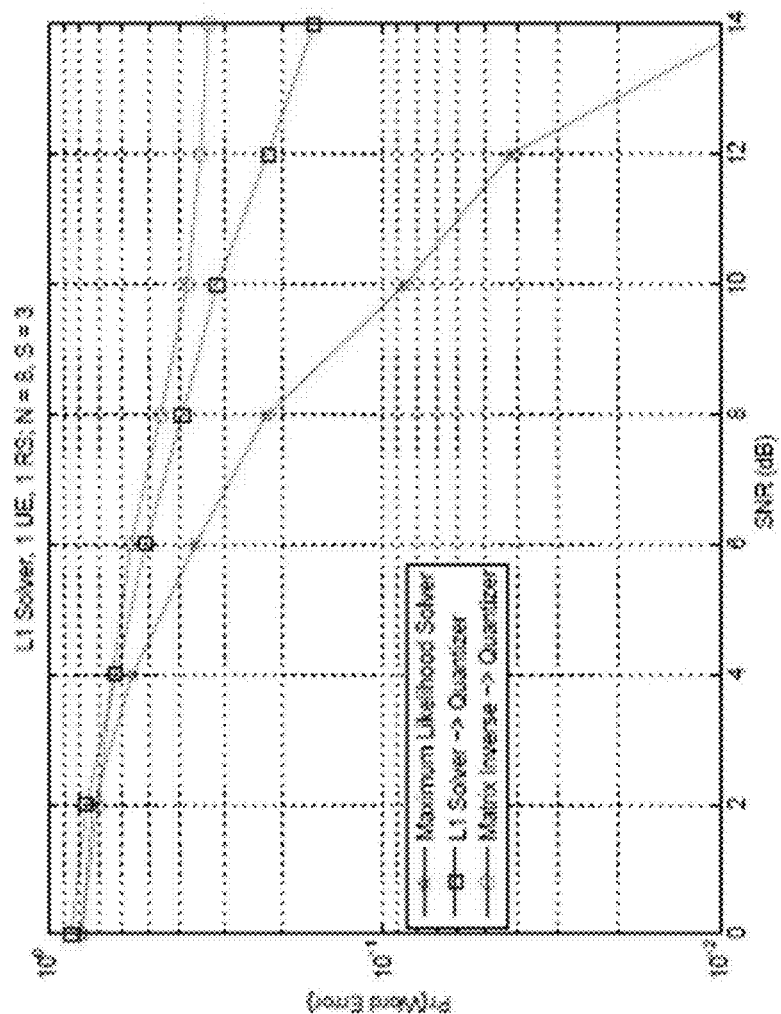
FIG. 41 illustrates an exemplary comparison of recovery between various methods. in accordance with an embodiment.

FIG. 41 illustrates an exemplary graph 4100 comparing recovery rates for the Pseudo-Inverse and the L1 Solver methods, as well as an exhaustive search method. In this example, an 8-dimensional signal x is used with sparsity S=3. The number of measurements M=5.

Figure 42:
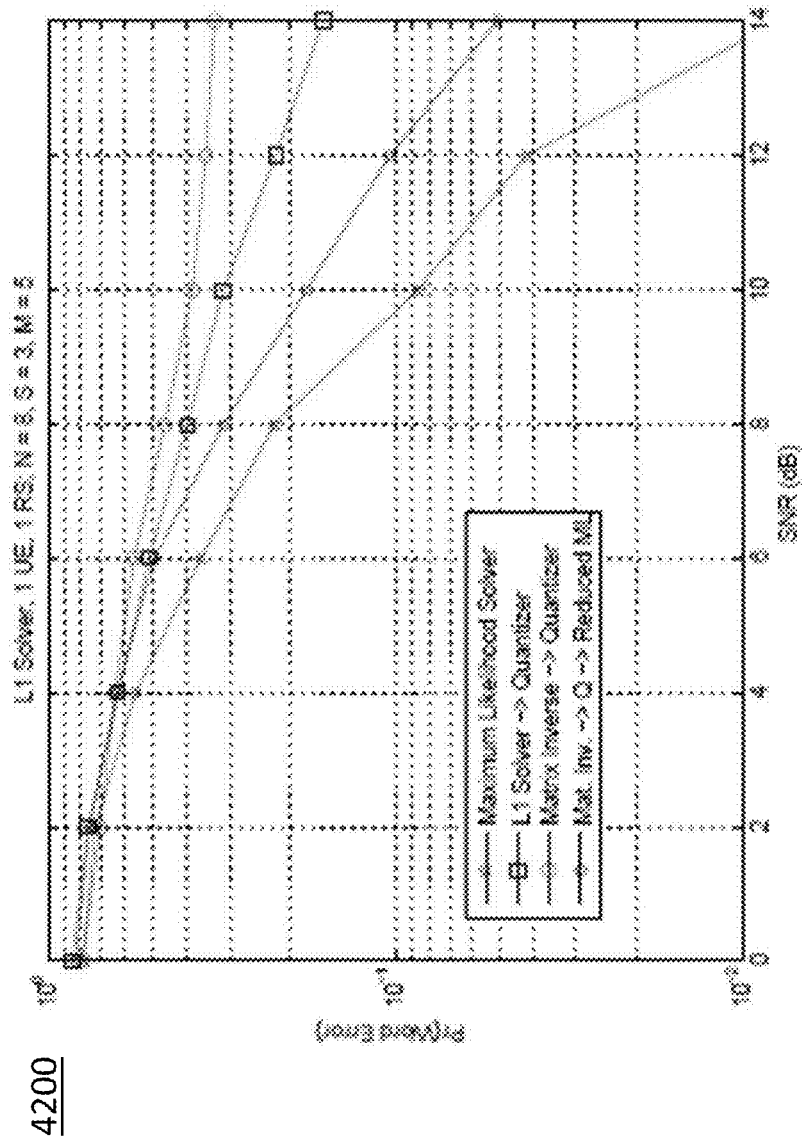
FIGS. 42 and 43 illustrate exemplary comparisons of signal recovery between various methods in accordance with an embodiment.
Figure 43:
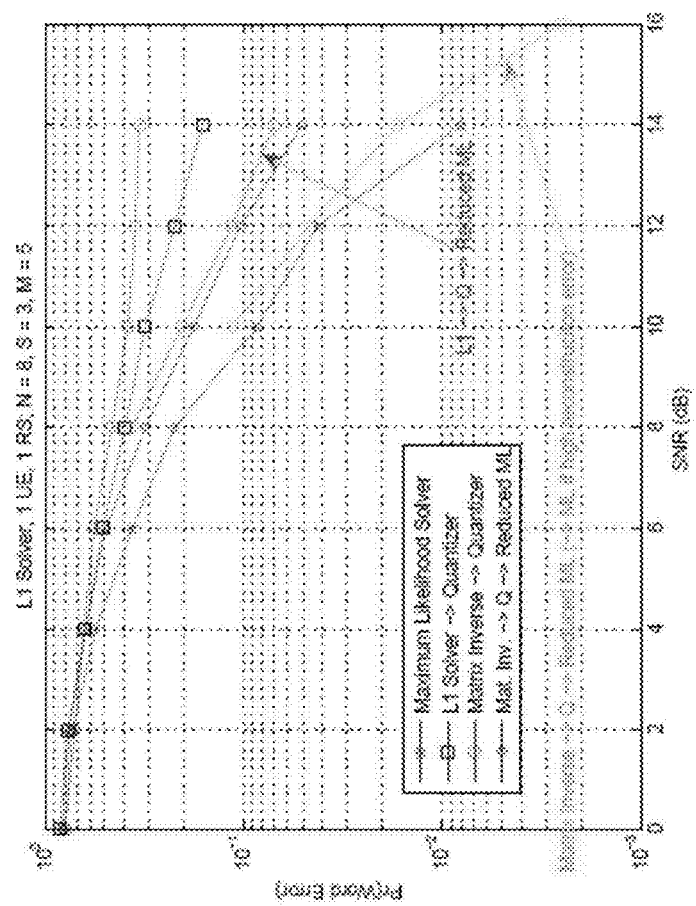

FIGS. 42 and 43 illustrate exemplary graphs 4200 and 4300, respectively, comparing signal recovery between various Methods. As shown in FIGS. 42 and 43, the usage of the Reduced Maximum Likelihood method in conjunction with another solving method can greatly reduce error in signal recovery.

In order to understand why information is lost with decreasing measurements, it is important to understand the operations, in a strictly mathematical sense. Consider an M×N, full rank matrix, A, with M<N. We can treat this matrix as a linear transformation between the vector spaces, with domain $X \subseteq R^N$ and co-domain $Y \subseteq R^M$.

Figure 44:
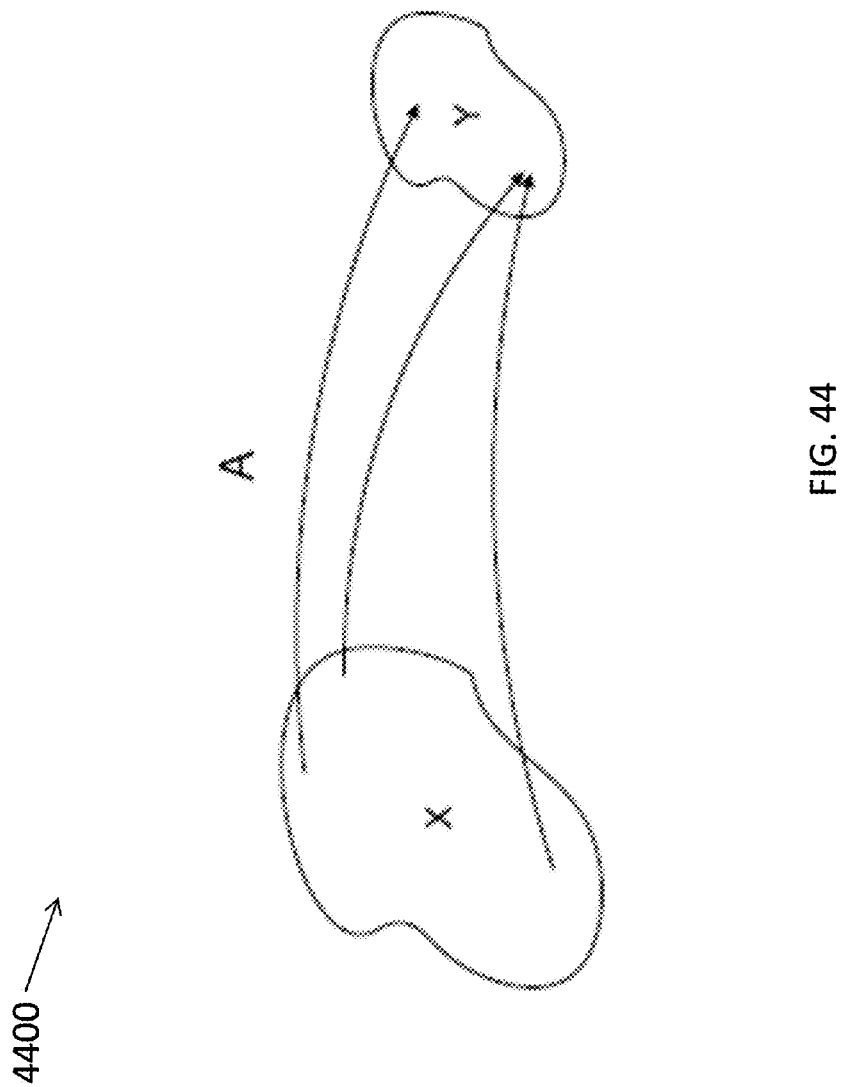
FIG. 44 illustrates an exemplary operation A from $R^N$ to $R^M$ in accordance with an embodiment.

FIG. 44 illustrates an exemplary operation A from $R^N$ to $R^M$. Because matrix A is full rank, its nullity and rank are easily calculated.

$$\text{rank}(A) = M$$

$$\text{null}(A) = N - M \tag{68}$$

The dimension of matrix A's co-kernel and its rank sum to the dimension of its target space, Y. As a result, the dimension of the co-kernel of A is zero.

$$\dim(\text{coker}(A)) = 0$$

Because A is a map from a larger vector space to a smaller vector space, when operating on Y with its inverse, $A^-$ there is no guarantee to recover all of X.

Figure 45:
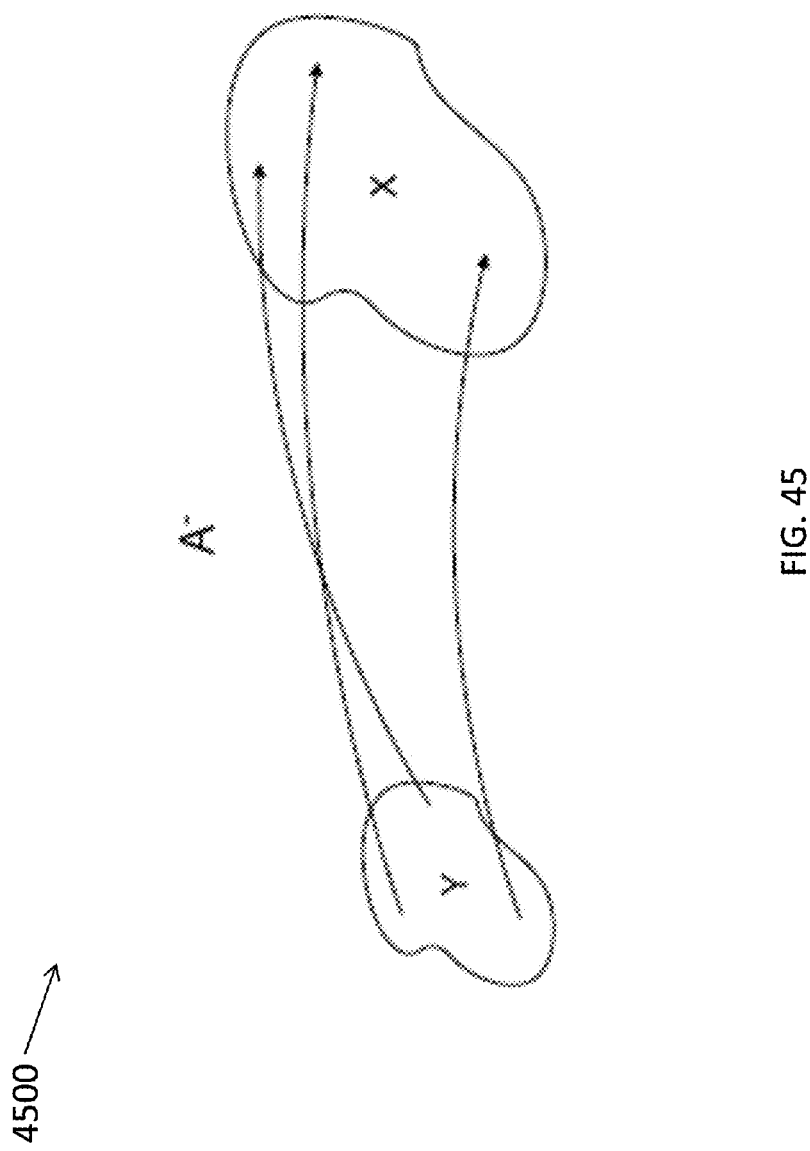
FIG. 45 illustrates an exemplary operation $A^-$ from $R^M$ to $R^N$ in accordance with an embodiment.

FIG. 45 illustrates an exemplary operation $A^-$ from $R^M$ to $R^N$. Consider a vector, $x \in X \subseteq R^N$. Consider another vector, $c \in X \subseteq R^N$ which also is in the kernel of A, v ∈ker(A). Let A operate on the sum of these vectors, as well as vector x.

$$y_1 = A(x+v)$$

$$y_2 = Ax$$

Now let the inverse of A, $A^-$, operate on these new vectors, $y_1$, $y_2 \in Y \subseteq R^M$. Because vector v falls into the nullspace of A, the vectors $y_1$ and $y_2$ will map to the same vector, $x \in X \subseteq R^N$.

$$A^-(y_1) = A^-(A(x+v)) = A^-(A(x)) = A^-(y_2)$$

Thus, A cannot be an injection from $R_N$ to $R_M$.

Any vectors which fall into the nullspace of A introduce potential errors when mapping back from Y to X. However, as the dimension of the target space, $R_M$, increases, the size of the nullspace of A decreases, which in turn decreases the number of possible error vectors. This decreasing nullspace may be thought of as a decrease in the number of degrees of freedom, until we have a completely determined system, when M=N. This is why error in signal reconstruction using the L1 Solver decreases proportionally to the number of measurements taken, M.

4. Conclusions

Given the two types of noise, e.g., additive and interference, there are several methods to reduce their effects on signal reconstruction.

It is possible to utilize properties of bases to reduce the effects of noise. The Candes Noise coefficient $C_S(n)$ is dependent on properties of the Ψ and ϕ matrices, namely the S-Restricted Isometry Constant. By minimizing $C_S(n)$, the effects of all forms of noise, not simply additive noise can be minimized or reduced. This reduction is a form of optimization of the Ψ-ϕ matrix pairs. By selecting Ψ-Φ pairs with optimum Candes Noise Coefficients and SRIC, it is possible to reduce the effects of noise, both additive and interference.

Figure 46:
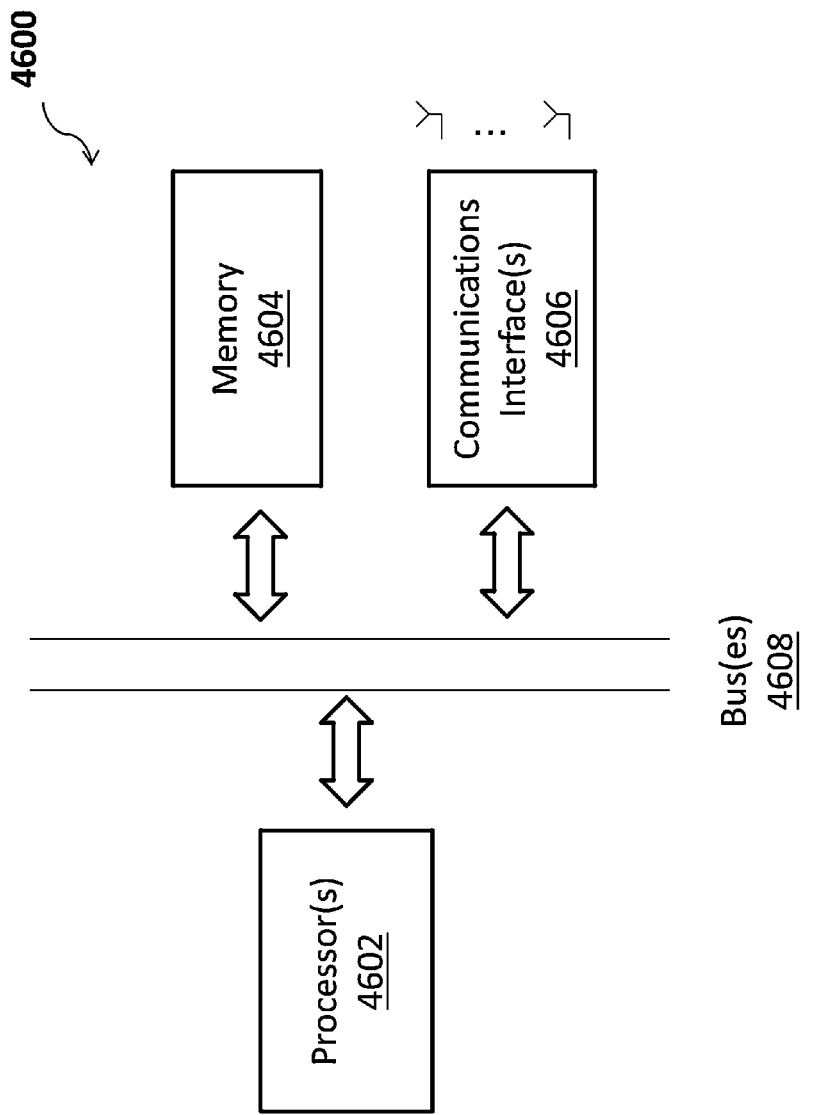
FIG. 46 illustrates a block diagram of exemplary components of user equipment (UE) in accordance with the various embodiments.

FIG. 46 illustrates a block diagram of exemplary components of a UE 4600, such as in FIGS. 1A, 1B and 1C, in accordance with an embodiment. The UE 4600 includes processor(s) (or controllers) 4602, memory 4604, communications interface(s) 4606, bus(es) 4608 for interconnecting components of the UE, and computer programs.

The memory 4604 can be a non-transitory computer-readable storage medium used to store executable instructions, or computer program thereon. The memory 1204 may include a read-only memory (ROM), random access memory (RAM), programmable read-only memory (PROM), erasable programmable read-only memory (EPROM), a smart card, a subscriber identity module (SIM), or any other medium from which a computing device can read executable instructions or a computer program. The term "computer program" is intended to encompass an executable program that exists permanently or temporarily on any computer-readable storage medium as described above.

The computer program also includes an algorithm that includes executable instructions stored in the memory 4604 that are executable by the processor(s) 4602, which may be facilitated by one or more of the application programs also stored on the memory 4604. The application programs may also include, but are not limited to, an operating system or any special computer program that manages the relationship between application software and any suitable variety of hardware that helps to make-up a computer system or computing environment of UE 4600.

The communications interface(s) 4606 include transmit and receive circuitry (or components) for conducting wireless or line-based communications with a network or network node, or other communications-enabled devices. For example, the communications interface(s) can include line-based interface(s), and one or more transmit antennas and one or more receive antennas for conducting wireless communications.

Figure 47:
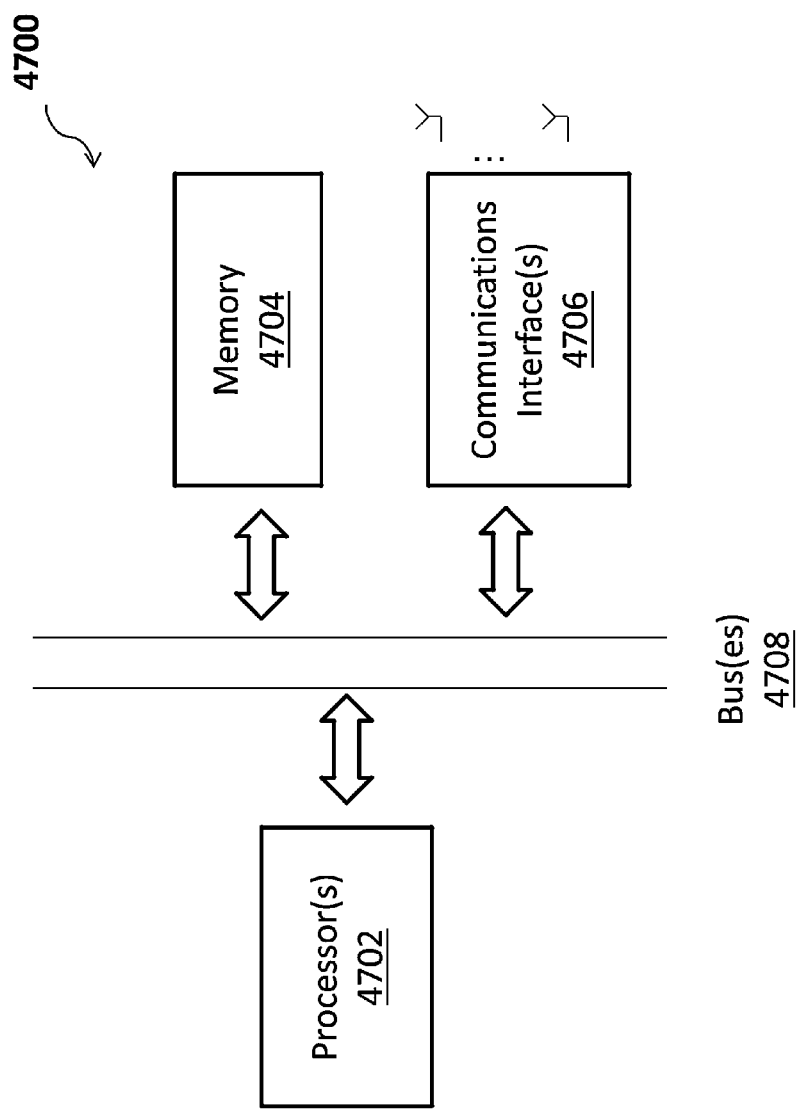
FIG. 47 illustrates a block diagram of exemplary components of a network node in accordance with the various embodiments.

FIG. 47 illustrates a block diagram of exemplary components of a network node 4700, such as those shown in FIGS. 1A, 1B and 1C or described herein, in accordance with an embodiment. The network node 4700 includes processor(s) (or controllers) 4702, memory 4704, communications interface(s) 4706, bus(es) 4708 for interconnecting components of the network node, and computer programs.

The memory 4704 can be a non-transitory computer-readable storage medium used to store executable instructions, or computer program thereon. The memory 4704 may include a read-only memory (ROM), random access memory (RAM), programmable read-only memory (PROM), erasable programmable read-only memory (EPROM), a smart card, a subscriber identity module (SIM), or any other medium from which a computing device can read executable instructions or a computer program. The term "computer program" is intended to encompass an executable program that exists permanently or temporarily on any computer-readable storage medium as described above.

The computer program also includes an algorithm that includes executable instructions stored in the memory 4704 that are executable by the processor(s) 4702, which may be facilitated by one or more of the application programs also stored on the memory 4704. The application programs may also include, but are not limited to, an operating system or any special computer program that manages the relationship between application software and any suitable variety of hardware that helps to make-up a computer system or computing environment of network node 4700.

The communications interface(s) 4706 include transmit and receive circuitry (or components) for conducting wireless or line-based communications with UEs or other components of the network. For example, the communications interface(s) can include line-based interface(s), and one or more transmit antennas and one or more receive antennas for conducting wireless communications.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

Also, techniques, systems, subsystems and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

REFERENCES

[A1] E. Biglieri, R. Calderbank, A. Constantinides, A. Goldsmith, A. Paulraj, and H. V. Poor, MIMO Wireless Communications, Cambridge, Cambridge, England, 2007. [A2] M. Coldrey and P. Bohlin. Training-based mimo systems—part i: Performance comparison. IEEE Trans. on Signal Processing, pages 5464-76, November 2007. [A3] Thomas M. Cover and Joy A. Thomas, Elements of Information Theory, Wiley-Interscience, Hoboken, N.J., second edition, 2006. [A4] Robert Gallager, Information Theory and Reliable Communication. J. H. Wiley, New York, 1968. [A5] B. Hochwald and S. ten Brink, Achieving near-capacity on a multiple-antenna channel, IEEE Trans. on Communications, pages 389-399, March 2003. [A6] F. R. Kschischang, Codes defined on graphs, IEEE Commun. Magazine, pages 118-125, August 2003. [A7] M. Medard, The effect upon channel capacity in wireless communications of perfect and imperfect knowledge of the channel, IEEE Trans. on Information Theory, pages 933-946, May 2000. [A8] N. Nguyen and T. A. Sexton. Channel estimation and link adaptation, U.S. provisional Application No. 61/293,848 filed Jan. 11, 2010. [A9] J. Romero-Jerez and A. J. Goldsmith, Receive antenna array strategies in fading and interference: An outage probability comparison, IEEE Trans. Wireless Communications, pages 920-32, March 2008. [A10] S. Sampei, System design issues and performance evaluations for adaptive modulation in new wireless access systems, Proceedings of the IEEE, pages 2456-2471, December, 2007. [A11] B. Sethuraman, B. Rajan, and V. Shashidhar, Full-diversity high-rate space-time block codes from division algebras, IEEE Trans. on Information Theory, pages 2596-2616, October 2003. [A14] G. Taubock and F. Hlawatsch, A compressed sensing technique for ofdm channel estimation in mobile environments: Exploiting channel sparsity for reducing pilots, IEEE ICASSP, pages 2885-8, 2008. [A15] E. Telatar, Capacity of multi-antenna gaussian channels, October 1995, available at http://mars-.bell-labs.com/papers/proof/. [A16] J. H. Winters, Smart antenna techniques and their application to wireless ad hoc networks, IEEE Wireless Communications, pages 77-83, August 2006. [A17] A. Avestimehr, S. Diggavi, and D. N. C. Tse, A deterministic model for wireless relay networks and its capacity. IEEE, pages 2864-2868 (2007). [A18] B. Nazer and M. Gastpar, Compute-and-forward: A novel strategy for cooperative networks. IEEE Asilomar Conference, pages 69-73, October 2008. [A19] R. Jantti and S.-L. Kim, Downlink resource management in the frequency domain for multicell ofcdm wireless networks. IEEE Trans, Veh. Techn., pages 3241-6 (September 2008). [A20] S. Kirolos, J. Lask, M. Wakin, M. Duarte, D. Baron, T. Ragheb, Y. Massoud, and R. Baraniuk. Analog-toinformation conversion via random demodulation. Proc. of the IEEE Dallas Circuits and Systems Workshop, (2006). [A21] A. Serrador, B. Kuipers, and L. Correia, Impact of mimo systems on crrm in heterogeneous networks, WCNC, pp. 2864-2868 (2008). [A22] I-H. Wang and D. N. C. Tse, Gaussian interference channels with multiple receive antennas:capacity and generalized degrees of freedom, Allerton Conference, pp. 715-722 (September 2008). [A23] L. Zheng and D. N. C. Tse, Communication on the grassmann manifold: A geometric approach to the non-coherent multiple-antenna channel. IEEE Trans. Info. Th., pp. 359-383 (February 2002). [A24] J. P. Castro, "All IP in 3G CDMA Networks", John Wiley & Sons, Ltd., Chichester, England (2004)

[B1] E. Candes and T. Tao, Decoding by linear programming. IEEE Trans. on Info, Theory, pp. 21-30 (December 2005). [B2] E. Candes and M. Wakin, An introduction to compressive sampling, IEEE Signal Proc. Mag., pp. 21-30 (March 2008). [B3] E. J. Candes, J. K. Romberg, and T. Tao, Stable signal recovery from incomplete and inaccurate measurements. Comm, Pure Appl. Math (2006). [B4] Emmanuel Candes, The restricted isometry property and its implications for compressed sensing. [B5] Emmanuel Candes and Justin Romberg, Sparisty and incoherence in compressive sensing (2006). [B6] Rich Chartrand and Valentina Staneva, Restricted isometry properties and nonconvex compressive sampling, Inverse Problems, pages 1-14 (May 2008). [B7] Michael A. Saunders David L. Donoho, Scott Shaobing Chen, Atomic decomposition by basis pursuit. [B8] Vladimir Temlyakov David L. Donoho, Michael Elad, Stable recovery of sparse overcomplete representations in the presence of noise. [B9] Justin Romberg Emmanuel J. Candes, Robust uncertainty principles; exact signal reconstruction from highly incomplete frequency information, IEEE Trans. on Info. Theory, pp. 489-509 (February 2006). [B10] Coralia Carts Jeffrey D. Blanchard and Jared Tanner. Decay properties of restricted isometry constants (2009). [B11] Ronald DeVore Michael Wakin Richard Baraniuk, Mark Davenport, A simple proof of the restricted isometry property for random matrices (February 2007).

The invention claimed is:

1. A method comprising:
receiving samples of wireless transmissions from a plurality of user equipment (UEs) traveling through different communication regions in a wireless network, wherein the communication regions are pilot zones, and each pilot zone is assigned a corresponding set of pilots signals for use by UEs when traveling through the corresponding pilot zone, each of the wireless transmissions being based on an S-sparse set of vectors;
detecting information in the wireless transmissions of the UEs based on the samples;
constructing an overall matrix of estimated channels for the UEs, wherein the information in the wireless transmission of the UEs is detected based on at least the constructed matrix and the samples; and
estimating a channel for each of the UEs based on pilot signals employed by the UEs,
wherein two or more of the different communication regions are assigned the same set of pilot signals.

2. The method according to claim 1, further comprising:
identifying a presence of the UEs in the different communication regions at any given point in time; and
identifying communication parameters used by the UEs in the different communication regions.

3. The method according to claim 1, wherein the detecting information comprises implementing a linear program to solve a L1 minimization problem.

4. The method according to claim 1, wherein the detecting information operation comprises:
estimating a transmit vector for the wireless transmissions based on the samples and the estimated channels; and
demodulating the estimated transmit vector to obtain information in the wireless transmissions of the UEs.

5. The method according to claim 4, further comprising:
re-modulating the information to obtain a re-modulated transmit vector;
re-estimating channels for the UEs based on the re-modulated transmit vector;
estimating a transmit vector for a subsequent transmission period based on the samples and the re-estimated channels for the UEs; and
demodulating the estimated transmit vector to obtain information in the wireless transmissions of the UEs.

6. The method according to claim 1, wherein the detecting operation employs a linear program using a sparse representation matrix and a sensing matrix, and the matrices are selected to reduce at least a Candes Noise Coefficient.

7. The method according to claim 1, wherein the wireless network includes remote regional processors associated with respective communication regions, and the samples are received from the remote regional processors.

8. The method according to claim 7, wherein each of the remote regional processors allocates communication parameters for use by UEs in its respective communication region.

9. A method comprising:
receiving samples taken of a wireless transmission from user equipment (UE) traveling from a first pilot zone to a second pilot zone in a wireless network having a plurality of pilot zones, each pilot zone having an assigned set of pilot signal, the wireless transmission including a pilot signal selected from the set of pilot signals by the UE based on a scheduled assignment and being based on an S-sparse combination of a set of vectors;
identifying a presence of the UE in the second pilot zone;
identifying the selected pilot signal to be used by the UE in the second pilot zone based on the scheduled assignment; and
detecting information in the wireless transmission from the set of samples,
wherein the samples are sampled at different geographic locations in the second region at a given point in time, and
wherein the scheduled assignment is based on a system clock and a UE identifier (ID).

10. The method of claim 9, wherein the first and second zones are assigned a different set of pilot signals.

11. A communication system comprising:
a plurality of remote samplers $\{1, \ldots, j, \ldots, z\}$ where z is a number of remote samplers, a $j^{th}$ remote sampler capturing N samples during a word interval and transforming the N samples into $M_j$ samples denoted collectively as $y_j$ using a sensing matrix $\Phi_j$ where $M_j < N/2$ and $M = M_1 + \ldots + M_j + \ldots + M_z$; and
a solver for receiving samples $\{y_1, \ldots, y_j, \ldots, y_z\}$ from the remote samplers and formulating a soft estimate of a collection of data vectors $\{\tilde{x}_1, \ldots, \tilde{x}_k, \ldots, \tilde{x}_l\}$ based on knowledge of transmission matrices $\{\Psi_1, \ldots, \Psi_k, \ldots, \Psi_l\}$ where l is a number of user equipment $\{1, \ldots, k, \ldots, l\}$,
wherein a transmission matrix $\Psi_k$ is incoherent within a sensing matrix $\Psi_j$ for all pairs k, j according to a Restricted Isometry Property.

12. The system according to claim 11, wherein a quantized vector $\hat{x}_k$ is associated with a soft vector $\tilde{x}_k$ using a sparsity value $s_k$.

13. The system according to claim 12, further comprising a plurality of regional leaf brains for receiving samples from remote samplers in their respective regions, wherein a regional leaf brain from the plurality of regional leaf brains assigns a value $s_k$ to a $k^{th}$ user equipment.

14. The system according to claim 13, wherein the plurality of regional leaf brains includes a first regional leaf brain and a second regional leaf brain, the first regional leaf brain assigning a sparsity value $s_k$ to a first user equipment, and the second regional leaf brain assigning a value $s_{k+1}$ to a second user equipment.

15. The system according to claim 13, wherein the plurality of regional leaf brains includes a first regional leaf brain and a second regional leaf brain, the first regional leaf brain assigning to a $k^{th}$ user equipment a transmission matrix $\Psi_{reuse}$ and a second regional leaf brain assigning to a $k+1^{th}$ user equipment the matrix $\Psi_{reuse}$, wherein the solver is aware of the assignments and the solver estimates a complex path gain from the $k^{th}$ user equipment to the $j^{th}$ remote sampler.

16. The system according to claim 13, wherein the $k^{th}$ user equipment uses a pilot matrix $\Psi_k$ in a given word interval at a time $t_w$ where:
   (1) the $k^{th}$ user equipment determines the pilot matrix $\Psi_k$ by evaluating a formula using $t_w$ or by reading a table using $t_w$, and
   (2) a $(k+1)^{th}$ user equipment determines a pilot matrix $\Psi_{k+1}$ by evaluating a formula using $t_w$ or by reading a table using $t_w$.

17. The system according to claim 16, wherein $\Psi_{k+1}$ is identical to $\Psi_k$ at a time $t=t_w$.

18. The system according to claim 16, wherein during certain word intervals a set of transmission matrices $\Psi$ comprises pilot matrices and a $k^{th}$ element $x_k$ is a pattern with sparsity $s_k=1$ and $x_k$ is known to the solver.

19. The system according to claim 18, wherein the set of transmission matrices $\Psi$ comprises columns of a Discrete Fourier Transform matrix.

20. The system according to claim 18, wherein the set of transmission matrices $\Psi$ comprises columns generated using a pseudo random number generator.

21. The system according to claim 11, wherein the solver creates a soft estimate $\tilde{x}$ using a zero forcing method.

22. The system according to claim 11, wherein the solver creates a soft estimate using a maximum-likelihood method.

23. A method of operating user equipment comprising:
   learning a number of uplink antennas passed per second; and
   apportioning an uplink transmission bandwidth between data, signaling and pilot transmissions based on the learned number,
   wherein a data transmission comprises s-sparse transmission based on a pseudo-random number-based transmission matrix $\Psi$ which is repopulated at certain time intervals.

24. A communication system comprising:
   a plurality of remote samplers $\{1, \ldots, j, \ldots, z\}$ where z is a number of remote samplers, a $j^{th}$ remote sampler capturing N samples during a word interval and transforming the N samples into $M_j$ samples denoted collectively as $y_j$ using a sensing matrix $\Psi_j$ where $M_j<N/2$ and $M=M_1+\ldots+M_j+\ldots+M_z$; and
   a solver for receiving samples $\{y_1, \ldots, y_j, \ldots, y_z\}$ from the remote samplers and formulating a soft estimate of a collection of data vectors $\{\tilde{x}_1, \ldots, \tilde{x}_k, \ldots, \tilde{x}_l\}$ based on a knowledge of transmission matrices $\{\Psi_1, \ldots, \Psi_k, \ldots, \Psi_l\}$ where l is a number of user equipment $\{1, \ldots, k, \ldots, l\}$,
   wherein the remote samplers perform sampling of a sparse or non-sparse data transmission.

25. The communication system according to claim 24, wherein an entropy of a transmitted user constellation is either 16-bits or 32-bits.

26. The communication system according to claim 24, wherein the non-sparse data transmission includes a checksum.

27. The communication system according to claim 26, wherein the solver computes a checksum from data formulated from the received samples, and deletes blocks of data where a checksum fails.

28. A communication system comprising:
   a plurality of remote samplers for receiving wireless signals transmitted by one or more user equipment using a transmission matrix from one or more transmission matrices, each of the remote samplers capturing N samples during a word interval and transforming the N samples into M samples, where $M<N/2$, using a sensing matrix from one or more sensing matrices; and
   a solver for receiving the M samples from each of the remote samplers and formulating a soft estimate of data vectors based on a knowledge of the transmission matrices used by each of the one or more user equipment,
   wherein all pairs of a sensing matrix and transmission matrix satisfy a Restricted Isometry Property.

\* \* \* \* \*